US012796198B2

(12) United States Patent
Kang et al.

(10) Patent No.: US 12,796,198 B2
(45) Date of Patent: Nov. 10, 2026

(54) SEMICONDUCTOR LIGHT EMITTING DEVICE AND A DISPLAY DEVICE

(71) Applicant: LG ELECTRONICS INC., Seoul (KR)

(72) Inventors: Byungjun Kang, Seoul (KR); Kiseong Jeon, Seoul (KR); Sunghyun Hwang, Seoul (KR); Junho Sung, Seoul (KR); Mihee Heo, Seoul (KR); Minwoo Lee, Seoul (KR); Hyungjo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 431 days.

(21) Appl. No.: 18/383,763

(22) Filed: Oct. 25, 2023

(65) Prior Publication Data

US 2024/0213426 A1 Jun. 27, 2024

(30) Foreign Application Priority Data

Dec. 22, 2022 (KR) ........................ 10-2022-0181631

(51) Int. Cl.
*H10H 20/857* (2025.01)
*H10H 20/831* (2025.01)
*H10W 90/00* (2026.01)

(52) U.S. Cl.
CPC ........ *H10H 20/857* (2025.01); *H10H 20/831* (2025.01); *H10W 90/00* (2026.01)

(58) Field of Classification Search
CPC .... H10H 20/857; H10H 20/831; H10W 90/00
USPC ............................................................ 257/79
See application file for complete search history.

(56) References Cited

U.S. PATENT DOCUMENTS 11,476,236 B2 * 10/2022 Lee ...................... H10H 29/962
2013/0214302 A1 8/2013 Yeh et al.
2015/0041836 A1 2/2015 Saito et al.
2017/0213496 A1 7/2017 Hsu
2018/0062047 A1 3/2018 Biwa et al.
2019/0181304 A1 6/2019 Sasaki et al.
2019/0189604 A1 6/2019 Lu
2020/0144233 A1 5/2020 Lee
2020/0168589 A1 5/2020 Kim et al.
2021/0020619 A1 1/2021 Iguchi et al.
2022/0173276 A1 6/2022 Teo et al.
2022/0320057 A1 10/2022 Hwang et al.
(Continued)

FOREIGN PATENT DOCUMENTS

JP 2015-32809 A 2/2015
KR 10-2017-0133347 A 12/2017
(Continued)

*Primary Examiner* — Tu-Tu V Ho
(74) *Attorney, Agent, or Firm* — Birch, Stewart, Kolasch & Birch, LLP

(57) ABSTRACT

Discussed is a semiconductor light emitting device can include a light emitting layer, a passivation layer on an upper surface and a side surface of the light emitting layer, a protective layer on a lower surface and the side surface of the light emitting layer, a first electrode between the light emitting layer and the protective layer, and a second electrode between the light emitting layer and the passivation layer. An inner angle between the side surface and the lower surface of the light emitting layer can have an obtuse angle.

18 Claims, 31 Drawing Sheets

(56) References Cited

U.S. PATENT DOCUMENTS

| | | | |
|---|---|---|---|
| 2022/0320371 | A1 | 10/2022 | Park et al. |
| 2024/0072213 | A1 | 2/2024 | Heo et al. |

FOREIGN PATENT DOCUMENTS

| | | | |
|---|---|---|---|
| KR | 10-2019-0105537 | A | 9/2019 |
| KR | 10-2019-0117413 | A | 10/2019 |
| KR | 10-2021-0072007 | A | 6/2021 |
| WO | WO 2022/149628 | A1 | 7/2022 |

* cited by examiner

SEMICONDUCTOR LIGHT EMITTING DEVICE AND A DISPLAY DEVICE

CROSS-REFERENCE TO RELATED APPLICATIONS

The present application claims the benefits of priority to Korean Patent Application No. 10-2022-0181631, filed on Dec. 22, 2022 in the Republic of Korea, the entire contents of which are hereby expressly incorporated by reference into the present application

BACKGROUND OF THE DISCLOSURE

Field

An embodiment relates to a semiconductor light emitting device and a display device.

Discussion of the Related Art

A large-area display includes LCD display, OLED display, micro-LED display or the like.

A micro-LED display is a display using a semiconductor light emitting device having a diameter of 100 μm or less or a very small cross-sectional area, for example, a micro-LED as a display element.

The micro-LED display has excellent performance in many characteristics such as contrast ratio, response speed, color reproducibility, viewing angle, brightness, resolution, lifespan, luminous efficiency or luminance because it uses micro-LED, which is a semiconductor light emitting device, as a display element.

In particular, the micro-LED display has the advantage of being free to adjust the size or resolution as the screens can be separated and combined in a modular manner, and has the advantage of being able to implement a flexible display.

However, since a large-sized micro-LED display requires millions of micro-LEDs, there is a technical problem in that it is difficult to quickly and accurately transfer the micro-LEDs to a display panel.

Recently developed transfer technology includes a pick and place process, a laser lift-off method, or a self-assembly method.

Among them, the self-assembly method is a method in which a semiconductor light emitting device finds an assembly position in a fluid by itself, and is an advantageous method for implementing a large-screen display device.

The self-assembly method can be largely divided into a first process of moving numerous semiconductor light emitting devices dispersed in a fluid onto a backplane substrate using a magnet, a second process of assembling the numerous semiconductor light emitting devices moved onto the backplane substrate into corresponding assembly holes using dielectrophoresis force (hereinafter referred to as DEP force), and a third process of electrically connecting each of the assembled plurality of semiconductor light emitting devices.

In this case, in order to maximize yield, defects can be minimized in each of the first, second, and third processes.

For example, in the first process, a defect (hereinafter referred to as a chain defect) occurs in which the plurality of semiconductor light emitting devices 1*a* to 1*d* stick to each other in a chain form (FIG. 1A), or a defect (hereinafter referred to as a lump defect) occurs in which a plurality of semiconductor light emitting devices 1 are adsorbed to form a lump 3 (FIG. 1B).

Typically, a passivation layer is provided except for the lower side of the semiconductor light emitting device, and metal is provided on the lower side to be used as an electrode. During self-assembly, a pulling force is applied to the metal provided on the lower side due to DEP force, and a pushing force is applied to the passivation layer, so that the metal is assembled toward the bottom of the assembly hole of the backplane substrate to complete proper assembly.

At this time, the metal provided on the lower side of the semiconductor light emitting device is exposed to the outside. If metal is not provided, the lower surface of the epi layer is exposed to the outside. In this way, when the epi layer or metal is exposed to the outside, chain defects or lump defects occur, as described above in the first process. If there is a chain defect or a lump defect, assembly defect of the semiconductor light emitting device can occur. In addition, when the epi layer is exposed to the outside, the epi layer is damaged due to the impact generated when the semiconductor light emitting device is moved by a magnet or inserted into the assembly hole by DEP force during self-assembly, causing a problem in that the electrical and optical properties deteriorate.

For example, in the second process, a non-assembly defect (FIG. 1A) occurs in which the semiconductor light emitting device 1 is not assembled in a specific assembly hole 4 as shown in FIG. 2A, or the semiconductor light emitting device 1R assembled in the specific assembly hole 4R is separated as shown in FIG. 2B. In this way, non-assembly defects or separation of the semiconductor light emitting device 1R cause lighting defects and lower yield. This is not only because it is difficult to control the shape of the side portion of the semiconductor light emitting device 1R, but also because the semiconductor light emitting device 1R is easily separated due to a mismatch between the shape of the semiconductor light emitting device 1R and the shape of the assembly hole 4R. For example, while the side portion of the semiconductor light emitting device 1R has an acute angle or a vertical angle with respect to the ground, the inner side of the assembly hole 4R has an obtuse angle with respect to the ground. In this case, when the semiconductor light emitting device 1R is assembled in the assembly hole 4R, a gap widens between the inner side of the assembly hole 4R and the side portion of the semiconductor light emitting device 1R on the upper side of the assembly hole 4R such that the semiconductor light emitting device 1R easily falls out of the assembly hole 4R.

In addition, as shown in FIG. 2B, a color mixing defect occurs when a semiconductor light emitting device 1B generating light of a different color is assembled into the assembly hole 4R where the semiconductor light emitting device 1R is separated. For example, a red semiconductor light emitting device 1R that emits red light can be assembled into the red assembly hole 4R. However, after the red semiconductor light emitting device 1R is assembled in the red assembly hole 4R, the fixing force within the red assembly hole 4R is weak, so the red light emitting device 1R is separated from the red assembly hole 4R. Afterwards, the blue semiconductor light emitting device 1B is assembled into the red assembly hole 4R, resulting in a color mixing defect in which blue light rather than red light is generated from the blue semiconductor light emitting device 1B assembled in the red assembly hole 4R.

For example, in the third process, as shown in FIG. 3, solder 7 defects occur. For example, the semiconductor light emitting device 1 is electrically connected to the first assembly wiring 6*a* using solder 7. For example, when thermal compression is applied to the semiconductor light emitting device 1, the solder 7 is melted and the semiconductor light emitting device 1 is electrically connected to the first assembly wiring 6*a*. However, when indium (In) or tin (Sn), etc. are used as the solder 7, the solder particles 7 are large, causing contact defects between the semiconductor light emitting device 1 and the first assembly wiring 6*a*. In addition, because only a part of the entire lower side of the semiconductor light emitting device 1 is assembled to the first assembly wiring 6*a*, there is a problem that the electrical properties and optical properties are deteriorated. Non-illustrated reference numeral 6*b* is a second assembly wiring and can form a DEP force together with the first assembly wiring 6*a*.

Therefore, as the yield is maximized when each defect occurring in the first process, second process, and third process is minimized, there is an urgent need to develop technology that can prevent or block defects occurring in each of these first, second, and third processes.

SUMMARY OF THE DISCLOSURE

An object of the embodiment is to solve the foregoing and other problems.

Another object of the embodiment is to provide a semiconductor light emitting device and a display device that can maximize yield.

In addition, another purpose of the embodiment is to provide a semiconductor light emitting device and a display device that can prevent assembly defects.

In addition, another purpose of the embodiment is to provide a semiconductor light emitting device and a display device that can prevent color mixing defects.

In addition, another purpose of the embodiment is to provide a semiconductor light emitting device and a display device that can prevent contact defects.

In addition, another purpose of the embodiment is to provide a semiconductor light emitting device and a display device that can improve electrical and optical properties.

The technical problem of the embodiment is not limited to those described in this section, and include those that can be grasped through the description of the invention.

According to one aspect of the embodiment to achieve the above or other purposes, a semiconductor light emitting device, including a light emitting layer; a passivation layer on an upper surface and a side surface of the light emitting layer; a protective layer on a lower surface and the side surface of the light emitting layer; a first electrode between the light emitting layer and the protective layer; and a second electrode between the light emitting layer and the passivation layer, wherein an inner angle between the side surface and the lower surface of the light emitting layer has an obtuse angle.

An inner angle between the side surface and the upper surface of the light emitting layer can have an acute angle.

The first electrode can include a plurality of conductive layers on the lower surface of the light emitting layer, and at least one or more conductive layer among the plurality of conductive layers can be disposed on the side surface of the light emitting layer.

The first electrode can be disposed on the passivation layer disposed on the side surface of the light emitting layer.

The protective layer can have a shape corresponding to a shape of the first electrode. The protective layer can be disposed on the passivation layer disposed on the side surface of the light emitting layer. The protective layer can be disposed on the first electrode disposed on the side surface of the light emitting layer.

An end of the first electrode disposed on the side surface of the light emitting layer can be positioned on the same horizontal line as an upper surface of the passivation layer. An end of the protective layer disposed on the side surface of the light emitting layer can be positioned on the same horizontal line as an upper surface of the passivation layer.

The protective layer can have a thickness of 1/10 or less of a thickness of the passivation layer.

According to other aspects of the embodiment to achieve the above or other purposes, a display device, including: a backplane substrate having first to third assembly holes in first to third sub-pixels constituting a pixel; first to third semiconductor light emitting devices in the first to third assembly holes; and first to third electrode wirings on upper sides of the first to third semiconductor light emitting devices, wherein a second inner angle between an inner side surface and a bottom surface of each of the first to third assembly holes has an obtuse angle, and wherein the first to third semiconductor light emitting devices have shapes corresponding to shapes of the first to third assembly holes.

Each of the first to third semiconductor light emitting devices can include a light emitting layer, a passivation layer on an upper surface and a side surface of the light emitting layer, a protective layer on a lower surface and the side surface of the light emitting layer, a first electrode between the light emitting layer and the protective layer and a second electrode between the light emitting layer and the passivation layer. The first to third semiconductor light emitting devices can emit different color lights.

A first inner angle between a side surface and a lower surface of the light emitting layer of each of the first to third semiconductor light emitting devices can have an obtuse angle, and the second inner angle can be within ±10° with respect to the first inner angle.

The first to third assembly holes each can have a minimum diameter at a lower side thereof and a maximum diameter at an upper side thereof, and at least one of the minimum diameter or the maximum diameter can be different from the first assembly hole to the third assembly hole.

The second inner angles can be the same as or different from each other in the first to third assembly holes.

The display device can include another first to third electrode wiring on the upper sides of the first to third semiconductor light emitting devices.

The display device can include first to third connection electrodes on side portions of the first to third semiconductor light emitting devices.

The embodiment can improve yield. Here, the yield refers to the lighting yield, which can mean ratio of the number of sub-pixels that are normally lit among the number of preset sub-pixels.

In order to increase yield, defects can be minimized in each of the first, second, and third processes, as described above.

The embodiment can improve yield by minimizing defects in each of the first process, second process, and third process. To this end, the structure of the semiconductor light emitting device can be changed. For example, as shown in FIGS. 13 and 28, the inner angle θ1 between the side surface 150*a*3 and the lower surface 150*al* of the light emitting layer 150*a* can have an obtuse angle. Accordingly, the inner angle θ1 between the side surface 150*a*3 and the lower surface 150*al* of the light emitting layer 150*a* can have an obtuse angle. Accordingly, the side surface 150*a*3 can have an inclined surface inclined at an obtuse angle with respect to the lower surface 150*al*.

FIG. 10 shows the DEP force acting on the semiconductor light emitting device according to the inner angle between the side surface and the lower surface of the light emitting layer. As shown in FIGS. 10 to 12, it can be seen that the larger the inner angle θ1 between the side surface and the lower surface of the semiconductor light emitting device 1, the greater the force with which the semiconductor light emitting device 1 is pulled into the assembly hole 5. For example, it can be seen that when the inner angle θ1 between the side surface and the lower surface of the semiconductor light emitting device 1 is less than 70°, a force (F>0) is applied to push the semiconductor light emitting device 1 from the assembly hole 5, while when the inner angle between the side surface and the lower surface of the semiconductor light emitting device 1 is 70° or more, a force (F<0) is applied to pull the semiconductor light emitting device 1 into the assembly hole 5. In particular, it can be seen that when the inner angle between the side surface and the lower surface of the semiconductor light emitting device 1 is 70° or more, the pulling force (F<0) becomes larger, especially at the obtuse angle.

In the embodiment, as shown in FIGS. 13 and 28, the inner angle θ1 between the side surface 150*a*3 and the lower surface 150*al* of the light emitting layer 150*a* in the semiconductor light emitting devices 150A and 150B is made to have an obtuse angle, so that the light emitting layer (150*a*) can have a structure in which the size (or area) of the upper side is greater than the size (or area) of the lower side. As shown in FIGS. 15 and 16, when the semiconductor light emitting devices (150A, 150B) having this structure are self-assembled, the assembly force and fixation force are increased by DEP force in the assembly hole 340H on the backplane substrate (300A). Accordingly, the semiconductor light emitting devices 150A and 150B can be more easily assembled into the assembly hole 340H by the increased assembly force, thereby improving the assembly rate. In addition, due to the increased fixing force, the semiconductor light emitting devices 150A and 150B assembled in the assembly hole 340H are firmly fixed to the assembly hole 340H and do not fall out of the assembly hole 340H. If the semiconductor light emitting devices 150A and 150B assembled in the assembly hole 340H are separated from the assembly hole 340H, color mixing defects occur when other semiconductor light emitting devices are assembled in the assembly hole 340H. However, as in the embodiment, the semiconductor light emitting devices 150A and 150B assembled in the assembly hole 340H do not fall out of the assembly hole 340H due to the strengthening of the assembly force, thereby preventing color mixing defects.

Meanwhile, by covering the externally exposed first electrode 154 with the protective layer 158, chain defects or lump defects between the semiconductor light emitting devices 150A and 150B can be prevented while the first process is performed.

In addition, the thickness t3 of the protective layer 158 can be 1/10 or less of the thickness t1 of the passivation layer 157. Accordingly, the DEP force passes through the protective layer 158 and affects the first electrode 154, thereby generating a force that pulls the first electrode 154 into the assembly hole 340H in response to the DEP force. Because the semiconductor light emitting devices 150A and 150B are easily and stably assembled in the assembly hole 340H by the pulling force, assembly defects and lighting defects can be prevented.

The third conductive layer 154-3 of the first electrode 154 can be disposed on the side surface 150*a*3 of the light emitting layer 150*a*. The third conductive layer 154-3 of the first electrode 154 can be disposed along the circumference of the side surface 150*a*3 of the light emitting layer 150*a*. When a post-process is performed in the third process, the electrode wiring 360 or the connection electrode 370 can be easily connected, and connection defects can be prevented. For example, the third conductive layer 154-3 of the first electrode 154 is disposed on the side surface 150*a*3 of the light emitting layer 150*a*, so that the electrode wiring 360 can be easily connected to the third conductive layer 154-3 without a thermal compression process, preventing contact defects and improving electrical/optical properties.

Meanwhile, as shown in FIGS. 42 to 44 and 45 to 47, the plurality of assembly holes 340H1 to 340H3 on the backplane substrate 300A or 300B can each have a shape corresponding to the shape of the corresponding semiconductor light emitting device 150R, 150G, and 150B. A first semiconductor light emitting device 150R, a second semiconductor light emitting device 150G and a third semiconductor light emitting device 150B that emit light of different colors can be disposed in a first sub-pixel PX1, a second sub-pixel PX2, and a third sub-pixel PX3 constituting the pixel PX, respectively. In this case, the first assembly hole 340H1 can have a shape corresponding to the shape of the first semiconductor light emitting device 150R, the second assembly hole 340H2 can have a shape corresponding to the shape of the second semiconductor light emitting device 150G, and the third assembly hole 340H3 can have a shape corresponding to the shape of the third semiconductor light emitting device 150B. A first inner angle θ11, θ12 and θ13 between the side surface 150*a*3 and the lower surface 150*al* of the light emitting layer 150*a* in each of the first semiconductor light emitting device 150R, the second semiconductor light emitting device 150G, and the third semiconductor light emitting device 150B can have an obtuse angle. In this case, the second inner angles θ21, θ22 and θ23 between the inner side surface 340_I and the lower surface (340_B) of each of the first assembly hole 340H1, the second assembly hole 340H2, and the third assembly hole 340H3) can have an obtuse angle.

As shown in FIGS. 42 and 43, the second inner angles θ21, θ22 and θ23 between the inner side surface 340_I and the lower surface 340_B of each of the first assembly hole 340H1, the second assembly hole 340H2, and the third assembly hole 340H3 can be identical to each other.

As shown in FIGS. 45 and 46, the second inner angles θ21, θ22 and θ23 between the inner side surface 340_I and the lower surface 340_B of each of the first assembly hole 340H1, the second assembly hole 340H2, and the third assembly hole 340H3 can be different.

As described above, the structural shapes of the first assembly hole 340H1, the second assembly hole 340H2, and the third assembly hole 340H3 can correspond to the structural shapes of the first semiconductor light emitting device 150R, the second semiconductor light emitting device 150G, and the third semiconductor light emitting device 150B, respectively such that during self-assembly, separation of each of the first semiconductor light emitting device 150R, the second semiconductor light emitting device 150G, and the third semiconductor light emitting device 150B is prevented or minimized, thereby improving the lighting yield.

A further scope of applicability of the embodiment will become apparent from the detailed description that follows. However, since various changes and modifications within the spirit and scope of the embodiment can be clearly understood by those skilled in the art, it should be understood that the detailed description and specific embodiment, such as preferred embodiment, are given by way of example only.

Figure 1A:
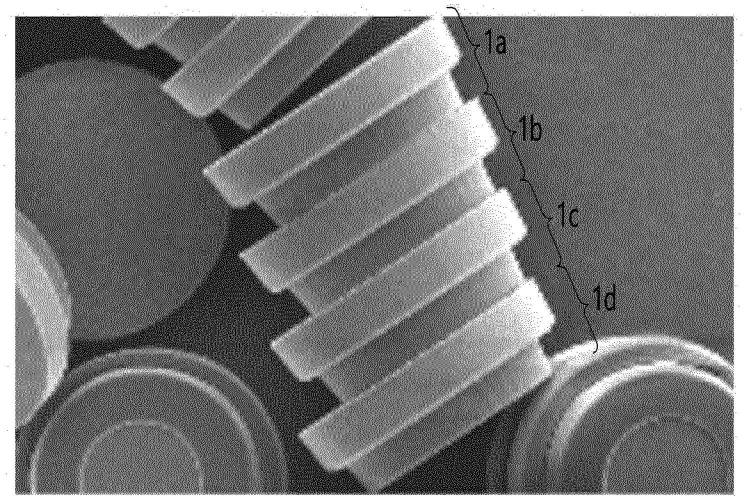
FIG. 1A (RELATED ART)
FIGS. 1A and 1B illustrate defects in the first process of moving a plurality of semiconductor light emitting devices using a magnet.

The sizes, shapes, dimensions, etc. of elements shown in the drawings can differ from actual ones. In addition, even if the same elements are shown in different sizes, shapes, dimensions, etc. between the drawings, this is only an example on the drawing, and the same elements have the same sizes, shapes, dimensions, etc. between the drawings.

DETAILED DESCRIPTION OF EMBODIMENTS

Hereinafter, the embodiment disclosed in this specification will be described in detail with reference to the accompanying drawings, but the same or similar elements are given the same reference numerals regardless of reference numerals, and redundant descriptions thereof are omitted. The suffixes 'module' and 'unit' for the elements used in the following descriptions are given or used interchangeably in consideration of ease of writing the specification, and do not themselves have a meaning or role that is distinct from each other. In addition, the accompanying drawings are for easy understanding of the embodiment disclosed in this specification, and the technical idea disclosed in this specification is not limited by the accompanying drawings. Also, when an element such as a layer, region or substrate is referred to as being 'on' another element, this means that there can be directly on the other element or be other intermediate elements therebetween.

The display device described in this specification can comprise TV, the signage, a mobile terminal such as a handheld phone, a smart phone, etc., a display for computer such as a laptop, a desktop, etc., a head-up display (HUD) for automobile, a backlight unit for display, a display for XR (Extend Reality) such as AR, VR, and MR (mixed reality), a light source, etc. However, the configuration according to the embodiments described in this specification can be equally applied to devices capable of displaying even if new products are developed in the future.

Figure 4:
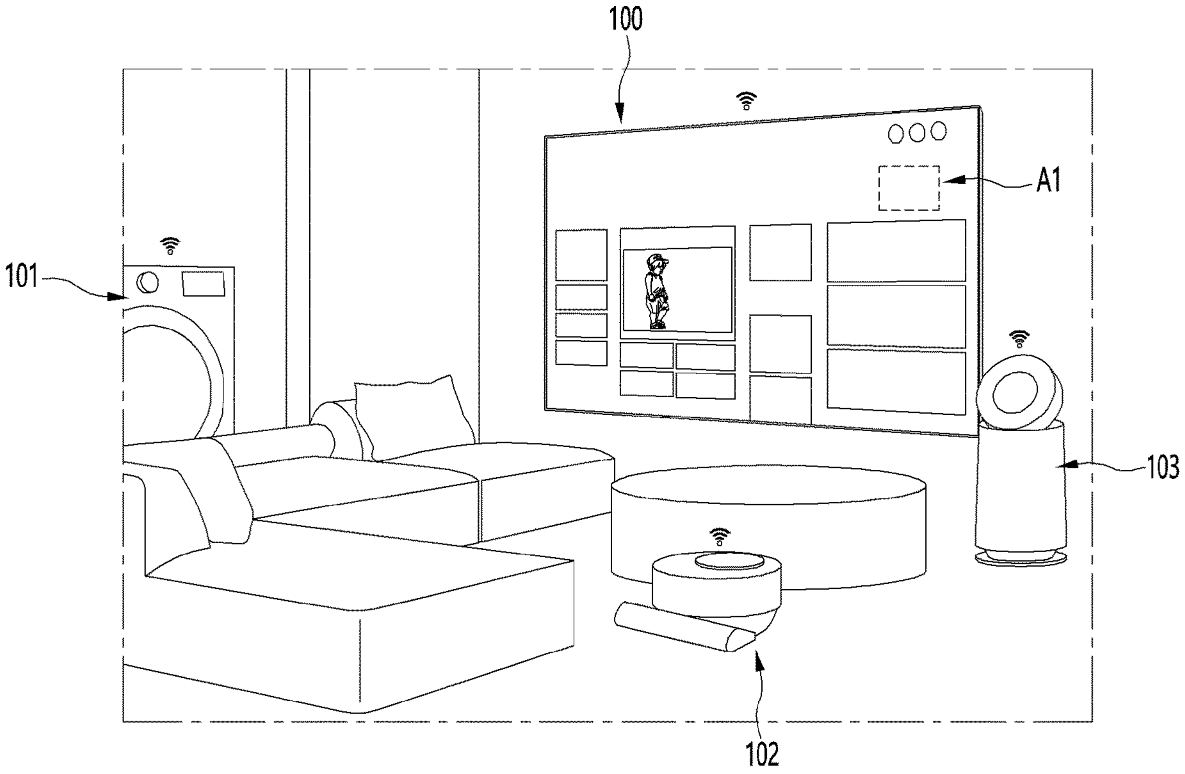
FIG. 4 illustrates a living room of a house in which a display device according to an embodiment is disposed.

FIG. 4 illustrates a living room of a house in which a display device according to an embodiment is disposed.

Referring to FIG. 4, the display device 100 of the embodiment can display the status of various electronic products such as a washing machine 101, a robot cleaner 102, and an air purifier 103, communicate with each electronic product based on IOT and control each electronic product based on user's setting data.

The display device 100 according to the embodiment can include a flexible display manufactured on a thin and flexible substrate. The flexible display can be bent or rolled like paper while maintaining the characteristics of an existing flat panel display.

In the flexible display, visual information can be implemented by independently controlling light emission of a unit pixel arranged in a matrix form. The unit pixel means a minimum unit for implementing one color. The unit pixel of the flexible display can be implemented by a light emitting device. In the embodiment, the light emitting device can be Micro-LED or Nano-LED, but is not limited thereto.

Figure 5:
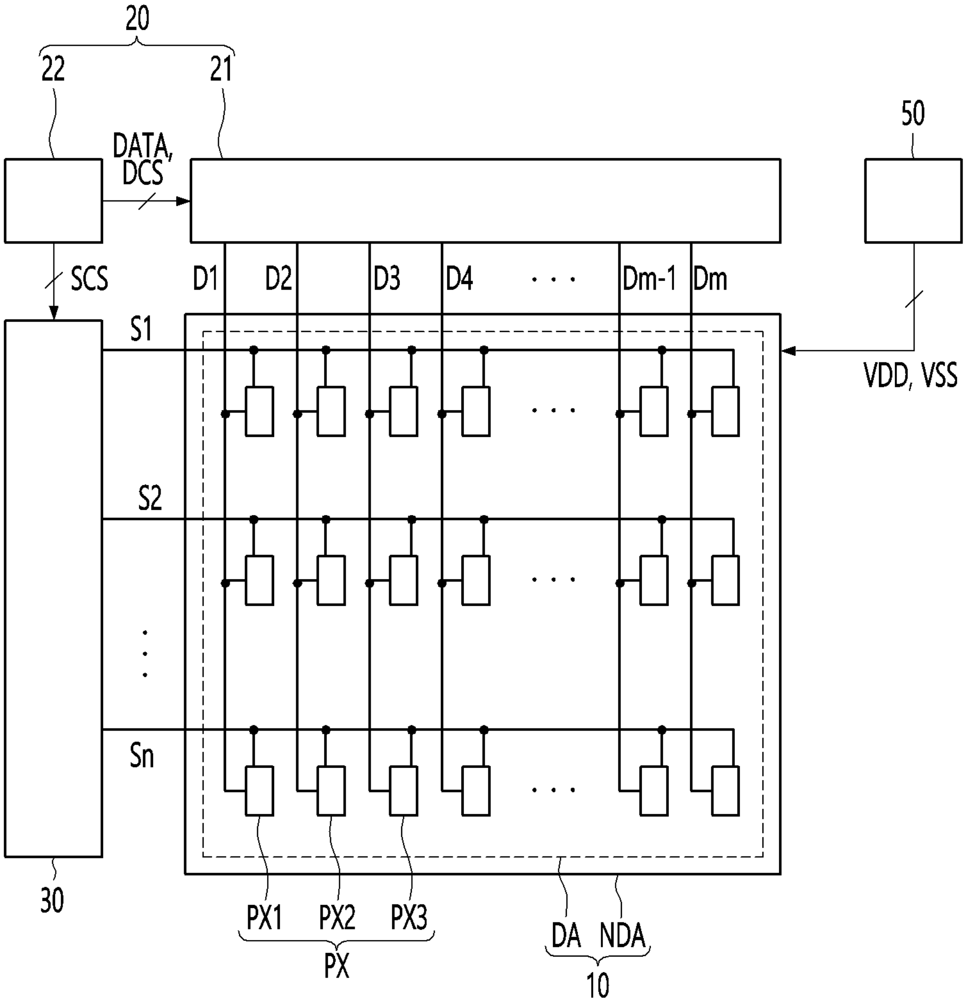
FIG. 5 is a block diagram schematically illustrating a display device according to an embodiment.
Figure 6:
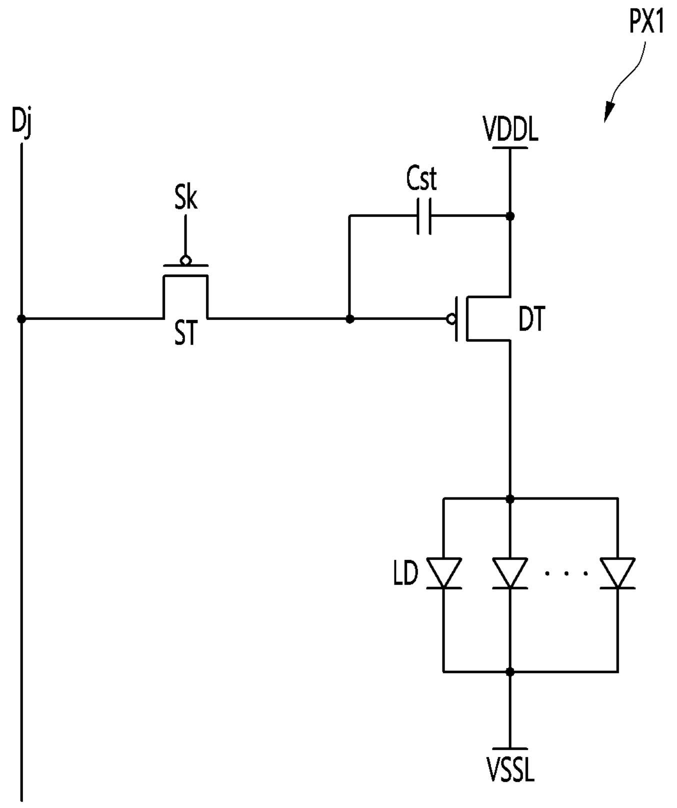
FIG. 6 is a circuit diagram showing an example of a pixel of FIG. 5.

FIG. 5 is a block diagram schematically illustrating a display device according to an embodiment. FIG. 6 is a circuit diagram showing an example of a pixel of FIG. 5.

Referring to FIG. 5 and FIG. 6, a display device according to an embodiment can comprise a display panel 10, a driving circuit 20, a scan driving circuit 30 and a power supply circuit 50.

The display device 100 of the embodiment can drive a light emitting device in an active matrix (AM) scheme or a passive matrix (PM) scheme.

The driving circuit 20 can comprise a data driving circuit 21 and a timing controller 22.

The display panel 10 can have a rectangular shape, but is not limited thereto. For example, the display panel 10 can be formed in a circular or elliptical shape. At least one side of the display panel 10 can be formed to be bent with a predetermined curvature.

The display panel can comprise a display area DA. The display area DA is an area where pixels PX are formed to display an image. The display panel can comprise a non-display area NDA. The non-display area DNA can be an area excluding the display area DA.

As an example, the display area DA and the non-display area NDA can be defined on the same surface. For example, the non-display area DNA can surround the display area DA on the same side as the display area DA, but this is not limited.

As another example, the display area DA and the non-display area NDA can be defined on different surfaces. For example, the display area DA can be defined on an upper surface of the substrate, and the non-display area NDA can be defined on a lower surface of the substrate. For example, the non-display area NDA can be defined on the entire or partial area of the lower surface of the substrate.

Meanwhile, although it is shown in the drawing as being divided into a display area DA and a non-display area NDA, it may not be divided into a display area DA and a non-display area NDA. For example, only the display area DA can exist on the upper surface of the substrate, and the non-display area NDA may not exist. In other words, the entire upper surface of the substrate can be the display area DA where images are displayed, and the bezel area that is the non-display area NDA may not exist.

The display panel 10 can comprise data lines (D1 to Dm, where m is an integer greater than or equal to 2), scan lines (S1 to Sn, where n is an integer greater than or equal to 2) crossing the data lines (D1 to Dm), a high potential voltage line VDDL supplied with a high potential voltage, a low potential voltage line VSSL supplied with a low potential voltage, and pixels PX connected to the data lines D1 to Dm and the scan lines S1 to Sn.

Each of the pixels PX can comprise a first sub-pixel PX1, a second sub-pixel PX2, and a third sub-pixel PX3. The first sub-pixel PX1 can emit a first color light with a first main wavelength, the second sub-pixel PX2 can emit of a second color light with a second main wavelength, and the third sub-pixel PX3 can emit a third color light with a third main wavelength. The first color light can be red light, the second color light can be green light, and the third color light can be blue light, but are not limited thereto. In addition, in FIG. 5, it is illustrated that each of the pixels PX comprise three sub-pixels, but are not limited thereto. For example, each of the pixels PX can comprise four or more sub-pixels.

Each of the first sub-pixel PX1, the second sub-pixel PX2, and the third sub-pixel PX3 can be connected to at least one of the data lines D1 to Dm, at least one of the scan lines S1 to Sn, and a high potential voltage line VDDL. As shown in FIG. 6, the first sub-pixel PX1 can include light emitting devices LDs, a plurality of transistors for supplying current to the light emitting devices LDs, and at least one capacitor Cst.

Each of the first sub-pixel PX1, the second sub-pixel PX2, and the third sub-pixel PX3 can include only one light emitting device LD and at least one capacitor Cst.

Each of the light emitting devices LD can be a semiconductor light emitting diode comprising a first electrode, a plurality of conductive semiconductor layers, and a second electrode. Here, the first electrode can be an anode electrode, and the second electrode can be a cathode electrode, but is not limited thereto.

The light emitting device LD can be one of a lateral type light emitting device, a flip-chip type light emitting device, and a vertical type light emitting device.

The plurality of transistors can include a driving transistor DT supplying current to the light emitting devices LD and a scan transistor ST supplying a data voltage to a gate electrode of the driving transistor DT, as shown in FIG. 6. The driving transistor DT has a gate electrode connected to the source electrode of the scan transistor ST, a source electrode connected to the high potential voltage line VDDL to which a high potential voltage is applied, and a drain electrode connected to the first electrodes of the light emitting devices LD. The scan transistor ST has a gate electrode connected to the scan line (Sk, k is an integer that satisfies $1 \leq k \leq n$), a source electrode connected to the gate electrode of the driving transistor DT, and a drain electrode connected to the data lines (Dj, j an integer that satisfies $1 \leq j \leq m$).

The capacitor Cst is formed between the gate electrode and the source electrode of the driving transistor DT. The storage capacitor Cst stores a difference voltage between a gate voltage and a source voltage of the driving transistor DT.

The driving transistor DT and the scan transistor ST can be formed of a thin film transistor. In addition, in FIG. 6, the driving transistor DT and the scan transistor ST have been mainly described as being formed of P-type MOSFETs (Metal Oxide Semiconductor Field Effect Transistors), but are not limited thereto. The driving transistor DT and the scan transistor ST can be formed of N-type MOSFETs. In this case, positions of the source electrode and the drain electrode of each of the driving transistor DT and the scan transistor ST can be changed.

In addition, in FIG. 6, it is illustrated that each of the first sub-pixel PX1, the second sub-pixel PX2, and the third sub-pixel PX3 includes 2T1C (2 Transistor-1 capacitor) having one driving transistor DT, one scan transistor ST, and one capacitor Cst, but is not limited thereto. Each of the first sub-pixel PX1, the second sub-pixel PX2, and the third sub-pixel PX3 can include a plurality of scan transistors ST and a plurality of capacitors Cst.

Since the second sub-pixel PX2 and the third sub-pixel PX3 can be expressed with substantially the same circuit diagram as the first sub-pixel PX1, detailed descriptions will be omitted.

The driving circuit 20 outputs signals and voltages for driving the display panel 10. To this end, the driving circuit 20 can include a data driving circuit 21 and a timing controller 22.

The data driving circuit 21 receives digital video data DATA and a source control signal DCS from the timing controller 22. The data driving circuit 21 converts the digital video data DATA into analog data voltages according to the source control signal DCS and supplies them to the data lines D1 to Dm of the display panel 10.

The timing controller 22 receives digital video data DATA and timing signals from a host system. The timing signals can include a vertical synchronization signal, a horizontal synchronization signal, a data enable signal, and a dot clock. The host system can be an application processor of a smart phone or tablet PC, a system on chip of a monitor or TV, or the like.

The timing controller 22 generates control signals for controlling operation timings of the data driving circuit 21 and the scan driving circuit 30. The control signals can include a source control signal DCS for controlling the operation timing of the data driving circuit 21 and a scan control signal SCS for controlling the operation timing of the scan driving circuit 30.

The driving circuit 20 can be disposed in the non-display area NDA provided on one side of the display panel 10. The driving circuit 20 can be formed of an integrated circuit (IC) and mounted on the display panel 10 using a chip on glass (COG) scheme, a chip on plastic (COP) scheme, or an ultrasonic bonding scheme, but is not limited thereto. For example, the driving circuit 20 can be mounted on a circuit board instead of the display panel 10.

The data driving circuit 21 can be mounted on the display panel 10 using a chip on glass (COG) scheme, a chip on plastic (COP) scheme, or an ultrasonic bonding scheme, and the timing controller 22 can be mounted on a circuit board.

The scan driving circuit 30 receives the scan control signal SCS from the timing controller 22. The scan driving circuit 30 generates scan signals according to the scan control signal SCS and supplies them to the scan lines S1 to Sn of the display panel 10. The scan driving circuit 30 can include a plurality of transistors and be formed in the non-display area NDA of the display panel 10. Alternatively, the scan driving circuit 30 can be formed as an integrated circuit, and in this case, it can be mounted on a gate flexible film attached to the other side of the display panel 10.

The power supply circuit 50 can generate voltages necessary for driving the display panel 10 from the main power supplied from the system board and supply the voltages to the display panel 10. For example, the power supply circuit 50 generates a high potential voltage VDD and a low potential voltage VSS for driving the light emitting devices LD of the display panel 10 from the main power supply to supply them to the high potential voltage line VDDL and the low potential voltage line VSSL. Also, the power supply circuit 50 can generate and supply driving voltages for driving the driving circuit 20 and the scan driving circuit 30 from the main power.

Figure 3:
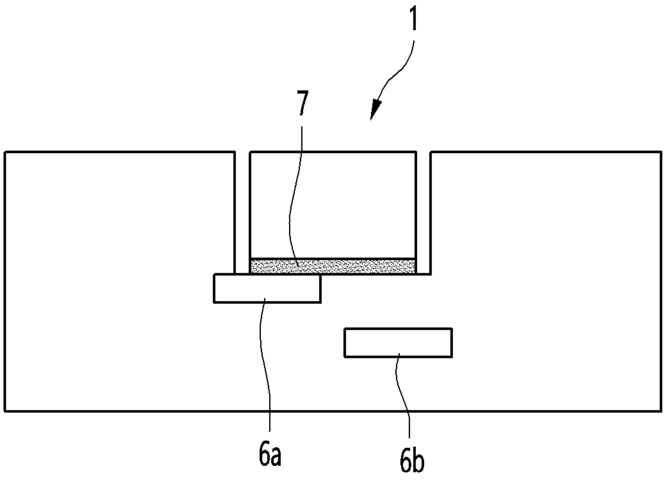
FIG. 3 shows defects occurring in the third process during solder bonding.
Figure 7:
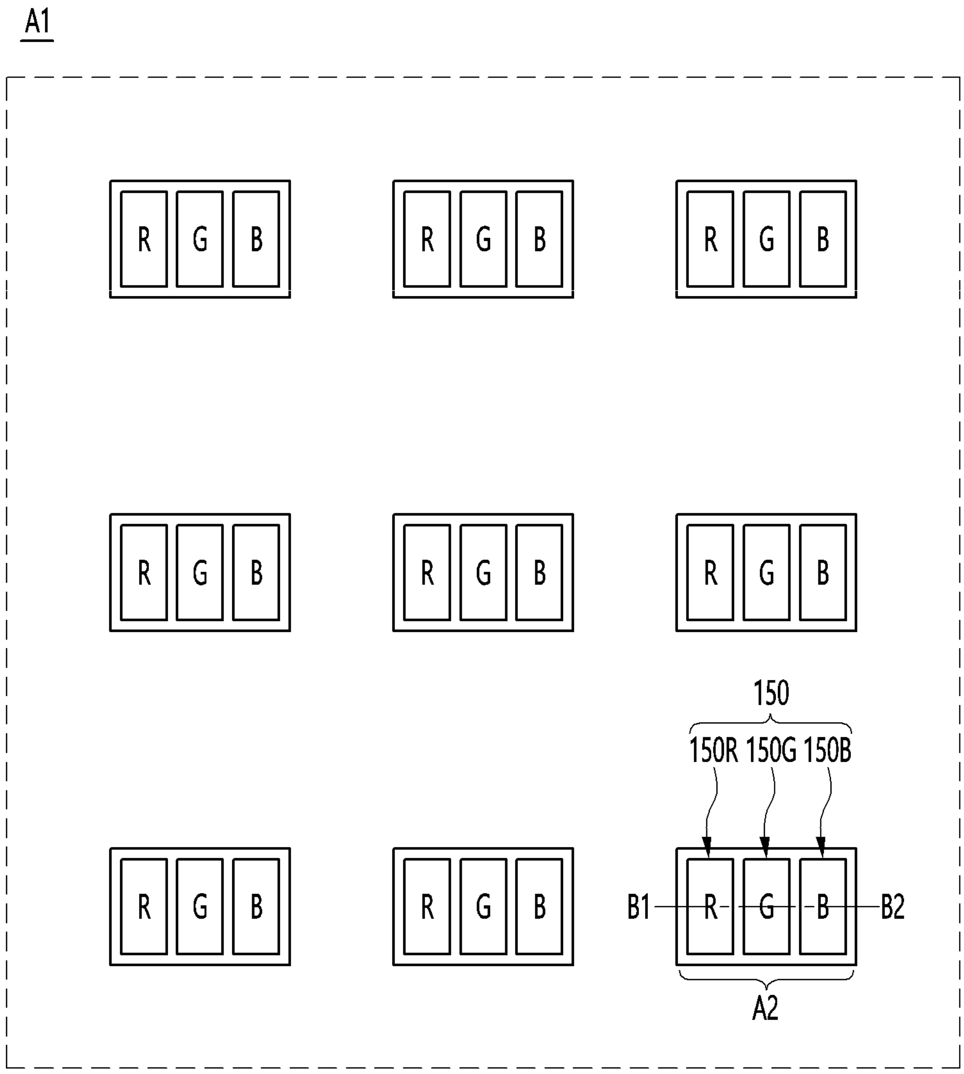
FIG. 7 is an enlarged view of a first panel region in the display device of FIG. 4.

FIG. 7 is an enlarged view of a first panel region in the display device of FIG. 3.

Referring to FIG. 7, a display device 100 of the embodiment can be manufactured by mechanically and electrically connecting a plurality of panel regions such as the first panel region A1 by tiling.

The first panel region A1 can include a plurality of light emitting devices 150 disposed for each unit pixel (PX in FIG. 5).

Figure 8:
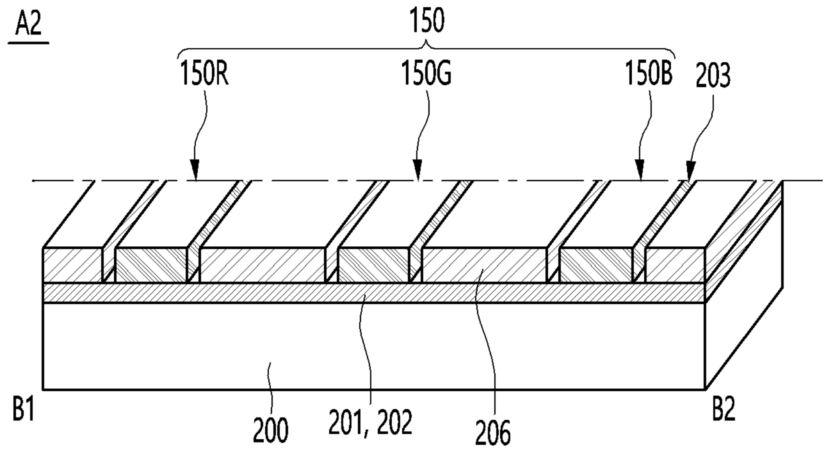
FIG. 8 is an enlarged view of the area A2 of FIG. 7.

FIG. 8 is an enlarged view of the area A2 of FIG. 7.

Referring to FIG. 8, a display device 100 according to an embodiment can comprise a substrate 200, assembling wirings 201 and 202, an insulating layer 206, and a plurality of semiconductor light emitting devices 150. More components can be included in the display device 100.

The assembling wiring can comprise a first assembling wiring 201 and a second assembling wiring 202 spaced apart from each other. The first assembling wiring 201 and the second assembling wiring 202 can be provided to generate a dielectrophoretic (DEP) force so that the semiconductor light emitting device 150 can be assembled. For example, the semiconductor light emitting device 150 can be one of a lateral type semiconductor light emitting device, a flip-chip type semiconductor light emitting device, and a vertical type semiconductor light emitting device.

The semiconductor light emitting device 150 can comprise a red semiconductor light emitting device 150R, a green semiconductor light emitting device 150G, and a blue semiconductor light emitting device 150B to form a sub-pixel, but is not limited thereto. In other words, red and green can be implemented by providing a red phosphor and a green phosphor.

The substrate 200 can be a support member for supporting components disposed on the substrate 200 or a protective member for protecting the components.

The substrate 200 can be a rigid substrate or a flexible substrate. The substrate 200 can be formed of sapphire, glass, silicon or polyimide. In addition, the substrate 200 can comprise a flexible material such as polyethylene naphthalate (PEN) or polyethylene terephthalate (PET). In addition, the substrate 200 can be a transparent material, but is not limited thereto. The substrate 200 can function as a support substrate in a display panel, and can also function as a substrate for assembly when self-assembling a light emitting device.

The substrate 200 can be a backplane provided with circuits in the sub-pixels PX1, PX2, and PX3 shown in FIGS. 5 and 6, for example, transistors ST and DT, a capacitor Cst, signal wirings, etc., but not limited thereto.

The insulating layer 206 can comprise an insulating and flexible organic material such as polyimide, PAC, PEN, PET, polymer, etc. The insulating layer 206 can comprise an inorganic material such as silicon oxide $SiO_2$ or silicon nitride series SiNx. The insulating layer 206 can be integrally formed with the substrate 200 to form one substrate.

The insulating layer 206 can be a conductive adhesive layer having adhesiveness and conductivity. The conductive adhesive layer can have ductility to enable a flexible function of the display device. For example, the insulating layer 206 can be an anisotropic conductive film (ACF). For example, the insulating layer 206 can a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The insulating layer 206 can comprise an assembly hole 203 into which the semiconductor light emitting device 150 is inserted. Therefore, during self-assembly, the semiconductor light emitting device 150 can be easily inserted into the assembly hole 203 of the insulating layer 206. The assembly hole 203 can be called an insertion hole, a fixing hole, an alignment hole, or the like.

The assembly hole 203 can be called a hole, dent, groove, recess, pocket, etc.

The assembly hole 203 can be different according to the shape of the semiconductor light emitting device 150. For example, each of a red semiconductor light emitting device, a green semiconductor light emitting device, and a blue semiconductor light emitting device can have a different shape, and the assembly hole 203 having a shape corresponding to the shape of each of these semiconductor light emitting devices can be provided. For example, the assembly hole 203 can comprise a first assembly hole for assembling the red semiconductor light emitting device, a second assembly hole for assembling the green semiconductor light emitting device, and a third assembly hole for assembling the blue semiconductor light emitting device. For example, the red semiconductor light emitting device has a circular shape, the green semiconductor light emitting device has a first elliptical shape having a first minor axis and a second major axis, and the blue semiconductor light emitting device has a second elliptical shape having a second minor axis and a second major axis, but is not limited thereto. The second major axis of the elliptical shape of the blue semiconductor light emitting device can be larger than the second major axis of the elliptical shape of the green semiconductor light emitting device, and the second minor axis of the elliptical shape of the blue semiconductor light emitting device can be smaller than the first minor axis of the elliptical shape of the green semiconductor light emitting device.

Meanwhile, a method of mounting the semiconductor light emitting device 150 on the substrate 200 can comprise, for example, a self-assembly method (FIG. 9) and a transfer method.

Figure 9:
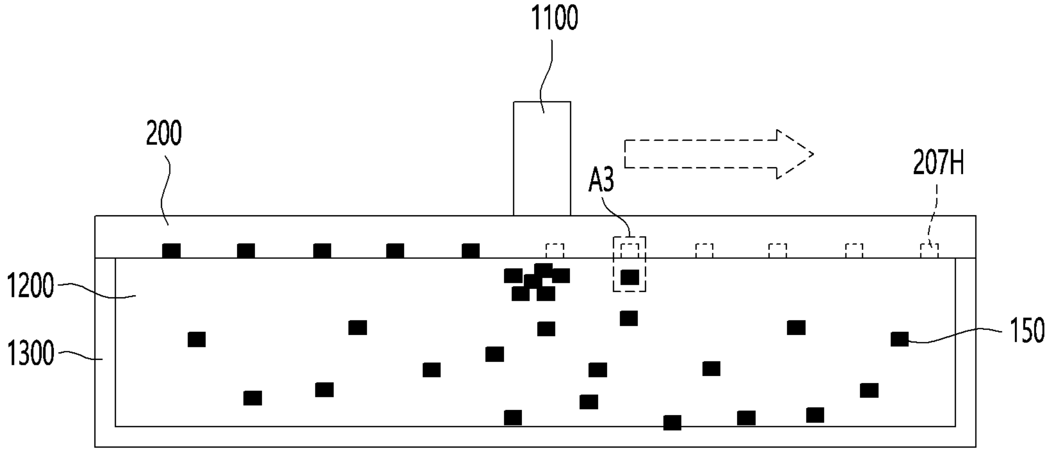
FIG. 9 is a view showing an example in which a light emitting device according to an embodiment is assembled to a substrate by a self-assembly method.

FIG. 9 is a view showing an example in which a light emitting device according to an embodiment is assembled to a substrate by a self-assembly method.

An example of assembling a semiconductor light emitting device according to the embodiment to a display panel by a self-assembly method using an electromagnetic field will be described based on FIG. 9.

The assembling substrate 200 described below can also function as a panel substrate 200*a* in the display device after assembling the light emitting device, but the embodiment is not limited thereto.

Referring to FIG. 9, the semiconductor light emitting device 150 can be put into a chamber 1300 filled with a fluid 1200, and the semiconductor light emitting device 150 can move to the assembling substrate 200 by the magnetic field generated from an assembly device 1100. At this time, the light emitting device 150 adjacent to the assembly hole 207H of the assembling substrate 200 can be assembled into the assembly hole 207H by a DEP force generated by the electric field of the assembling wirings. The fluid 1200 can be water such as a deionized water, but is not limited thereto. The chamber 1300 can also be called a water bath, container, vessel, etc.

After the semiconductor light emitting device 150 is put into the chamber 1300, the assembling substrate 200 can be disposed on the chamber 1300. According to the embodiment, the assembling substrate 200 can be put into the chamber 1300.

Meanwhile, an electric field can form an electric field in response to the application of an AC voltage, and the semiconductor light emitting device 150 injected into the assembly hole 207H can be fixed by the DEP force caused by the electric field. The distance between the first assembling wiring 201 and the second assembling wiring 202 can be smaller than the width of the semiconductor light emitting device 150 or the width of the assembly hole 207H. Accordingly, the assembly position of the semiconductor light emitting device 150 using the electric field can be more accurately fixed.

An insulating layer can be formed on the first assembling wiring 201 and the second assembling wiring 202. Accordingly, the first assembling wiring 201 and the second assembling wiring 202 are protected from the fluid 1200, and leakage of current flowing through the first assembling wiring 201 and the second assembling wiring 202 can be prevented. For example, the insulating layer can be formed of a single layer or multiple layers of an inorganic insulator such as silica or alumina or an organic insulator. The insulating layer can have a minimum thickness to prevent damage to the first assembling wiring 201 and the second assembling wiring 202 when the semiconductor light emitting device 150 is assembled. The insulating layer can have a maximum thickness for stably assembling the semiconductor light emitting device 150.

A barrier rib can be formed on an upper side of the insulating layer. The barrier rib can be the insulating layer 206 shown in FIG. 5, but is not limited thereto. A portion of the barrier rib can be positioned on an upper side of the first assembling wiring 201 and the second assembling wiring 202, and the remaining portion can be positioned on an upper side of the assembling substrate 200.

Meanwhile, when the assembling substrate 200 is manufactured, a part of the barrier ribs formed on an upper side of the insulating layer can be removed. Thus, the assembly hole 207H through which each of the semiconductor light emitting devices 150 is coupled and assembled to the assembling substrate 200 can be formed.

The assembly hole 207H to which the semiconductor light emitting devices 150 are coupled is formed in the assembling substrate 200, and a surface on which the assembly hole 207H is formed can contact the fluid 1200. The assembly hole 207H can guide an accurate assembly position of the semiconductor light emitting device 150.

Meanwhile, the assembly hole 207H can have a shape and size corresponding to the shape of the semiconductor light emitting device 150 to be assembled at a corresponding position. Accordingly, it is possible to prevent assembly of other semiconductor light emitting devices or assembly of a plurality of semiconductor light emitting devices into the assembly hole 207H.

Referring back to FIG. 9, after the assembling substrate 200 is disposed in the chamber, the assembly device 1100 applying a magnetic field can move along the assembling substrate 200. The assembly device 1100 can be a permanent magnet or an electromagnet.

The assembly device 1100 can move while in contact with the assembling substrate 200 in order to maximize a region of influence of the magnetic field into the fluid 1200. According to the embodiment, the assembly device 1100 can comprise a plurality of magnetic bodies or can comprise a magnetic body having a size corresponding to that of the assembling substrate 200. In this case, the moving distance of the assembling device 1100 can be limited within a predetermined range.

The semiconductor light emitting device 150 in the chamber 1300 can move toward the assembly device 1100 and the assembling substrate 200 by the magnetic field generated by the assembly device 1100.

The semiconductor light emitting device 150 can enter into the assembly hole 207H and be fixed by a DEP force while moving toward the assembly device 1100. The DEP force can be formed by an electric field between the assembling wirings 201 and 202.

Specifically, the first and second assembling wirings 201 and 202 can form an electric field by AC power, and a DEP force can be formed between the assembling wirings 201 and 202 by the electric field. The semiconductor light emitting device 150 can be fixed to the assembly hole 207H on the assembling substrate 200 by the DEP force.

Also, after assembly, a molding layer can be formed in the assembly hole 207H of the assembling substrate 200. The molding layer can be a transparent resin or a resin containing a reflective material or a scattering material.

Since the self-assembly method using the above-described electric/magnetic field can drastically reduce the time required to assemble each of the semiconductor light emitting devices to the substrate, a large-area high-pixel display can be implemented more quickly and economically.

Hereinafter, various embodiments for solving the above-described problem will be described with reference to FIGS. 10 to 50. Descriptions omitted below can be easily understood from FIGS. 4 to 9 and the descriptions given above in relation to the corresponding drawings.

In the following description, a first process, a second process and a third process can be mentioned. Unless specifically defined for the first process, the first process can refer to a process of moving a plurality of semiconductor light emitting devices to a desired position on the backplane substrate using at least one or more magnet. Unless specifically defined for the second process, the second process can refer to a process of assembling a semiconductor light emitting device at a specific location, for example, an assembly hole, using a DEP force formed at a specific location on the backplane substrate. Unless specifically defined for the third process, the third process can refer to the process of electrically connecting the semiconductor light emitting device assembled in the assembly hole.

First, before explaining various embodiments, the relationship between a semiconductor light emitting device in which the side inclination angle has an acute and DEP force will be explained.

Figure 10:
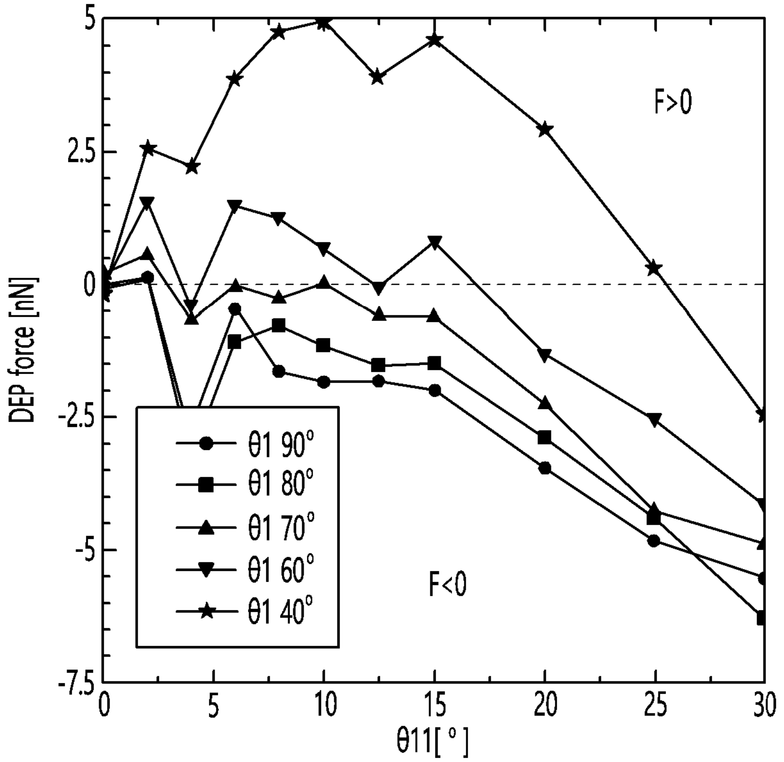
FIG. 10 is a graph showing the DEP force according to the side inclination angle of the side of the semiconductor light emitting device and the inclination of the semiconductor light emitting device.
Figure 11:
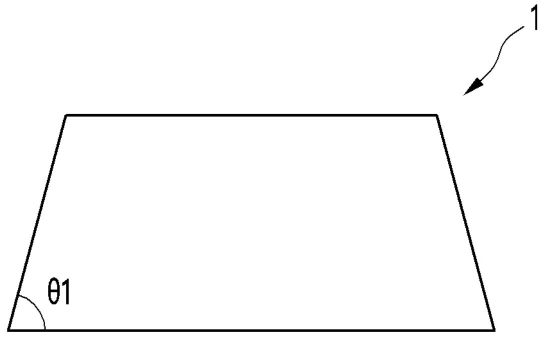
FIG. 11 illustrates a semiconductor light emitting device in which the side inclination angle has an acute angle.
Figure 12:
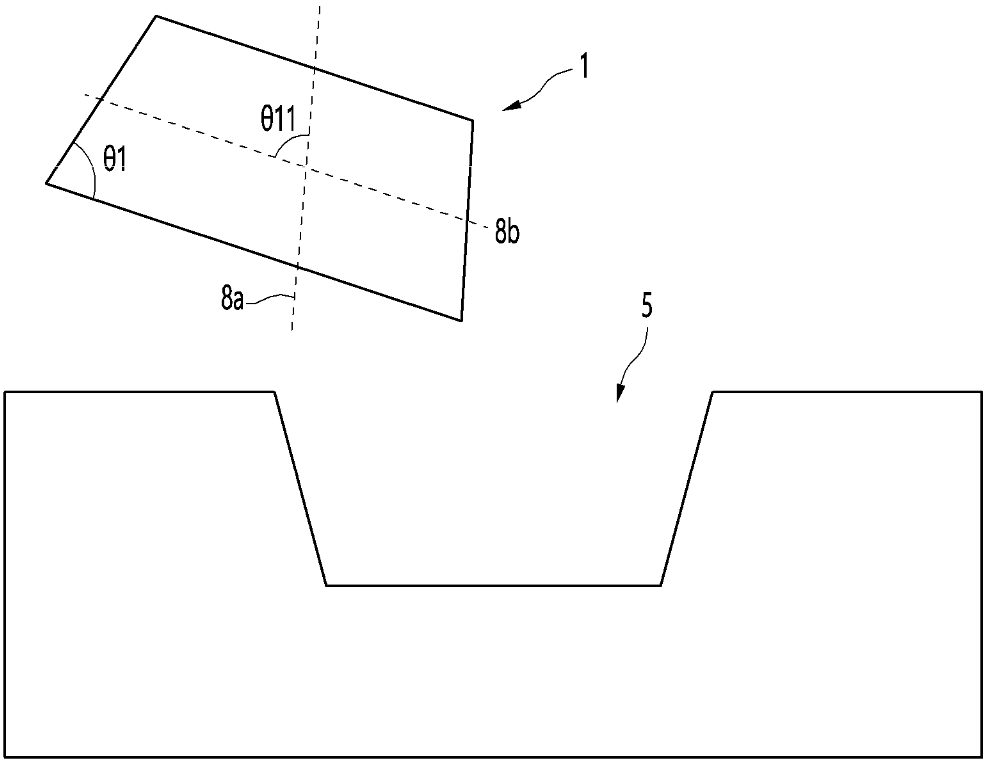
FIG. 12 shows the semiconductor light emitting device in which the side inclination angle has an acute angle being moved toward the assembly hole at an inclination of θ11.

FIG. 10 is a graph showing the DEP force according to the side inclination angle of the side portion of the semiconductor light emitting device and the inclination of the semiconductor light emitting device. FIG. 11 illustrates a semiconductor light emitting device in which the side inclination angle has an acute angle. FIG. 12 shows the semiconductor light emitting device in which the side inclination angle has an acute angle being moved toward the assembly hole at an inclination of θ11.

In FIG. 10, θ1 can represent the side inclination angle of the semiconductor light emitting device, and θ11 can represent the inclination of the semiconductor light emitting device being moved by the magnet. As shown in FIG. 11, θ1 represents the inclination angle of the side portion with respect to the lower side of the semiconductor light emitting device, and can be an acute angle less than 90°. As shown in FIG. 12, the semiconductor light emitting device 1 can be moved in the fluid by a magnet during self-assembly. At this time, the semiconductor light emitting device 1 can be moved with various inclinations θ11. The tilt θ11 can represent an angle at which the horizontal line 8*b* of the semiconductor light emitting device 1 is tilted with respect to the vertical line 8*a*. The vertical line 8*a* of the semiconductor light emitting device 1 can mean a straight line parallel to the surface of the semiconductor light emitting device 1. For example, when the side portion of the semiconductor light emitting device 1 is erected to face downward, the inclination θ11 of the semiconductor light emitting device 1 can be 0°. For example, when the lower side of the semiconductor light emitting device 1 is positioned to face downward, the inclination θ11 of the semiconductor light emitting device 1 can be 90°.

Meanwhile, when the semiconductor light emitting device 1 having an acute side inclination angle is assembled in the assembly hole 5, a space is formed between the inner side surface 340_I of the assembly hole 5 and the side portion of the semiconductor light emitting device 1. As another semiconductor light emitting device is assembled in the space, a stacking defect in which two or more semiconductor light emitting devices are stacked occurs, and this stacking defect can also cause a lighting defect.

Meanwhile, in FIG. 10, the fact that the DEP force is greater than 0 can mean that the semiconductor light emitting device 1 is pushed away from the assembly hole 5 by the DEP force (F>0), and the fact that the DEP force is less than 0 can mean that the semiconductor light emitting device 1 is pulled to the assembly hole 5 by the DEP force (F<0).

Therefore, in order to strengthen the assembly force and fixing force of the semiconductor light emitting device 1 to the assembly hole 5, the semiconductor light emitting device 1 has to work to be pulled to the assembly hole 5 by the DEP force (F<0). Here, the assembly force is a force for easily assembling the semiconductor light emitting device 1 into the assembly hole 5, and the fixing force can be a force for fixing the semiconductor light emitting device 1 so that the semiconductor light emitting device 1 does not fall out of the assembly hole 5.

To this end, as shown in FIG. 10, when the side inclination angle of the semiconductor light emitting device 1 is large, for example, 70° or more, the condition of F<0 is satisfied and the semiconductor light emitting device 1 is pulled to the assembly hole 5 by the DEP force (F<0) such that the assembly force and fixation force of the semiconductor light emitting device 1 with respect to the assembly hole 5 can be strengthened. As the assembly force of the semiconductor light emitting device 1 increases, the assembly speed of the semiconductor light emitting device 1 increases, thereby improving the assembly rate. The greater the fixing force of the semiconductor light emitting device 1, the more the semiconductor light emitting device 1 assembled in the assembly hole 5 does not come out such that color mixing defects can be prevented when semiconductor light emitting device 1 emitting light of different colors are assembled in the corresponding assembly hole 5.

Figure 15:
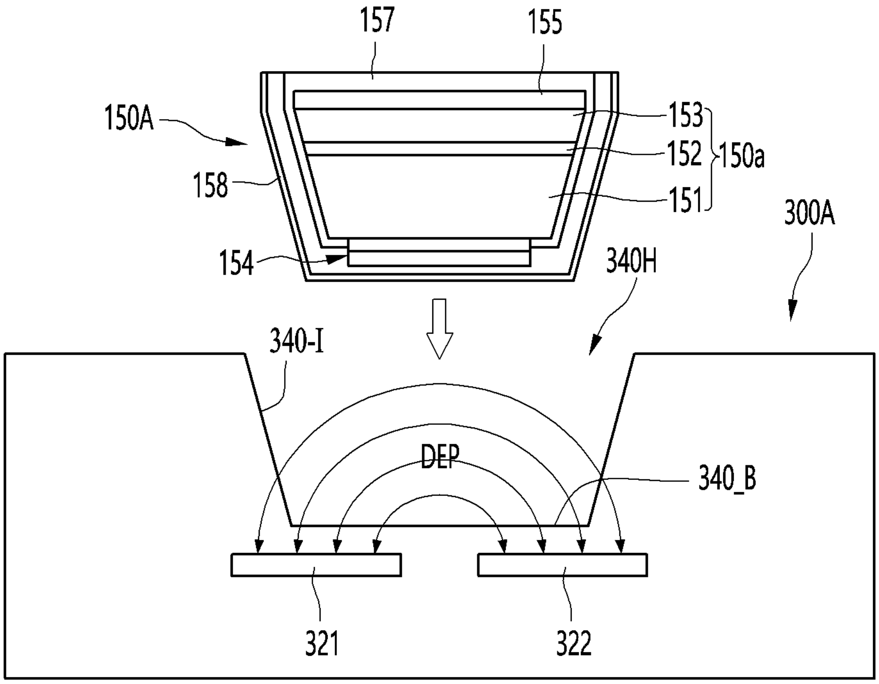
FIG. 15 shows the semiconductor light emitting device according to the first embodiment being assembled by DEP force formed in the assembly hole on the backplane substrate.
Figure 16:
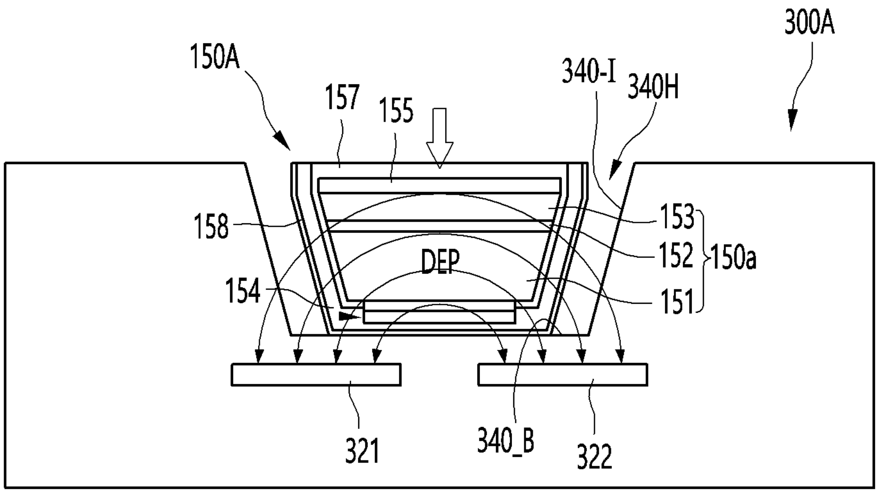
FIG. 16 shows the semiconductor light emitting device assembled in the assembly hole in FIG. 15 being fixed by the DEP force formed in the assembly hole on the backplane substrate.

As will be explained later, in an embodiment, as shown in FIGS. 15 and 16, the side inclination angle of the semiconductor light emitting device 150A can have an obtuse angle greater than 90°. For example, the inner angle θ1 between the side portion and lower surface of the light emitting layer can have an obtuse angle. In this way, the assembly force and fixing force of the semiconductor light emitting device 150A with respect to the assembly hole 340H are increased through self-assembly by the semiconductor light emitting device 150A having an obtuse angle as the inner angle θ1, thereby increasing the assembly rate and preventing color mixing defects.

Meanwhile, as shown in FIG. 10, when the inclination θ11 of the semiconductor light emitting device 1 is 15° or less and the side inclination angle of the semiconductor light emitting device 1 is 60° or less, there is only a force (F>0) that pushes the semiconductor light emitting device 1 from the assembly hole 340H by the DEP force. In other conditions, a force (F<0) can be applied to pull the semiconductor light emitting device 1 to the assembly hole 340H by DEP force. Therefore, as in the embodiment, when the side inclination angle of the semiconductor light emitting device has an obtuse angle greater than 90°, the semiconductor light emitting device is always pulled to the assembly hole 340H by DEP force (F<0) regardless of the inclination of the semiconductor light emitting device, so the inclination of the semiconductor light emitting device is not a problem.

First Embodiment

Figure 13:
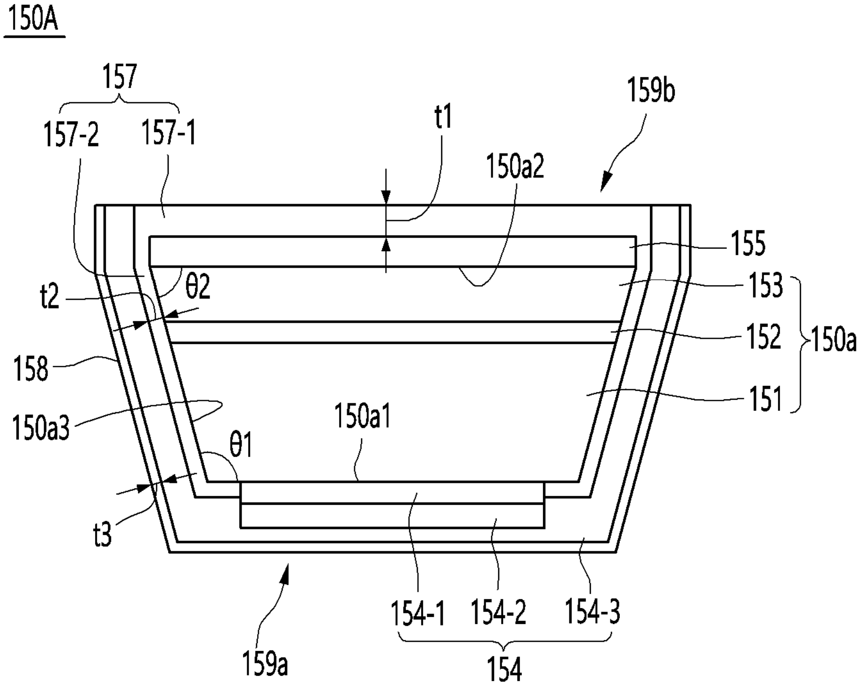
FIG. 13 is a cross-sectional view showing a semiconductor light emitting device according to a first embodiment.

FIG. 13 is a cross-sectional view showing a semiconductor light emitting device according to a first embodiment.

Referring to FIG. 13, the semiconductor light emitting device 150A according to the first embodiment can comprise a light emitting layer 150*a*, a passivation layer 157, a protective layer 158, a first electrode 154, and a second electrode 155.

The light emitting layer 150*a* can generate light and emit it to the outside. The light can be emitted in all directions from the light emitting layer 150*a*. The light emitting layer 150*a* can be made of a group 2-6 compound semiconductor material or a group 3-5 compound semiconductor material. The light emitting layer 150*a* can comprise a plurality of semiconductor layers. For example, the light emitting layer 150*a* can comprise at least one or more first conductivity type semiconductor layer 151, an active layer 152, and at least one or more second conductivity type semiconductor layer 153. The active layer 152 can be disposed on the first semiconductor layer, and the second conductivity type semiconductor layer 153 can be disposed on the active layer 152. Here, the first conductive semiconductor layer 151 can comprise an n-type dopant such as Si, and the second conductive semiconductor layer 153 can comprise a p-type dopant such as Mn.

In an embodiment, the light emitting layer 150*a* can have a structure that is different from a typical structure. For example, the inner angle θ1 between the side surface 150*a*3 and the lower surface 150*al* of the light emitting layer 150*a* in the embodiment can have an obtuse angle. Additionally, the inner angle θ2 between the side surface 150*a*3 and the upper surface 150*a*2 of the light emitting layer 150*a* in the embodiment can have an acute angle. For example, the light emitting layer 150*a* can have an inverted trapezoidal shape when viewed from the side. For example, the light emitting layer 150*a* can have an equilateral trapezoidal shape in which a pair of opposite sides are parallel and both end angles of one of the parallel pairs are the same when viewed from the side, but the shape is not limited thereto.

Specifically, the light emitting layer 150*a* can have a circular shape when viewed from above, but is not limited thereto. In this case, when viewed from above, the lower surface 150*al* and the upper surface 150*a*2 of the light emitting layer 150*a* can each have a circular shape.

Meanwhile, the lower surface 150*al* and the upper surface 150*a*2 of the light emitting layer 150*a* can have different sizes (or areas). The size of the upper surface 150*a*2 of the light emitting layer 150*a* can be greater than the size of the lower surface 150*al* of the light emitting layer 150*a*. The lower surface 150*al* and the upper surface 150*a*2 of the light emitting layer 150*a* can have different diameters. The diameter of the upper surface 150*a*2 of the light emitting layer 150*a* can be greater than the diameter of the lower surface 150*al* of the light emitting layer 150*a*. As such, since the sizes of the lower surface 150*al* and the upper surface 150*a*2 of the light emitting layer 150*a* are different, the side surface 150*a*3 of the light emitting layer 150*a* does not have a vertical surface. For example, the inner angle between the lower surface 150*al* and the side surface 150*a*3 of the light emitting layer 150*a* can have an obtuse angle greater than 90°.

As will be explained later, the assembly hole on the backplane substrate can have a shape corresponding to the shape of the semiconductor light emitting device 150A according to the first embodiment, for example, the shape of the light emitting layer 150*a*. The light emitting layer 150*a* of the semiconductor light emitting device 150A according to the first embodiment can have a shape corresponding to the shape of the assembly hole on the backplane substrate.

The inner angle θ2 between the inner side and the bottom surface of the assembly hole on the backplane substrate can have an obtuse angle greater than 90°. The inner side of the assembly hole can be formed perpendicular to the bottom surface, but it is difficult to form such a vertical surface. This means that when high resolution is required and the size of the assembly hole becomes small, it is even more difficult to form an assembly hole with an inner side perpendicular to the bottom surface.

Meanwhile, the manufacturing process of a typical semiconductor light emitting device 150A will be described, and the detailed manufacturing process will be explained later.

After the epitaxial layer is deposited, the epitaxial layer can be etched to form unit chips spaced apart from each other. When an etching process is performed, it is difficult to etch perpendicularly to the ground due to the unique characteristics of the compound semiconductor material of the epi layer. Accordingly, mesa etching can be performed in which the size (or diameter) of the unit chip becomes larger as the etching progresses from the surface of the epitaxial layer to the inside of the epitaxial layer. Thereafter, the semiconductor light emitting device 1 shown in FIG. 1B can be manufactured by forming a passivation layer and an electrode. In this case, in the manufactured semiconductor light emitting device 1, the inner angle between the side surface and the lower surface of the epi layer can have an acute angle.

Figure 2A:
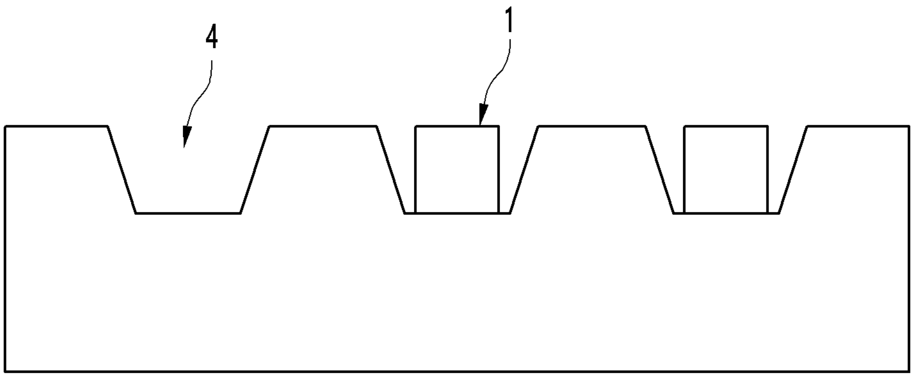
FIG. 2A (RELATED ART)
FIGS. 2A and 2B show defects in the second process of assembling a plurality of semiconductor light emitting devices on a backplane substrate using DEP force.
Figure 2B:
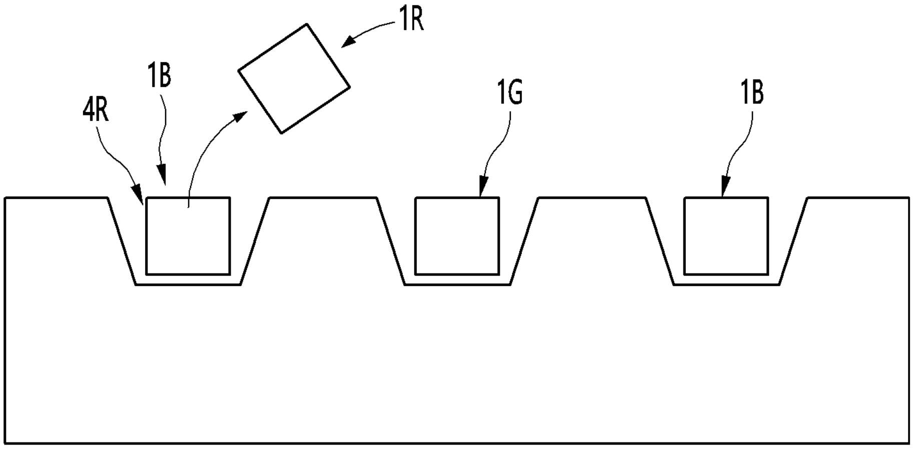
FIG. 2B (RELATED ART)

Accordingly, as shown in FIG. 2, the semiconductor light emitting device 1, which has an acute inner angle between the side surface and the lower surface of the epi layer, can be assembled into the assembly hole 4 having an obtuse angle between the inner side and the lower surface through the first process and the second process. In this case, as the assembly hole 4 goes from the lower side to the upper side, the gap (or space) between the side of the semiconductor light emitting device 1 and the inner side of the assembly hole 4 increases such that the semiconductor light emitting device 1 may not be fixed due to DEP force and can fall out of the assembly hole 4.

In addition, another semiconductor light emitting device can be assembled between the side surface of the semiconductor light emitting device 1 and the inner side surface of the assembly hole 4 on the upper side of the assembly hole 4 where the gap is increased. Within the assembly hole 4, several other semiconductor light emitting devices 1 are assembled between the side surface of the semiconductor light emitting device 1 and the inner side surface of the assembly hole 4 along the circumference of the side surface of the semiconductor light emitting device 1. Accordingly, a stacking defect occurs in which two or more semiconductor light emitting devices 1 are stacked, and this stacking defect can also cause a lighting defect. In addition, if another semiconductor light emitting device 1 assembled along the circumference of the side of the semiconductor light emitting device 1 within the assembly hole 4 is not yet collected, it can break away and be assembled in another assembly hole, resulting in color mixing defects.

The embodiment can solve the above-described problems by changing the shape of the light emitting layer 150*a*. For example, the semiconductor light emitting device 150A, for example, the light emitting layer 150*a*, can be changed to correspond to the shape of the assembly hole 340H. Therefore, as shown in FIGS. 15 and 16, when the semiconductor light emitting device 150A including the light emitting layer 150*a* having the changed shape is assembled into the assembly hole 340H on the backplane substrate 300A, the gap between the side surface 150*a*3 of the light emitting device

150A and the inner side surface 340_I of the assembly hole 340H on the upper side of the assembly hole 340H is narrow. Accordingly, except for the semiconductor light emitting device 150A already assembled in the assembly hole 340H, no semiconductor light emitting device 150A can be assembled along the circumference of the side surface 150*a*3 of the semiconductor light emitting device 150A within the assembly hole 340H. Accordingly, lighting defects can be prevented and yield can be improved. In addition, since only a set number, for example, one semiconductor light emitting device 150A, is assembled in the assembly hole 340H, unless the assembled semiconductor light emitting device 150A falls out, yield can be improved by preventing color mixing defects due to separation of the semiconductor light emitting device 150A.

In addition, since the inner angle θ1 between the side surface 150*a*3 and the lower surface 150*al* of the light emitting layer 150*a* of the semiconductor light emitting device 150A has an obtuse angle, the size of the side surface 150*a*3 can increase as it moves from the lower surface 150*al* to the upper surface 150*a*2 of the light emitting layer 150*a*. By changing the structural shape of the light emitting layer 150*a*, the light generated in the light emitting layer 150*a* can be reflected from the lower surface 150*al* or the side surface 150*a*3. Accordingly, the reflected light is naturally emitted forward, thereby increasing light efficiency and improving luminance.

Meanwhile, in the embodiment, when the inner angle θ1 between the side surface 150*a*3 and the lower surface 150*al* of the light emitting layer 150*a* of the semiconductor light emitting device 150A has an obtuse angle, the force pulling the first electrode 154 to the assembly hole 340H increases with respect to the DEP force. Thus, the assembly force and fixation force of the semiconductor light emitting device 150A with respect to the assembly hole 340H are increased, thereby increasing the assembly rate and preventing color mixing defects. As the obtuse angle increases, the force that pulls the first electrode 154 into the assembly hole 340H with respect to the DEP force can increase.

As shown in FIG. 10, when the inner angle θ1 between the side surface and the lower surface of the semiconductor light emitting device is an acute angle, for example, less than 60°, the force (F>0) that pushes the first electrode from the assembly hole is applied to the DEP force. However, when the inner angle between the side surface and the lower surface of the semiconductor light emitting device is 70° or more, the force (F<0) that pulls the first electrode into the assembly hole can be applied to the DEP force. It can be seen that as the inner angle θ1 between the side surface and the lower surface of the semiconductor light emitting device increases to 70°, 80°, and 90°, the force (F<0) that pulls the first electrode into the assembly hole with respect to the DEP force increases.

From FIG. 10, when the inner angle θ1 between the side surface and the lower surface of the semiconductor light emitting device has an obtuse angle greater than 90°, the force (F<0) by which the first electrode is pulled into the assembly hole with respect to the DEP force can be further increased.

According to the embodiment, the shape of the semiconductor light emitting device 150A is changed so that the inner angle θ1 between the side surface 150*a*3 and the lower surface 150*al* of the semiconductor light emitting device 150A has an obtuse angle, thereby increasing assembly force and fixation force when assembling the semiconductor light emitting device 150A in the second process.

For example, in the embodiment, the shape of the semiconductor light emitting device 150A can be changed so that the obtuse angle becomes larger. In this way, the shape-changed semiconductor light emitting device 150A can be assembled into the assembly hole 340H through a second process, as shown in FIG. 15. DEP force can be formed to assemble the semiconductor light emitting device 150A in the assembly hole 340H. By changing the shape of the semiconductor light emitting device 150A to make the obtuse angle larger, the force (F<0) by which the first electrode 154 of the semiconductor light emitting device 150A is pulled to the assembly hole 340H can also be increased in response to the DEP force formed in the assembly hole 340H. In this case, as the pulling force (F<0) increases, the assembly force for the semiconductor light emitting device 150A can increase. Here, the assembly force can be a force for easily assembling the semiconductor light emitting device 150A into the assembly hole 340H. Accordingly, the semiconductor light emitting device 150A of the embodiment can be more easily assembled into the assembly hole 340H, thereby improving the assembly rate.

Meanwhile, the shape of the semiconductor light emitting device 150A is changed to make the obtuse angle larger, so that the force (F<0) by which the first electrode 154 of the semiconductor light emitting device 150A is pulled to the assembly hole 340H can also be increased in response to the DEP force formed in the assembly hole 340H. In this case, as shown in FIG. 16, as the pulling force (F<0) increases, the fixing force of the semiconductor light emitting device 150A assembled in the assembly hole 340H can increase. Here, the fixing force can be a force for fixing the semiconductor light emitting device 150A so that the semiconductor light emitting device 150A does not fall out of the assembly hole 340H. Accordingly, since the semiconductor light emitting device 150A assembled in the assembly hole 340H is firmly fixed to the assembly hole 340H due to an increase in fixing force. Thus, the semiconductor light emitting device 150A does not fall out of the assembly hole 340H, thereby preventing assembly defects. Accordingly, lighting defects can be prevented, and color mixing defects can be prevented when the semiconductor light emitting device 150A is removed and then assembled in another assembly hole 340H.

In addition, in the embodiment, by forming the thickness t3 of the protective layer 158 thin, the DEP force is applied to pull the first electrode 154 to the assembly hole 340H, so that the assembly portion 159*a* is positioned to face the bottom surface 340_B of the assembly hole 340H. In response to the DEP force, the passivation layer 157 is pushed away from the assembly hole 340H, so that the non-assembly portion 159*b* is positioned to face the bottom surface 340_B in the opposite direction. Thus, the semiconductor light emitting device 150A can be properly assembled in the assembly hole 340H. For example, the assembly portion 159*a* of the semiconductor light emitting device 150A can be in contact with the bottom surface 340_B of the assembly hole 340H or can be positioned adjacent to the bottom surface 340_B of the assembly hole 340H.

The passivation layer 157 can protect the light emitting layer 150*a*. For example, the passivation layer 157 can prevent an electrical short circuit caused by foreign substances sticking to the side portion of the light emitting layer 150*a* and protect the light emitting layer 150*a* from being damaged or scratched by external shocks. Additionally, the passivation layer 157 can block leakage current flowing on the side portion of the light emitting layer 150*a*. In addition, the passivation layer 157 can enable the semiconductor light emitting device 150A to be properly assembled by DEP force in the second process. For example, the passivation layer 157 is pushed away from the assembly hole 340H in response to the DEP force, so that the upper surface 150*a*2 of the semiconductor light emitting device 150A can be positioned to face the bottom surface 340_B of the assembly hole 340H on the opposite side. Thus, the bottom surface 340_B of the assembly hole 340H can be properly assembled.

For proper assembly, the assembly portion 159*a* can be positioned toward the assembly hole 340H, and the non-assembly portion 159*b* can be positioned toward the opposite direction of the assembly hole 340H. Here, the assembly portion 159*a* can refer to the first electrode 154 disposed on the lower surface 150*al* of the light emitting layer 150*a*, or can refer to the first electrode 154 and the protective layer 158. The non-assembly portion 159*b* can refer to the passivation layer 157 disposed on the upper surface 150*a*2 of the light emitting layer 150*a*.

The passivation layer 157 can comprise an insulator. For example, the passivation layer 157 can comprise an inorganic insulating material, but is not limited thereto.

The passivation layer 157 can be disposed on the upper surface 150*a*2 and the side surface 150*a*3 of the light emitting layer 150*a*. The passivation layer 157 can be disposed on the entire area of the upper surface 150*a*2 of the light emitting layer 150*a*. The passivation layer 157 can be disposed along the circumference of the side surface 150*a*3 of the light emitting layer 150*a*. Additionally, a part of the passivation layer 157 can be disposed on a part of the lower surface 150*al* of the light emitting layer 150*a*, for example, an edge area. For example, the passivation layer 157 can be disposed along the edge area of the lower surface 150*al* of the light emitting layer 150*a*.

Meanwhile, the thickness t1 of the passivation layer 157 can vary depending on the position. The passivation layer 157 can comprise a first passivation layer 157-1 and a second passivation layer 157-2. The first passivation layer 157-1 can be disposed on the upper surface 150*a*2 of the light emitting layer 150*a*, and the second passivation layer 157-2 can be disposed on the side surface 150*a*3 of the light emitting layer 150*a*. The passivation layer 157 disposed at the edge of the lower surface 150*al* of the light emitting layer 150*a* can also be included in the second passivation layer 157-2, but is not limited thereto.

The thickness t1 of the first passivation layer 157-1 can be greater than the thickness t2 of the second passivation layer 157-2. The first passivation layer 157-1 can be pushed from the assembly hole 340H against the DEP force for proper assembly during self-assembly, and the pushing force can be large. For example, for proper assembly, the first electrode 154 disposed on the lower surface 150*a*1 of the light emitting layer 150*a* can have a large pulling force to the assembly hole 340H relative to the DEP force, and the passivation layer 157 disposed on the upper surface 150*a*2 of the light emitting layer 150*a*, for example, the first passivation layer 157-1, can have a large pushing force from the assembly hole 340H. In order to increase the force with which the first passivation layer 157-1 is pushed away from the assembly hole 340H in response to the DEP force, the dielectric constant can be increased. In an embodiment, the thickness t1 of the first passivation layer 157-1 can be increased to increase the dielectric constant.

The second passivation layer 157-2 can prevent the first conductive semiconductor layer 151 and the second conductive semiconductor layer 153 from being electrically short-circuited by the first electrode 154. For example, since the second passivation layer 157-2 performs an electrical insulation function, the thickness t2 is determined within the range in which the electrical insulation properties are maintained. Thus, the second passivation layer 157-2 can have a thickness thinner than the thickness t1 of the first passivation layer 157-1. For example, the thickness t2 of the second passivation layer 157-2 can be 1.1 to 5 times greater than the thickness t1 of the first passivation layer 157-1, but is not limited thereto.

Meanwhile, a protective layer 158 can be disposed on the light emitting layer 150*a*.

As an example, when the protective layer 158 is not provided, the first electrode 154 can be exposed to the outside. If the first electrode 154 is not provided and the first conductive semiconductor layer 151 serves as the first electrode 154, the first conductive semiconductor layer 151 can be exposed to the outside. In this case, when the semiconductor light emitting device 150A is moved by the magnet 500 in the first process, the semiconductor light emitting device 150A collides with the inside of the chamber, the backplane substrate, or another semiconductor light emitting device. Thus, the exposed first electrode 154 or first conductive semiconductor layer 151 of the semiconductor light emitting device 150A can be damaged or scratched. If the first electrode 154 or the first conductive semiconductor layer 151 is damaged or scratched, the electrical or optical properties of the semiconductor light emitting device 150A can deteriorate. In addition, debris or foreign substances separated from the semiconductor light emitting device 150A due to the damage can be adsorbed to the inside of the chamber, the backplane substrate, or another semiconductor light emitting device 150A, causing another defect or problem.

Figure 1B:
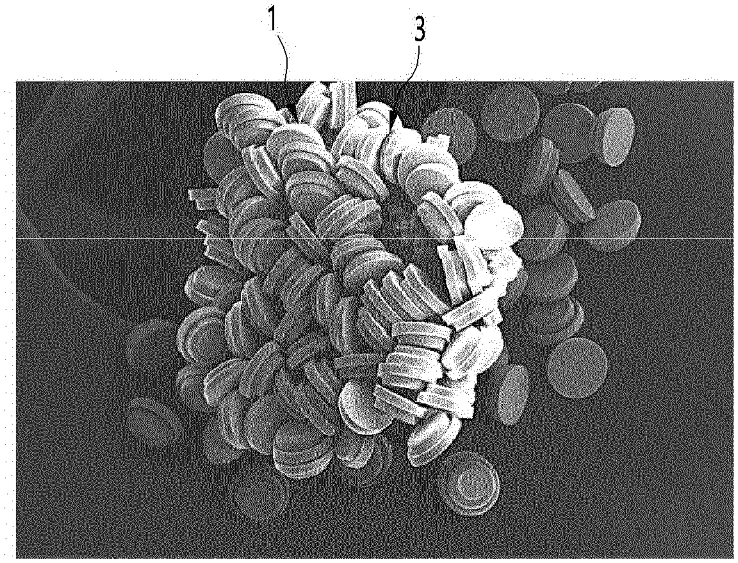
FIG. 1B (RELATED ART)

As another example, when the protective layer 158 is not provided and the first electrode 154 or the first conductive semiconductor layer 151 is exposed to the outside, as shown in FIGS. 1A and 1B, chain defects or lump defects can occur. This is because a pulling force or surface tension is applied between the exposed first electrodes or light emitting layers of each semiconductor light emitting device 1.

To solve these problems, the protective layer 158 can be the outermost layer of the semiconductor light emitting device 150A according to the first embodiment, and can protect the first electrode 154 and prevent chain defects or lump defects.

The protective layer 158 can comprise an insulator. The protective layer 158 can comprise, for example, an inorganic insulating material, but is not limited thereto. The passivation layer 157 and the protective layer 158 can comprise the same insulating material or different insulating materials. For example, the passivation layer 157 can be made of $SiO_2$, and the protective layer 158 can be made of $SiN_x$.

Figure 14:
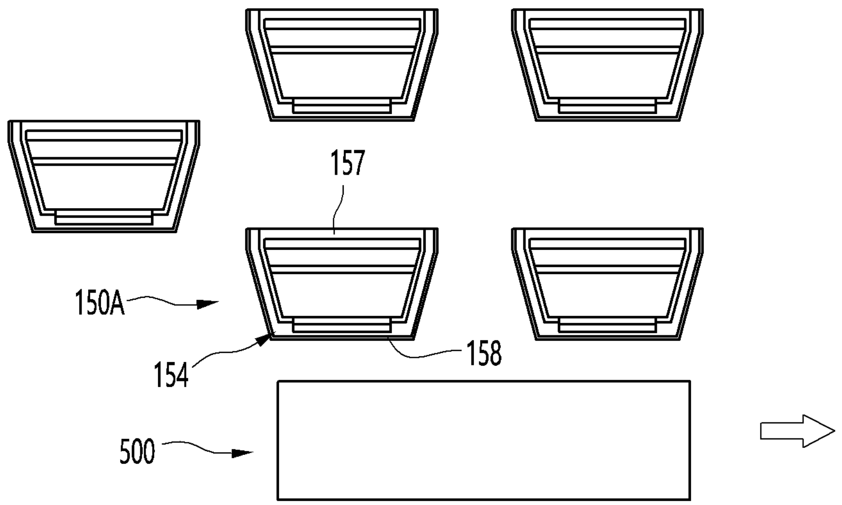
FIG. 14 shows a plurality of semiconductor light emitting devices according to the first embodiment being moved by a magnet.

Even if the semiconductor light emitting device 150A collides with the inside of the chamber, the backplane substrate, or another semiconductor light emitting device 150A, the protective layer 158 can prevent the first electrode 154 or the first conductive semiconductor layer 151 from being damaged or creating debris. In addition, as shown in FIG. 14, when a plurality of semiconductor light emitting devices 150A are moved by the magnet 500 through the first process, the first electrode 154 or the first conductive semiconductor layer 151 is no longer exposed by the protective layer 158. Thus, since no pulling force or surface tension is applied between the semiconductor light emitting devices 150A, chain defects or lump defects can be prevented. In addition, since the second conductive layer 154-2 of the first electrode 154 is magnetized by the magnet 500, the response speed to the magnet 500 increases and moves more quickly toward the magnet 500, assembly rate can be improved.

Since the protective layer 158 can protect at least the first electrode 154, the protective layer 158 can have a shape corresponding to the shape of the first electrode. The protective layer 158 can have the same shape as that of the first electrode 154. The protective layer 158 can cover the first electrode 154. When looking at the first electrode 154 through the protective layer 158, the first electrode 154 may not be visible due to the protective layer 158 covered on the first electrode 154. When viewed from above, the protective layer 158 and the first electrode 154 can be exposed to the outside. At this time, the end (or upper surface 150*a*2) of the first electrode 154 and the end (or upper surface 150*a*2) of the protective layer 158 can be positioned on the same horizontal line. The end of the protective layer 158 and the upper surface 150*a*2 of the passivation layer 157 can be positioned on the same horizontal line. The end of the first electrode 154, the end of the protective layer 158, and the upper surface 150*a*2 of the passivation layer 157 can be positioned on the same horizontal line, but is not limited thereto.

The protective layer 158 can be disposed on the passivation layer 157 disposed on the side surface 150*a*3 of the light emitting layer 150*a*. The protective layer 158 can be disposed on the first electrode 154 disposed on the side surface 150*a*3 of the light emitting layer 150*a*.

Meanwhile, since the protective layer 158 comprises an insulator with a dielectric constant and serves to hinder the action of DEP force, there is a problem in that the proper assembly of the semiconductor light emitting device 150A is interrupted during self-assembly, resulting in reverse assembly. In the case of reverse assembly, even if electrical connection is made through the third process, when power is applied to the semiconductor light emitting device 150A, a reverse bias voltage is applied to the semiconductor light emitting device 150A due to reverse assembly of the semiconductor light emitting device 150A. This can cause a lighting defect in which light cannot be emitted.

To solve this problem, in the embodiment, the thickness t3 of the protective layer 158 can be formed to be very thin. The protective layer 158 can have a thickness t3 of 1/10 or less of the thickness t1 of the passivation layer 157. For example, when the thickness t1 of the passivation layer 157 is 500 nm, the thickness t3 of the protective layer 158 can be 50 nm. For example, when the thickness t1 of the passivation layer 157 is 300 nm, the thickness t3 of the protective layer 158 can be 30 nm. Meanwhile, the protective layer 158 is made of an insulating material with a small dielectric constant, so that the DEP force does not interfere with the third conductive layer 154-3 of the first electrode 154.

In this way, by making the thickness t3 of the protective layer 158 very thin, when the second process is performed, the DEP force passes through the protective layer 158 and affects the first electrode 154 such that the first electrode 154 of the semiconductor light emitting device 150A can be positioned toward the bottom surface 340_B of the assembly hole 340H. For example, the semiconductor light emitting device 150A can be properly assembled in the assembly hole 340H due to the thin thickness t3 of the protective layer 158, thereby preventing lighting defects.

The first electrode 154 or the first conductive semiconductor layer 151 can be protected by the protective layer 158 having a very thin thickness t3, and chain defects or lump defects occurring in the first process can be prevented. In addition, during the second process, the semiconductor light emitting device 150A can be properly assembled in the assembly hole 340H, so lighting defects can be prevented.

Meanwhile, a first electrode 154 and a second electrode 155 can be provided for electrical connection to an external power source. The second electrode 155 can be in contact with the second conductive semiconductor layer 153 comprising a p-type dopant and can be called an anode. The first electrode 154 can be in contact with the first conductive semiconductor layer 151 comprising an n-type dopant and can be called a cathode. Accordingly, a positive (+) voltage can be applied to the second electrode 155 and a negative (−) voltage can be applied to the first electrode 154 such that a driving current can flow from the second conductive semiconductor layer 153 to the first conductive semiconductor layer 151 via the active layer 152. In this case, light with luminance corresponding to the driving current can be generated in the active layer 152 and emitted to the outside. As described previously, the inner angle θ1 between the side surface 150*a*3 and the lower surface 150*al* of the light emitting layer 150*a* has an obtuse angle. Thus, the light traveling to the lower surface 150*al* and the side surface 150*a*3 of the light emitting layer 150*a* can be reflected and emitted forward rather than being emitted outward through the lower surface and side surface of the light emitting layer 150*a*, thereby increasing light efficiency and improving luminance.

The first electrode 154 and the second electrode 155 can each comprise a plurality of conductive layers. The conductive layer can comprise metal, metal alloy, metal oxide, etc. The metal such as Au, Ag, Al, Ti, Ni, Fe, Mo, Cu, etc. can be used. The metal alloy such as AuBe, AuGe, PdGe, etc. can be used. The metal oxide such as ITO, IZO, etc. can be used.

The second electrode 155 can be disposed on the second conductive semiconductor layer 153. The second electrode 155 can be disposed between the light emitting layer 150*a* and the passivation layer 157. The second electrode 155 can be surrounded by a passivation layer 157. The second electrode 155 can be covered by a passivation layer 157.

Meanwhile, the first electrode 154 can be disposed between the light emitting layer 150*a* and the protective layer 158.

As previously described, the passivation layer 157 can be disposed on the upper surface 150*a*2 of the light emitting layer 150*a* and along the circumference of the side surface 150*a*3 of the light emitting layer 150*a*. In this case, the first electrode 154 can be disposed on the passivation layer 157. For example, the first electrode 154 can be disposed on the passivation layer 157 disposed along the circumference of the side surface 150*a*3 of the light emitting layer 150*a*.

As previously described, the end of the first electrode 154 and the end of the protective layer 158 can be positioned on the same horizontal line. The end of the protective layer 158 and the upper surface 150*a*2 of the passivation layer 157 can be disposed on the same horizontal line. The end of the first electrode 154 and the upper surface 150*a*2 of the passivation layer 157 can be positioned on the same horizontal line. The end of the protective layer 158, the end of the first electrode 154, and the upper surface 150*a*2 of the passivation layer 157 can be positioned on the same horizontal line.

Meanwhile, the first electrode 154 can comprise a plurality of conductive layers.

Among the plurality of conductive layers, some conductive layers can be disposed only on the lower surface 150*al* of the light emitting layer 150*a*. At least one or more conductive layer among the plurality of conductive layers can be disposed on the side surface **150*a*3 of the light emitting layer 150*a***.

For example, the first electrode 154 can comprise a first conductive layer 154-1, a second conductive layer 154-2, and a third conductive layer 154-3. The first conductive layer 154-1, the second conductive layer 154-2, and the third conductive layer 154-3 can each comprise metal, metal alloy, etc. For example, the first conductive layer 154-1 can comprise an ohmic contact layer including at least one selected from the group consisting of AuGe, PdGe, Au, and Ag. For example, the second conductive layer 154-2 can comprise a magnetic layer including at least one selected from the group consisting of Ti, Ni, and Fe. For example, the third conductive layer 154-3 can comprise a side contact layer including at least one selected from the group consisting of Ti, Ni, Mo, Cu, Au, Ag, and Al. The side contact layer can comprise at least one or more layer of an electrode layer, a magnetic layer, a reflective layer, a bonding layer, or a diffusion prevention layer.

The first conductive layer 154-1 and the second conductive layer 154-2 can be disposed on the lower surface **150*al* of the light emitting layer 150*a*. For example, the upper surface 150*a*2 of the first conductive layer 154-1 can be in contact with the lower surface 150*al* of the first conductive semiconductor layer 151, and the upper surface 150*a*2 of the second conductive layer 154-2 can be in contact with the lower surface 150*al* of the first conductive layer 154-1**.

The third conductive layer 154-3 can be disposed on the lower surface **150*al* and the side surface 150*a*3 of the light emitting layer 150*a*. The upper surface 150*a*2 of the third conductive layer 154-3 can be in contact with the lower surface 150*al* of the second conductive layer 154-2 on the lower surface 150*al* of the light emitting layer 150*a*. The third conductive layer 154-3 can extend from the lower surface 150*al* of the second conductive layer 154-2 to the side surface 150*a*3 of the light emitting layer 150*a*. The third conductive layer 154-3 can be in contact with the outer side surface 150*a*3 of the passivation layer 157 along the circumference of the side surface 150*a*3 of the light emitting layer 150*a***.

When a post-process is performed in the third process, the electrode wiring 360 or the connection electrode 370 can be easily connected to the third conductive layer 154-3 of the first electrode 154 disposed on the side surface **150*a*3 of the light emitting layer 150*a*, thereby preventing connection failure. For example, in the past, during solder bonding, contact defects and electrical/optical properties between the semiconductor light emitting device 150A and the assembled wiring were deteriorated. However, the third conductive layer 154-3 of the first electrode 154 can be disposed on the side surface 150*a*3 of the light emitting layer 150*a*, so that the electrode wiring 360 can be easily connected to the third conductive layer 154-3** without a thermocompression process, preventing contact defects and improving electrical/optical properties.

The first conductive layer 154-1 can have excellent ohmic contact property with the first conductive semiconductor layer 151, and thus the electrical properties can be improved by the first conductive layer 154-1. When the first process is performed by the second conductive layer 154-2, the second conductive layer 154-2 can be magnetized by the magnet 500. Thus, the semiconductor light emitting device 150A can be immediately moved toward the magnet 500 such that during self-assembly, the assembly speed can be increased and the assembly rate can be improved.

FIGS. 17 to 27 illustrate the manufacturing process of the semiconductor light emitting device according to the first embodiment.

Figure 17:
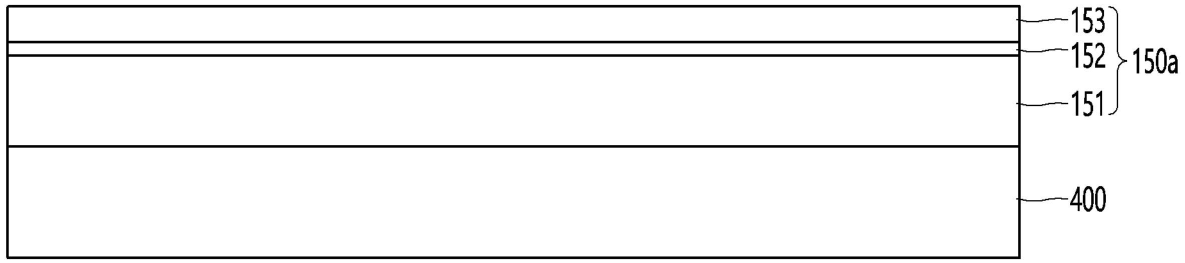
FIGS. 17 to 27 illustrate the manufacturing process of the semiconductor light emitting device according to the first embodiment.

As shown in FIG. 17, the light emitting layer **150*a* can be deposited on a growth substrate 400. The light emitting layer 150*a* can be deposited on the growth substrate 400 using the deposition equipment such as MOCVD. The light emitting layer 150*a* can be made of a group 2-6 compound semiconductor material or a group 3-5 compound semiconductor material. The light emitting layer 150*a* can comprise a plurality of semiconductor layers. The light emitting layer 150*a* can comprise at least one or more first conductivity type semiconductor layer 151, an active layer 152, and at least one or more second conductivity type semiconductor layer 153**.

Figure 18:
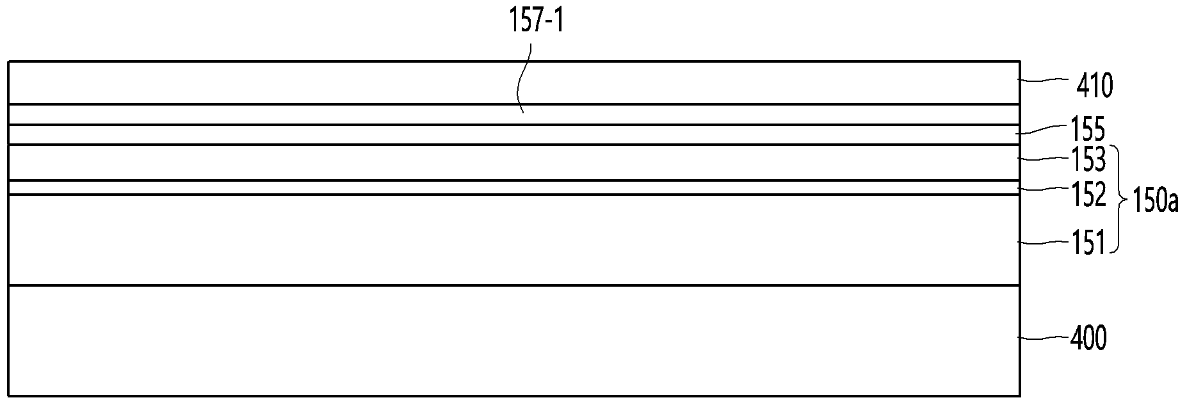

As shown in FIG. 18, a second electrode 155, a first passivation layer 157-1, and a sacrificial layer 410 can be formed on the light emitting layer **150*a*. The second electrode 155 can comprise a transparent conductive layer, such as ITO. Accordingly, light generated in the light emitting layer 150*a* can be emitted to the outside through the second electrode 155. The first passivation layer 157-1 can be formed of an inorganic material. The sacrificial layer 410** is later removed by an etchant and can be formed of a metal such as Al.

Figure 19:
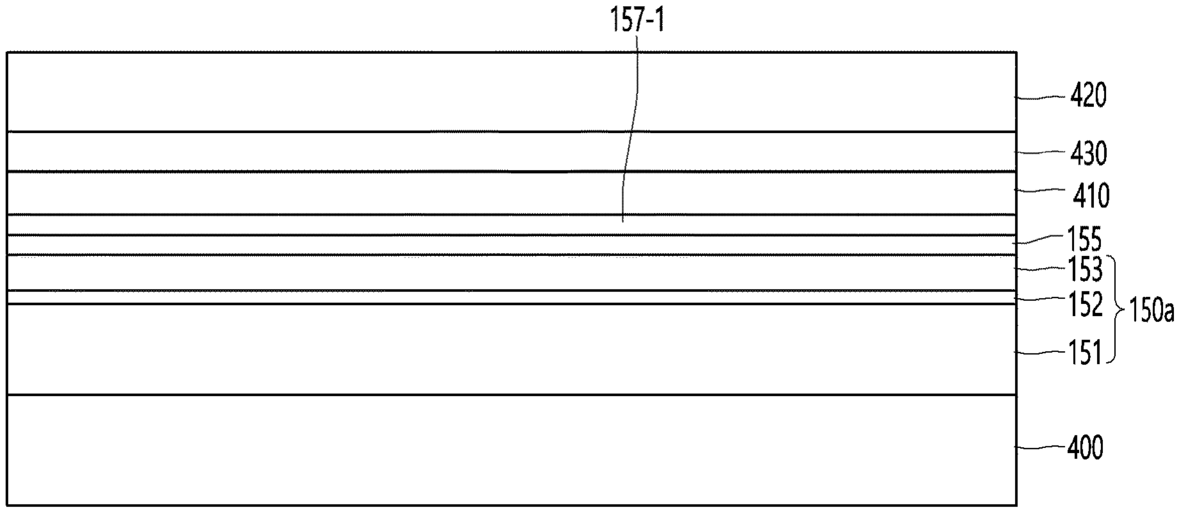

As shown in FIG. 19, a temporary substrate 420 can be attached to the sacrificial layer 410 using a bonding layer 430. The bonding layer 430 can be formed of a resin material such as BCB, for example. The temporary substrate 420 can be formed of sapphire, but is not limited thereto.

Figure 20:
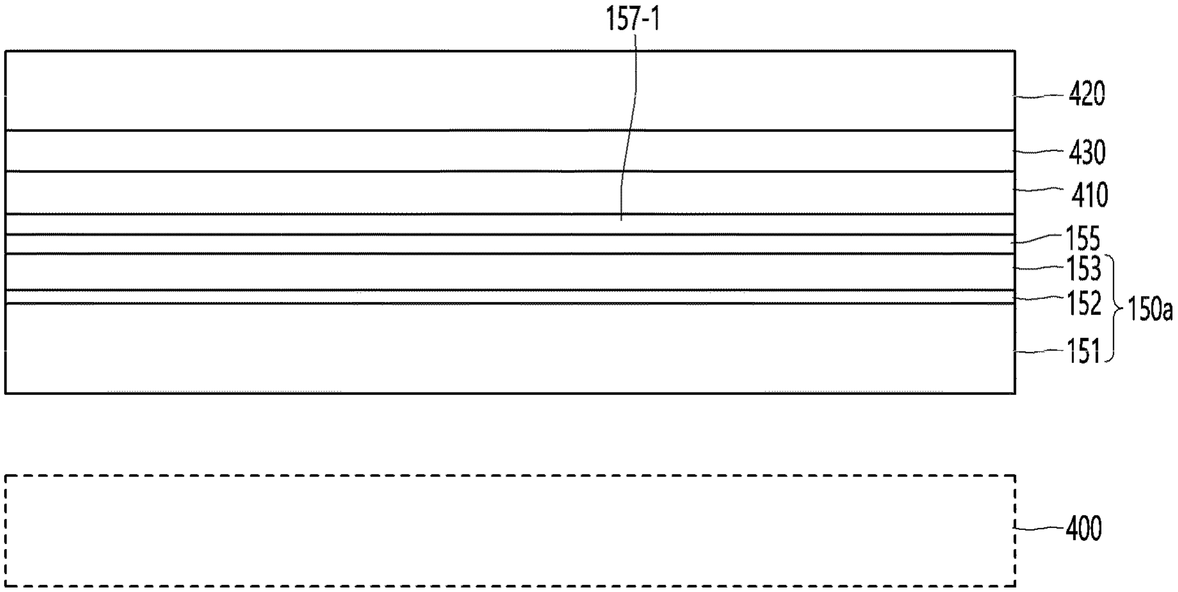

As shown in FIG. 20, the growth substrate 400 can be removed through the LLO process. By removing the growth substrate 400, a part of the light emitting layer **150*a*, for example, the first conductivity type semiconductor layer 151, can be exposed to the outside. To facilitate the growth of the light emitting layer 150*a*, an undoped layer can be formed on the growth substrate 400 before the light emitting layer 150*a* is deposited. In this case, after the growth substrate 400 is removed, the undoped layer can be removed using an etching process to expose the first conductive semiconductor layer 151**.

Figure 21:
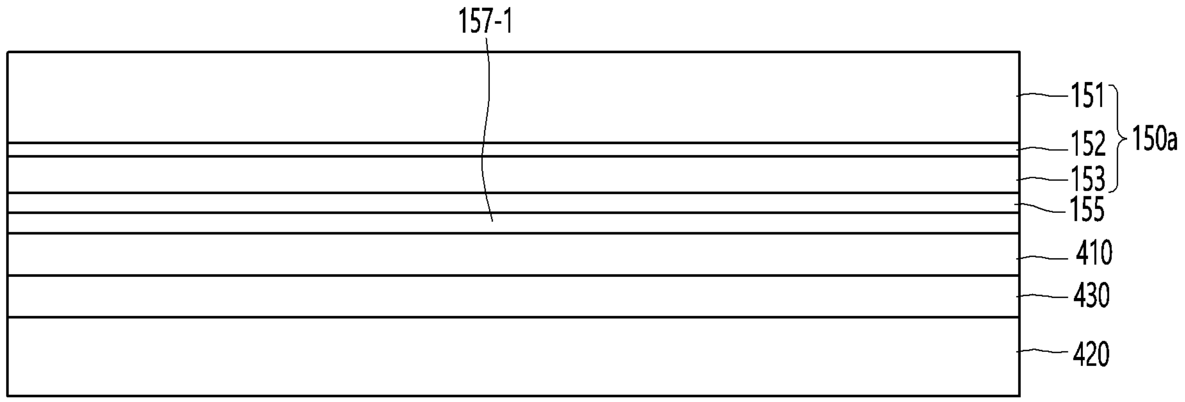

As shown in FIG. 21, the temporary substrate 420 can be turned over so that the first conductive semiconductor layer 151 to be exposed is positioned toward the front.

Figure 22:
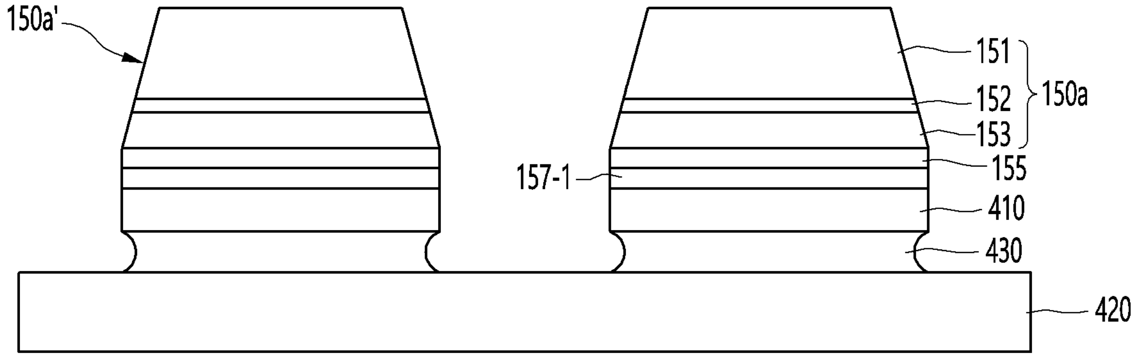

As shown in FIG. 22, the light emitting layer **150*a*, the second electrode 155, the first passivation layer 157-1, the sacrificial layer 410, and the bonding layer 430 are sequentially etched through an etching process such that a plurality of chips 150*a*'** spaced apart from each other can be formed.

After a photoresist film is coated on the light emitting layer **150*a*, it is patterned to form a PR pattern, and an etching process can be performed using the PR pattern as a mask. The light emitting layer 150*a* can be etched through dry etching, and the second electrode 155 and the sacrificial layer 410 can be etched through wet etching. The first passivation layer 157-1 and the bonding layer 430** can be etched through dry etching or wet etching.

Figure 23:
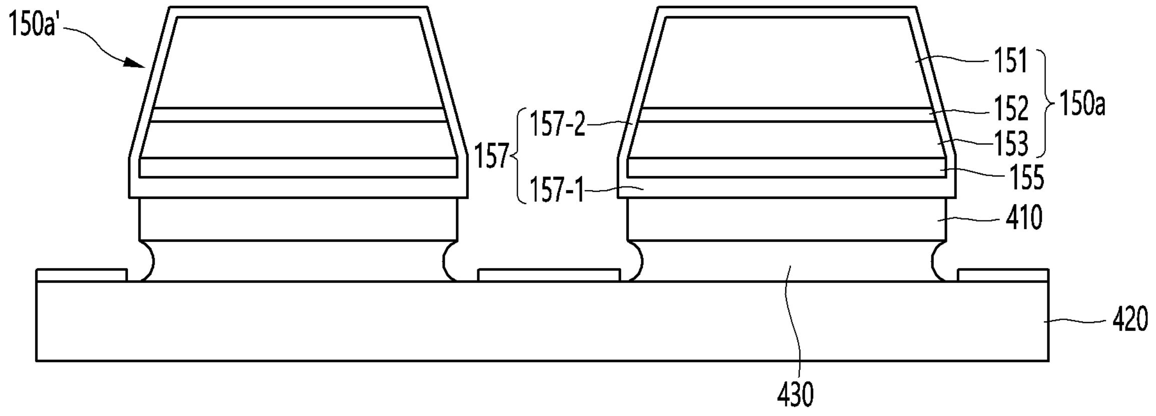

As shown in FIG. 23, a second passivation layer 157-2 can be formed to surround the chip **150*a*'. Accordingly, the passivation layer 157 can be composed of the first passivation layer 157-1 and the second passivation layer 157-2. The second passivation layer 157-2 can be formed of the same inorganic material as the first passivation layer 157-1, but is not limited thereto. When the second passivation layer 157-2 and the first passivation layer 157-1 are formed of the same inorganic material, the second passivation layer 157-2 and the first passivation layer 157-1** can be formed integrally.

The second passivation layer 157-2 can have a thickness t2 that is smaller than the thickness t1 of the first passivation layer 157-1. The first passivation layer 157-1 can increase the force pushed against the DEP force in the second process. For this, the dielectric constant can be large, so the thickness t1 of the first passivation layer 157-1 can be formed to be large. On the other hand, if the second passivation layer 157-2 prevents an electrical short between the first conductive semiconductor layer 151 and the second conductive semiconductor layer 153 due to foreign substances, or prevents an electrical short between the third conductive layer 154-3 of the first electrode 154 and the light emitting layer 150*a*, that can be enough. Accordingly, the thickness t2 of the second passivation layer 157-2 can be smaller than the thickness t1 of the first passivation layer 157-1.

Figure 24:
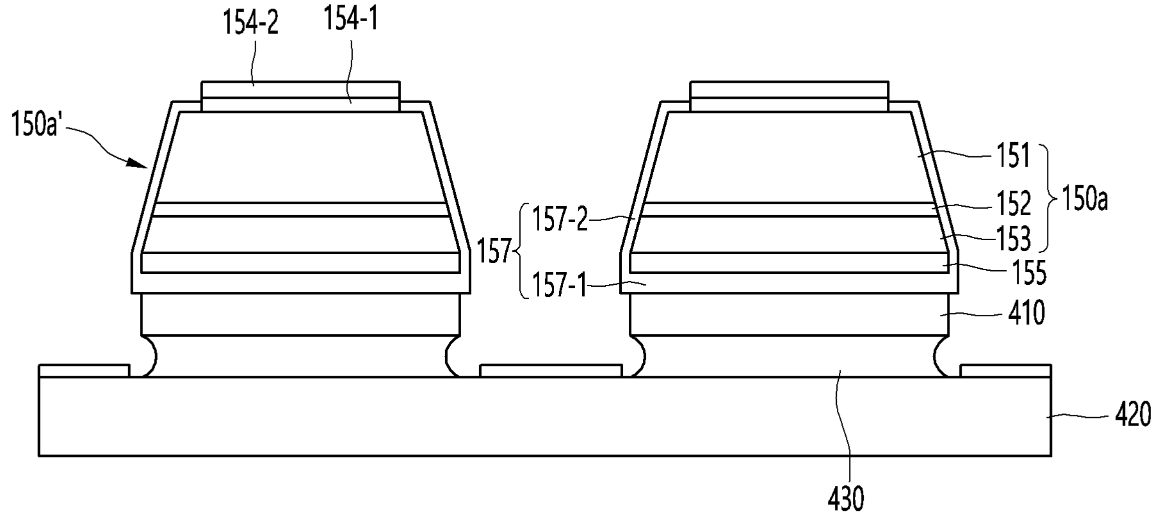

As shown in FIG. 24, a first conductive layer 154-1 and a second conductive layer 154-2 can be sequentially formed on the first conductive semiconductor layer 151. Specifically, a photoresist film is coated on the passivation layer 157 and then patterned to form a PR pattern, and an etching process is performed using the PR pattern as a mask to expose the first conductive semiconductor layer 151. The passivation layer 157, for example, the first passivation layer 157-1, can be removed.

Thereafter, after the first conductive layer 154-1 and the second conductive layer 154-2 are sequentially formed, a lift-off process is performed to remove the PR pattern, thereby forming a second conductive layer on the first conductive semiconductor layer 151. The first conductive layer 154-1 and the second conductive layer 154-2 can be formed in a pattern shape. Since the first conductive layer 154-1 and the second conductive layer 154-2 are formed using the same PR pattern, the size, area, diameter, shape, etc. of each of the first conductive layer 154-1 and the second conductive layer 154-2 can be the same, but is not limited thereto.

Figure 25:
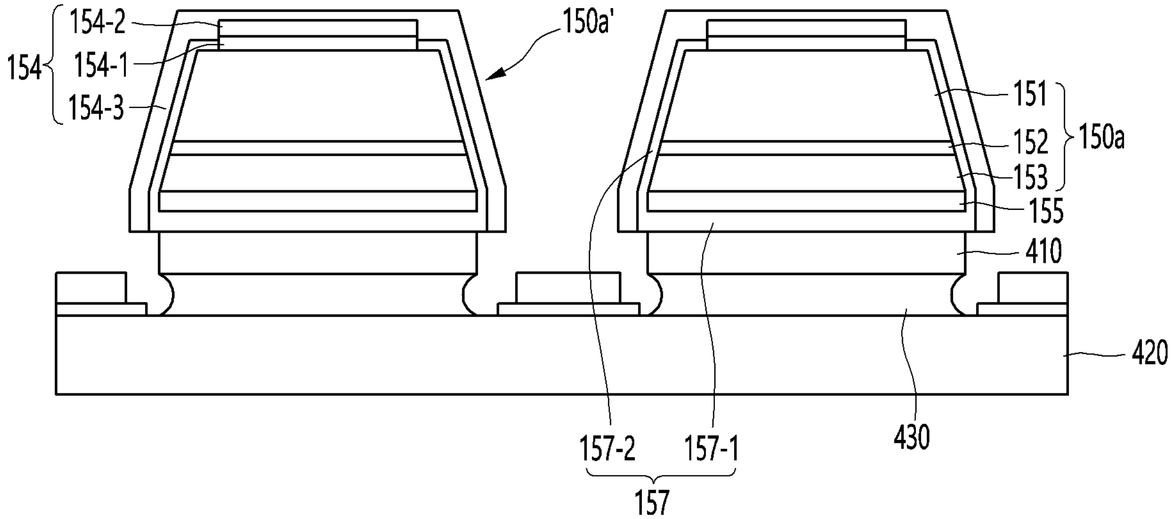

As shown in FIG. 25, a third conductive layer 154-3 can be formed to surround the light emitting layer 150*a*. Accordingly, the first electrode 154 can be composed of the first conductive layer 154-1, the second conductive layer 154-2, and the third conductive layer 154-3.

The third conductive layer 154-3 can be formed on the upper surface 150*a*2 of the light emitting layer 150*a*. The third conductive layer 154-3 can be formed along the circumference of the side surface 150*a*3 of the light emitting layer 150*a*.

The first conductive layer 154-1, the second conductive layer 154-2, and the third conductive layer 154-3 can each comprise metal, metal alloy, etc. For example, the first conductive layer 154-1 can comprise an ohmic contact layer including at least one selected from the group consisting of AuGe, PdGe, Au, and Ag. For example, the second conductive layer 154-2 can comprise a magnetic layer including at least one selected from the group consisting of Ti, Ni, and Fe. For example, the third conductive layer 154-3 can comprise a side contact layer including at least one selected from the group consisting of Ti, Ni, Mo, Cu, Au, Ag, and Al. The side contact layer can comprise at least one or more layer of an electrode layer, a magnetic layer, a reflective layer, a bonding layer, or a diffusion prevention layer.

Figure 26:
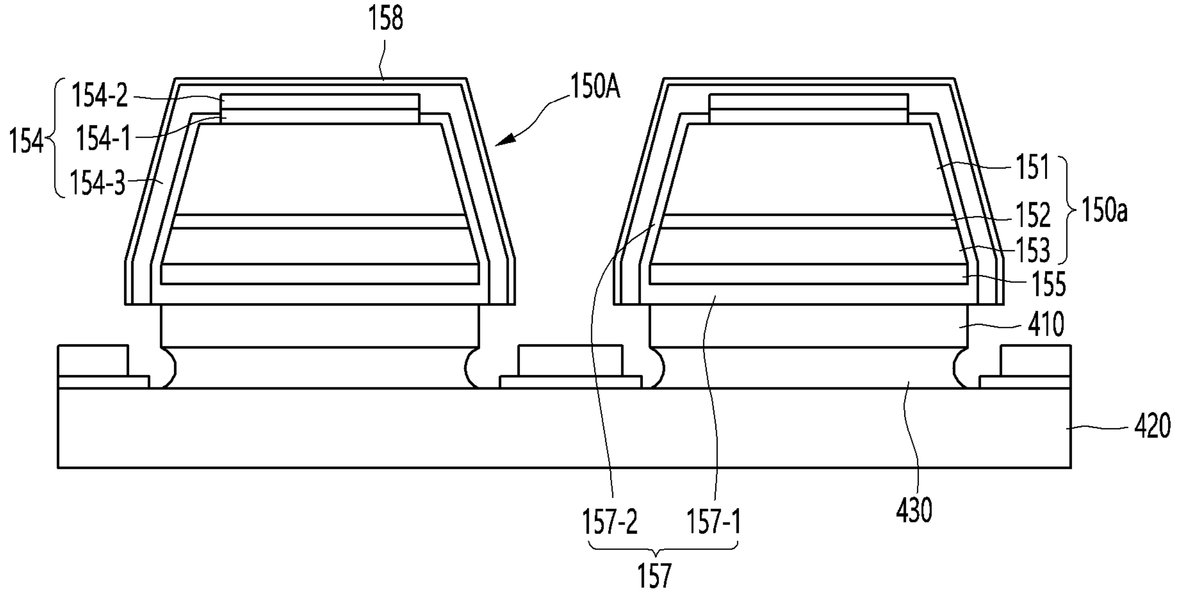

As shown in FIG. 26, a protective layer 158 can be formed on the first electrode 154. The protective layer 158 can be formed to surround the light emitting layer 150*a*. The protective layer 158 can be formed on the upper surface 150*a*2 of the light emitting layer 150*a*. The protective layer 158 can be formed along the circumference of the side surface 150*a*3 of the light emitting layer 150*a*. The protective layer 158 can comprise an inorganic material. The protective layer 158 can comprise the same or different inorganic material as the passivation layer 157.

Accordingly, a semiconductor light emitting device 150A composed of the light emitting layer 150*a*, the passivation layer 157, the first electrode 154, the second electrode 155, and the protective layer 158 can be manufactured. Each of the plurality of chips 150*a*' separated from each other can be manufactured as a semiconductor light emitting device 150A.

Figure 27:
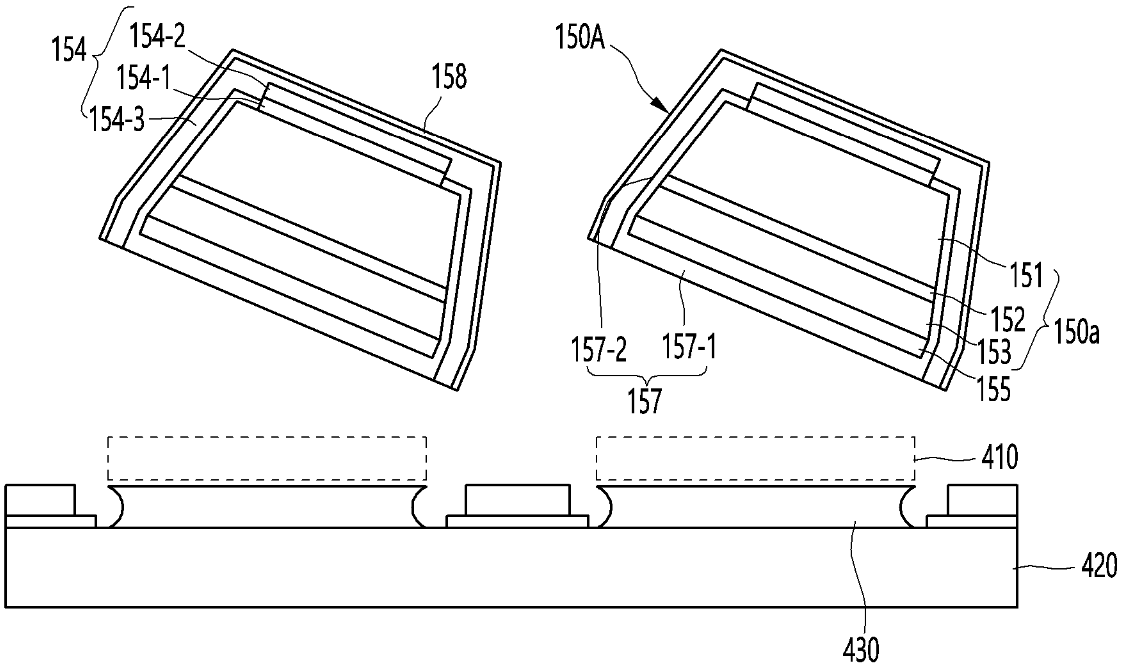

As shown in FIG. 27, the sacrificial layer 410 is removed using an etchant such that a plurality of semiconductor light emitting devices 150A can be separated from the temporary substrate 420.

Second Embodiment

Figure 28:
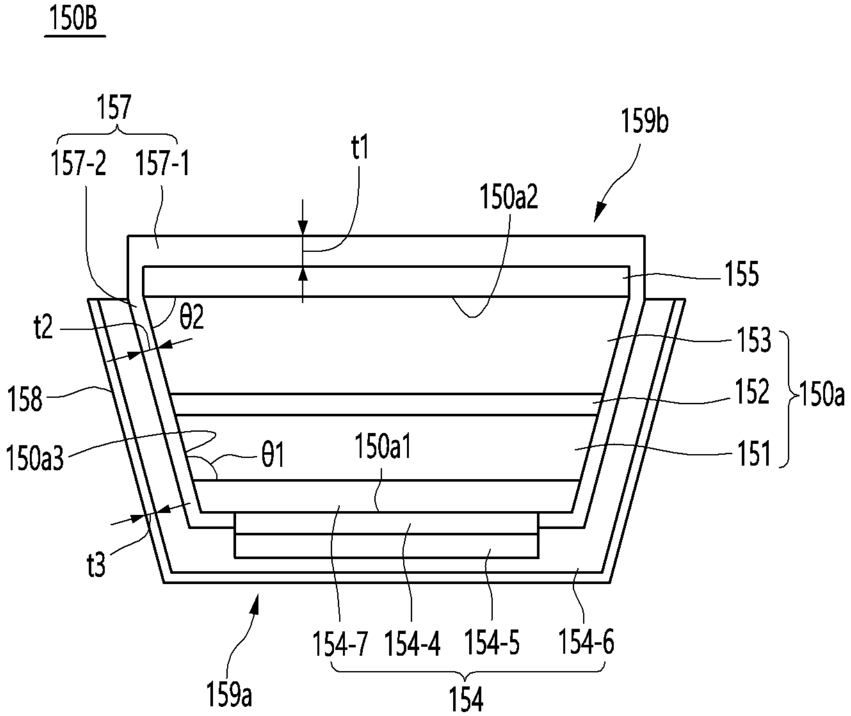
FIG. 28 is a cross-sectional view illustrating a semiconductor light emitting device according to a second embodiment.

FIG. 28 is a cross-sectional view showing a semiconductor light emitting device according to a second embodiment.

The second embodiment is the same as the first embodiment except for the third conductive layer 154-3 of the first electrode 154 and the protective layer 158. In the second embodiment, the same components as those in the first embodiment are given the same reference numerals and detailed descriptions are omitted.

Referring to FIG. 28, the semiconductor light emitting device 150B according to the second embodiment can comprise a light emitting layer 150*a*, a passivation layer 157, a protective layer 158, a first electrode 154, and a second electrode 155.

The inner angle θ1 between the side surface 150*a*3 and the lower surface 150*al* of the light emitting layer 150*a* can have an obtuse angle. The inner angle θ2 between the side surface 150*a*3 and the upper surface 150*a*2 of the light emitting layer 150*a* can have an acute angle. The light emitting layer 150*a* can have an inverted trapezoidal shape when viewed from the side. For example, the light emitting layer 150*a* can have an equilateral trapezoidal shape when viewed from the side, but is not limited thereto.

The first electrode 154 can surround the light emitting layer 150*a*, and the second electrode 155 can be disposed on the upper surface 150*a*2 of the light emitting layer 150*a*. The first electrode 154 can comprise a first conductive layer 154-4, a second conductive layer 154-5, and a third conductive layer 154-6. The first conductive layer 154-4, second conductive layer 154-5, and third conductive layer 154-6 can comprise metal. For example, the first conductive layer 154-4 can comprise a reflective layer including at least one selected from the group consisting of Ag, Au, and Al. The second conductive layer 154-5 can comprise a magnetic layer. The third conductive layer 154-6 as a side contact layer can extend from the lower surface 150*al* of the second conductive layer 154-5 to the side surface 150*a*3 of the light emitting layer 150*a*, and can be disposed along the circumference of the side surface 150*a*3 of the light emitting layer 150*a*. The side contact layer can comprise at least one or more layer of an electrode layer, a magnetic layer, a reflective layer, a bonding layer, and a diffusion prevention layer.

A part of the passivation layer 157, for example, the first passivation layer 157-1, can be disposed on the second electrode 155 and exposed to the outside. A part of the first electrode 154, for example, the third conductive layer 154-6, can be disposed on the lower surface 150*al* and the side surface 150*a*3 of the light emitting layer 150*a*. When the second process is performed and the semiconductor light emitting device 150B approaches the assembly hole 340H, a force pulling the first electrode 154 toward the assembly hole 340H can be generated in response to the DEP force. Additionally, Additionally, a force pushing away from the assembly hole 340H can be generated by the passivation layer 157 positioned on the opposite side of the first electrode 154, for example, the first passivation layer 157-1. Accordingly, the first electrode 154 can be aligned to face the bottom surface 340_B of the assembly hole 340H. Thereafter, the first electrode 154 is pulled to the bottom surface 340_B of the assembly hole 340H by the DEP force, so that the semiconductor light emitting device 150B can be in contact with the bottom surface 340_B of the assembly hole 340H or can be positioned adjacent to the bottom surface 340_B of the assembly hole 340H.

Meanwhile, the protective layer 158 can surround the first electrode 154. For example, the protective layer 158 can covers the first electrode 154, and the first electrode 154 may not be visible due to the protective layer 158 when viewed from the side. The protective layer 158 can have a shape corresponding to the shape of the first electrode 154. The protective layer 158 can have a shape corresponding to the shape of the third conductivity type semiconductor layer of the first electrode 154.

When the first process is performed, chain defects or lump defects between the semiconductor light emitting devices 150B can be prevented by the protective layer 158.

In the case where the first electrode 154 is exposed to the outside because the protective layer 158 is not provided, or the protective layer 158 and the first electrode 154 are not provided, the first conductive semiconductor layer 151 of the light emitting layer 150*a* can be exposed to the outside. In this way, when the semiconductor light emitting devices 150B including the first electrode 154 or the first conductive semiconductor layer 151 exposed to the outside are moved toward the magnet 500 through the first process, the semiconductor light emitting devices 150B can stick together, causing chain defects or lump defects.

To solve this problem, in an embodiment, the protective layer 158 can be disposed to surround the first electrode 154. Therefore, chain defects or lump defects can be prevented by the protective layer 158 surrounding the first electrode 154.

Meanwhile, since the protective layer 158 has a dielectric constant, a pushing force is applied to the DEP force, and since the protective layer 158 surrounds the first electrode 154, a pulling force is not applied to the DEP force. In this case, the semiconductor light emitting device 150B may not be pulled into the assembly hole 340H and may not be assembled, resulting in occurring assembly defects and lighting defects.

To solve this problem, in an embodiment, the protective layer 158 can have a very thin thickness t3. For example, the protective layer 158 can have a thickness t3 of 1/0 or less of the thickness t1 of the first passivation layer 157-1. Accordingly, the DEP force passes through the protective layer 158 and affects the first electrode 154, and a force is generated to pull the first electrode 154 to the assembly hole 340H in response to the DEP force such that the semiconductor light emitting device 150B can be assembled in the assembly hole 340H. Thus, assembly defects and lighting defects can be prevented.

Meanwhile, in an embodiment, a part of the second passivation layer 157-2 of the passivation layer 157 can be exposed to the outside.

For example, the end of the third conductive layer 154-6 of the first electrode 154 can be positioned lower than the upper surface 150*a*2 of the first passivation layer 157-1 of the passivation layer 157. The end of the protective layer 158 can be positioned lower than the upper surface 150*a*2 of the first passivation layer 157-1 of the passivation layer 157. The end of the third conductive layer 154-6 of the first electrode 154 and the upper surface 150*a*2 of the light emitting layer 150*a* can be positioned on the same horizontal line. The end of the protective layer 158 and the upper surface 150*a*2 of the light emitting layer 150*a* can be positioned on the same horizontal line. The end of the protective layer 158 and the end of the third conductive layer 154-6 of the first electrode 154 can be positioned on the same horizontal line. Accordingly, the second passivation layer 157-2 of the passivation layer 157 disposed on the side surface 150*a*3 of the first electrode 154 can be exposed to the outside.

The end of the third conductive layer 154-6 of the first electrode 154 is positioned lower than the upper surface 150*a*2 of the first passivation layer 157-1 of the passivation layer 157 such that when the second passivation layer 157-2 disposed on the side surface 150*a*3 of the first electrode 154 is exposed to the outside, a recess 156 can be formed by the end of the third conductive layer 154-6 of the first electrode 154, the end of the protective layer 158, and the exposed second passivation layer 157-2. The recess 156 can be formed along the circumference of the side surface 150*a*3 of the light emitting layer 150*a*.

As will be explained later, when the electrode wiring 360 is disposed in the recess 156 and electrically connected to the third conductive layer 154-6 of the first electrode 154, the contact area between the electrode wiring 360 and the semiconductor light emitting device 150B can be increased by the recess 156, thereby strengthening the fixation of the electrode wiring 360.

Meanwhile, the light emitting layer 150*a* can comprise a plurality of semiconductor layers. The light emitting layer 150*a* can comprise at least one or more first conductivity type semiconductor layer 151, an active layer 152, and at least one or more second conductivity type semiconductor layer 153. The first conductive semiconductor layer 151 can comprise an n-type dopant, and the second conductive semiconductor layer 153 can comprise a p-type dopant. The active layer 152 can be disposed under the first conductive semiconductor layer 151, and the second conductive semiconductor layer 153 can be disposed under the active layer 152.

The arrangement structure between these semiconductor layers is different from the first embodiment. For example, in the first embodiment, the first conductive semiconductor layer 151 can be disposed below the active layer 152, while in the second embodiment, the first conductive semiconductor layer 151 can be disposed on the active layer 152. In the first embodiment, the second conductive semiconductor layer 153 can be disposed on the active layer 152, while in the second embodiment, the second conductive semiconductor layer 153 can be disposed under the active layer 152.

In the first embodiment, since the second conductive semiconductor layer 153 is a p-type semiconductor layer containing a p-type dopant, current injection is difficult. Thus, to obtain a current spreading effect, a transparent conductive layer as the second electrode 155 can be disposed on the upper surface 150*a*2 of the second conductive semiconductor layer 153.

In the second embodiment as well, since the second conductive semiconductor layer 153 is disposed below the active layer 152, the fourth conductive layer 154-7 can be disposed on the lower surface 150*al* of the second conductive semiconductor layer 153. The fourth conductive layer 154-7 is a transparent conductive layer and can comprise ITO, IZO, etc. The fourth conductive layer 154-7 can be included in the first electrode 154, but is not limited thereto.

Since the fourth conductive layer 154-7 is transparent, light generated in the light emitting layer 150*a* can be emitted to the outside through the fourth conductive layer 154-7. In the top emission method, light from the light emitting layer 150*a* can be emitted forward through the second electrode 155. Therefore, as the first conductive layer 154-4 can be disposed below the fourth conductive layer 154-7, light passing through the fourth conductive layer 154-7 can be reflected by the first conductive layer 154-4. As the reflected light is emitted forward through the second electrode 155, light efficiency and luminance can be improved.

Meanwhile, when the size of the first conductive layer 154-4 is smaller than the size of the fourth conductive layer 154-7, the third conductive layer 154-6 can also serve as a reflective layer. Thus, light passing through the fourth conductive layer 154-7 can be reflected by the third conductive layer 154-6. As the reflected light is emitted forward through the second electrode 155, light efficiency and luminance can be improved.

The third conductive layer 154-6 can comprise a plurality of layers, and the plurality of layers can comprise an electrode layer, a magnetic layer, a reflective layer, a bonding layer, and a diffusion prevention layer.

Meanwhile, the first embodiment (FIG. 13) can be a red semiconductor light emitting device 150B, and the second embodiment (FIG. 28) can be a green semiconductor light emitting device 150B or a blue semiconductor light emitting device 150B, but is not limited thereto.

FIGS. 29 to 41 illustrate the manufacturing process of the semiconductor light emitting device according to the second embodiment.

Figure 29:
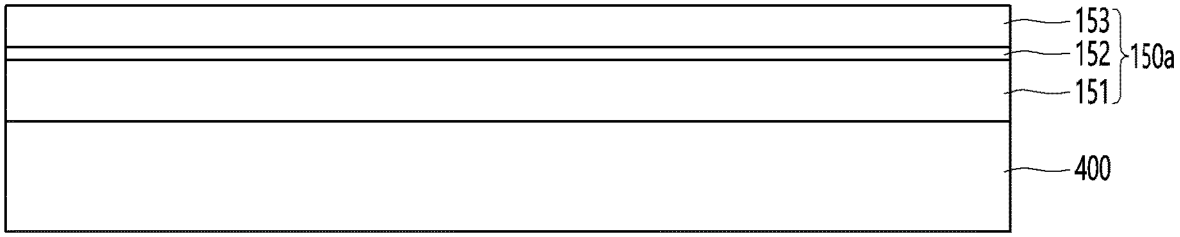
FIGS. 29 to 41 illustrate the manufacturing process of the semiconductor light emitting device according to the second embodiment.

FIG. 29 is the same as FIG. 17. A light emitting layer 150*a* can be deposited on the growth substrate 400. The light emitting layer 150*a* can comprise at least one or more first conductive semiconductor layer 151, an active layer 152 on the first conductive semiconductor layer 151, and at least one second or more conductive semiconductor layer 153 on the active layer 152.

Figure 30:
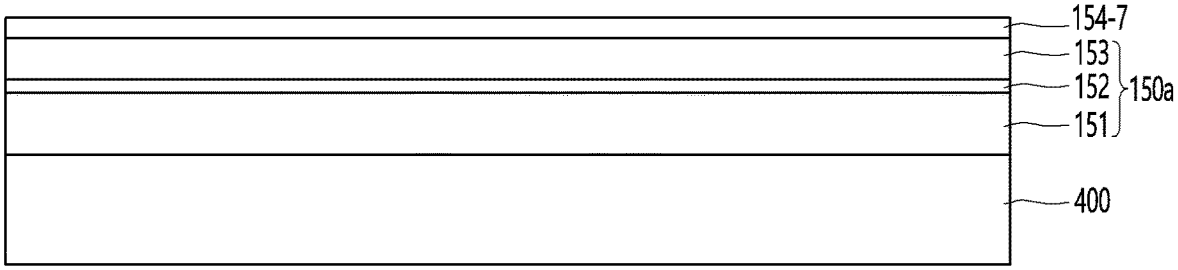

As shown in FIG. 30, a fourth conductive layer 154-7 can be formed on the upper surface 150*a*2 of the light emitting layer 150*a*.

Figure 31:
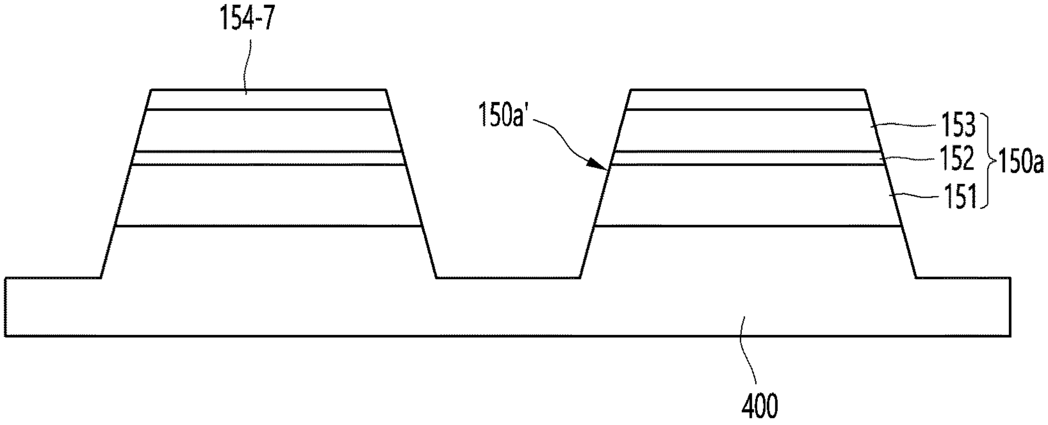

As shown in FIG. 31, the fourth conductive layer 154-7 and the light emitting layer 150*a* are sequentially etched through an etching process such that forming a plurality of chips 150*a*' spaced apart from each other can be formed. At this time, a part of the upper surface 150*a*2 of the growth substrate 400 can also be removed.

Figure 32:
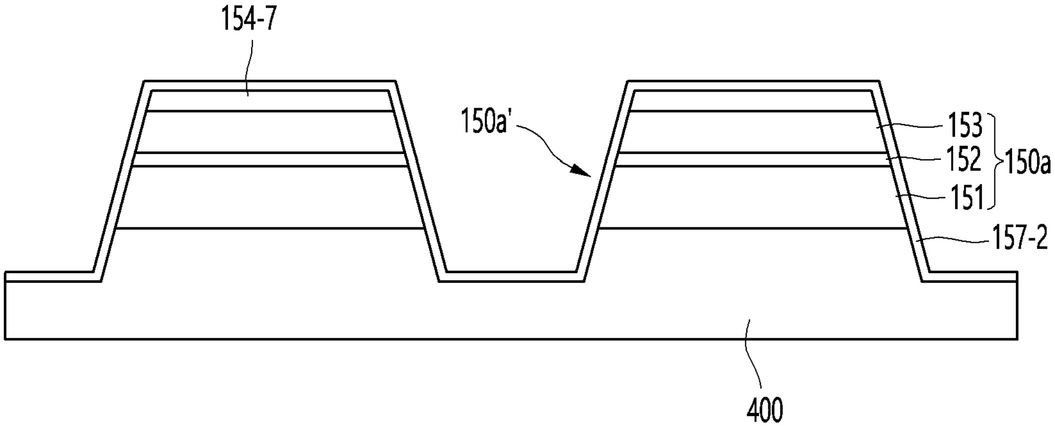

As shown in FIG. 32, a second passivation layer 157-2 can be formed on the growth substrate 400. The second passivation layer 157-2 can surround each of the plurality of chips 150*a*'.

Figure 33:
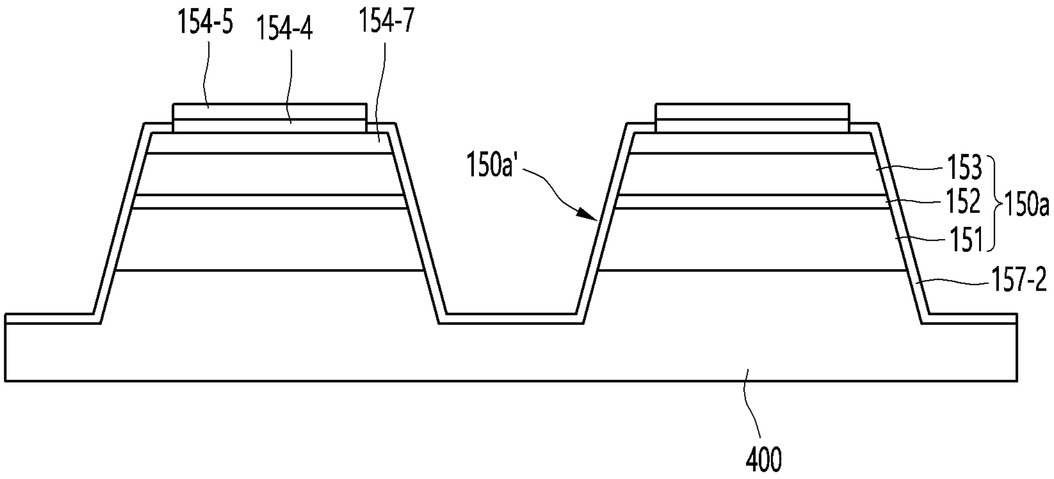

As shown in FIG. 33, a first conductive layer 154-4 and a second conductive layer 154-5 can be sequentially formed on the fourth conductive layer 154-7.

Specifically, a photoresist film can be coated on the second passivation layer 157-2 and then patterned to form a PR pattern, and an etching process can be performed using the PR pattern as a mask to remove the second passivation layer 157-2. Thus, the fourth conductive layer 154-7 can be exposed.

Thereafter, after the first conductive layer 154-4 and the second conductive layer 154-5 are sequentially formed, a lift-off process is performed to remove the PR pattern such that the first conductive layer 154-4 and the second conductive layer 154-5 can be formed in a pattern on the fourth conductive layer 154-7. Since the first conductive layer 154-4 and the second conductive layer 154-5 are formed using the same PR pattern, the size, area, diameter, shape, etc. of each of the first conductive layer 154-4 and the second conductive layer 154-5 can be the same, but is not limited thereto.

Figure 34:
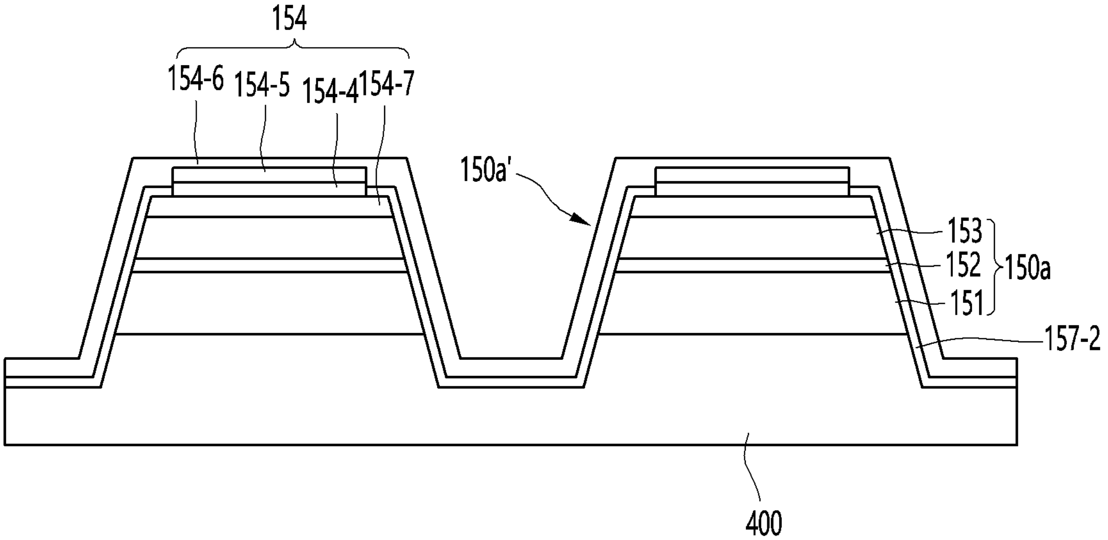

As shown in FIG. 34, the third conductive layer 154-6 can be formed to surround the light emitting layer 150*a*. Accordingly, the first electrode 154 can be composed of the first conductive layer 154-4, the second conductive layer 154-5, the third conductive layer 154-6, and the fourth conductive layer 154-7.

The third conductive layer 154-6 can be formed on the upper surface 150*a*2 of the light emitting layer 150*a*. The third conductive layer 154-6 can be formed along the circumference of the side surface 150*a*3 of the light emitting layer 150*a*.

The first conductive layer 154-4, the second conductive layer 154-5, and the third conductive layer 154-6 can each comprise metal, metal alloy, etc. For example, the first conductive layer 154-4 can comprise an ohmic contact layer including at least one selected from the group consisting of AuGe, PdGe, Au, and Ag. For example, the second conductive layer 154-5 can comprise a magnetic layer including at least one selected from the group consisting of Ti, Ni, and Fe. For example, the third conductive layer 154-6 can comprise a side contact layer including at least one selected from the group consisting of Ti, Ni, Mo, Cu, Au, Ag, and Al. The side contact layer can comprise at least one or more layer of an electrode layer, a magnetic layer, a reflective layer, a bonding layer, and a diffusion prevention layer.

Figure 35:
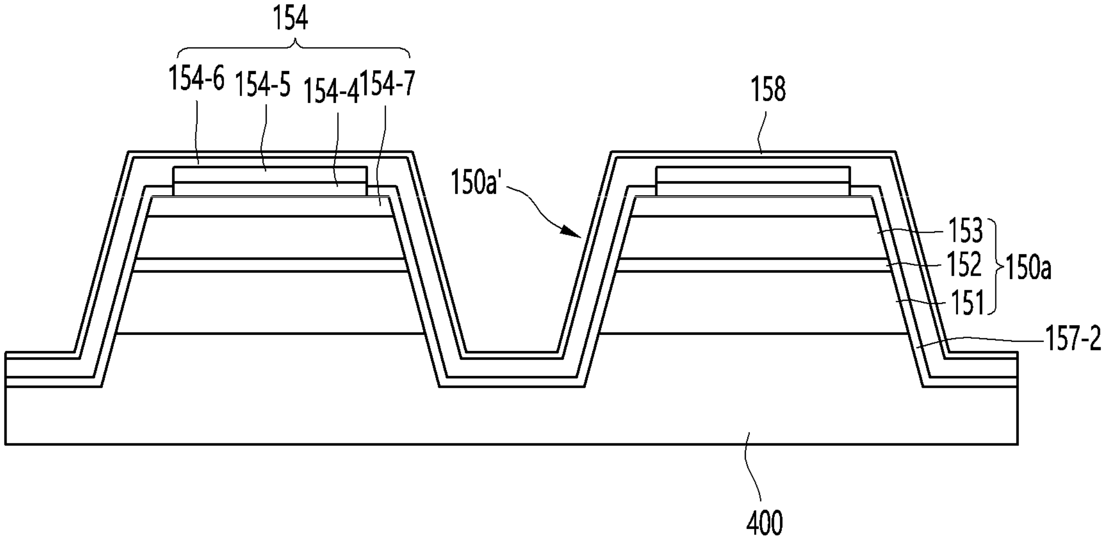

As shown in FIG. 35, a protective layer 158 can be formed on the growth substrate 400. The protective layer 158 can be formed on the third conductive layer 154-6 of the first electrode 154. The protective layer 158 can be formed to surround the light emitting layer 150*a*. The protective layer 158 can be formed on the upper surface 150*a*2 of the light emitting layer 150*a*. The protective layer 158 can be formed along the circumference of the side surface 150*a*3 of the light emitting layer 150*a*. The protective layer 158 can comprise an inorganic material. The protective layer 158 can comprise the same or different inorganic material as the passivation layer 157.

Figure 36:
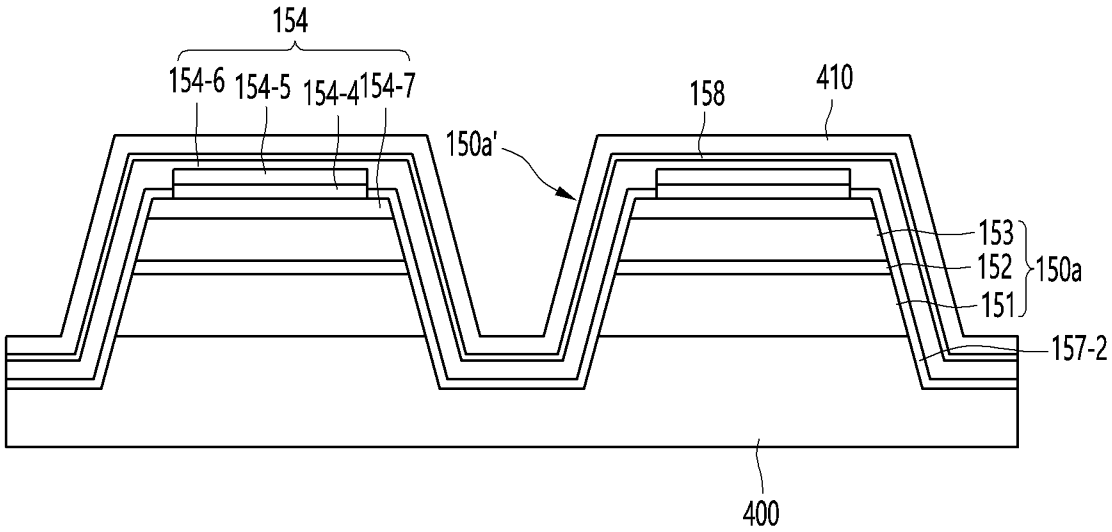

As shown in FIG. 36, a sacrificial layer 410 can be formed on a temporary substrate 420. The sacrificial layer 410 can comprise a metal such as Al.

Figure 37:
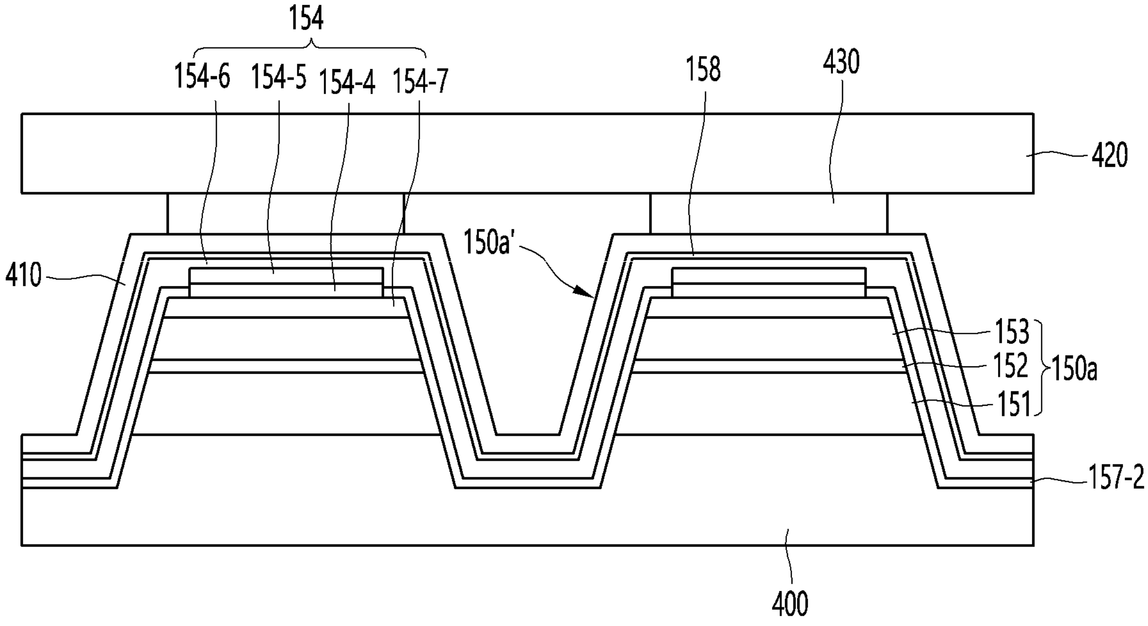

As shown in FIG. 37, the temporary substrate 420 can be attached to the sacrificial layer 410 using the bonding layer 430. The bonding layer 430 can be formed of a resin material such as BCB, for example. The temporary substrate 420 can be formed of sapphire, but is not limited thereto.

Figure 38:
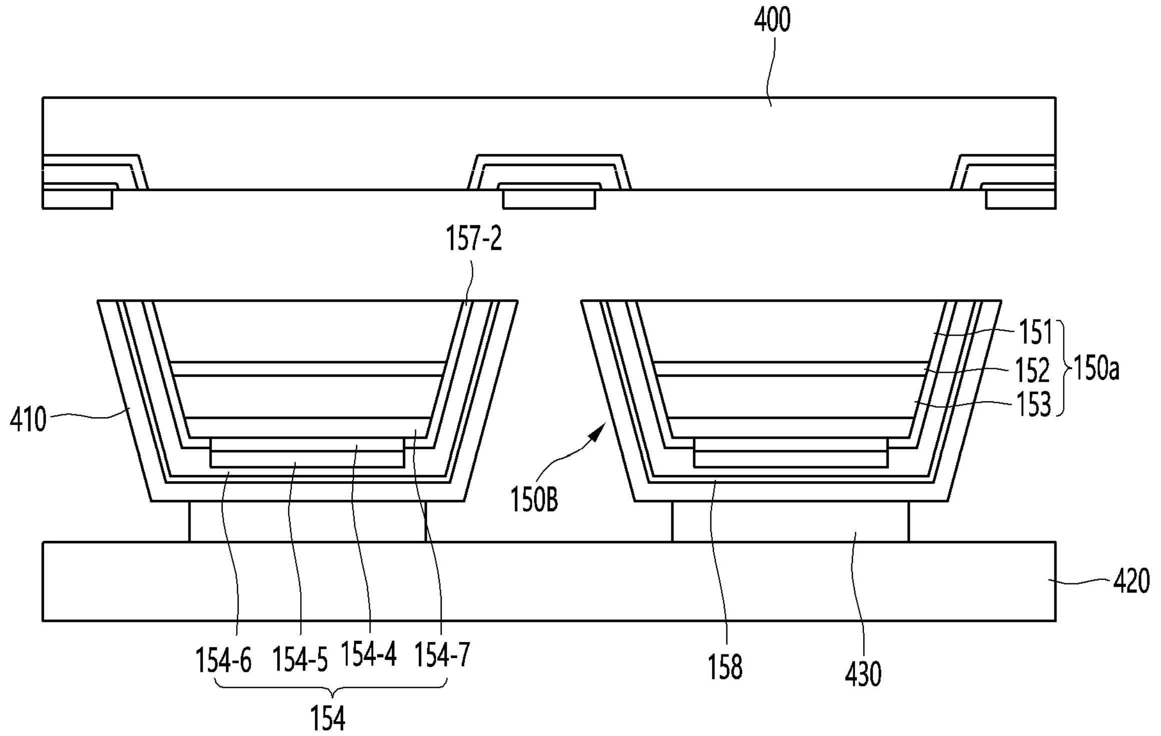

As shown in FIG. 38, after the growth substrate 400 is turned over to face upward, the growth substrate 400 can be removed through an LLO process. The growth substrate 400 can be removed without the growth substrate 400 being turned over.

By removing the growth substrate 400, a part of the light emitting layer 150*a*, for example, the first conductivity type semiconductor layer 151, can be exposed to the outside. To facilitate the growth of the light emitting layer 150*a*, an undoped layer can be formed on the growth substrate 400 before the light emitting layer 150*a* is deposited. In this case, after the growth substrate 400 is removed, the undoped layer can be removed using an etching process to expose the first conductive semiconductor layer 151.

Figure 39:
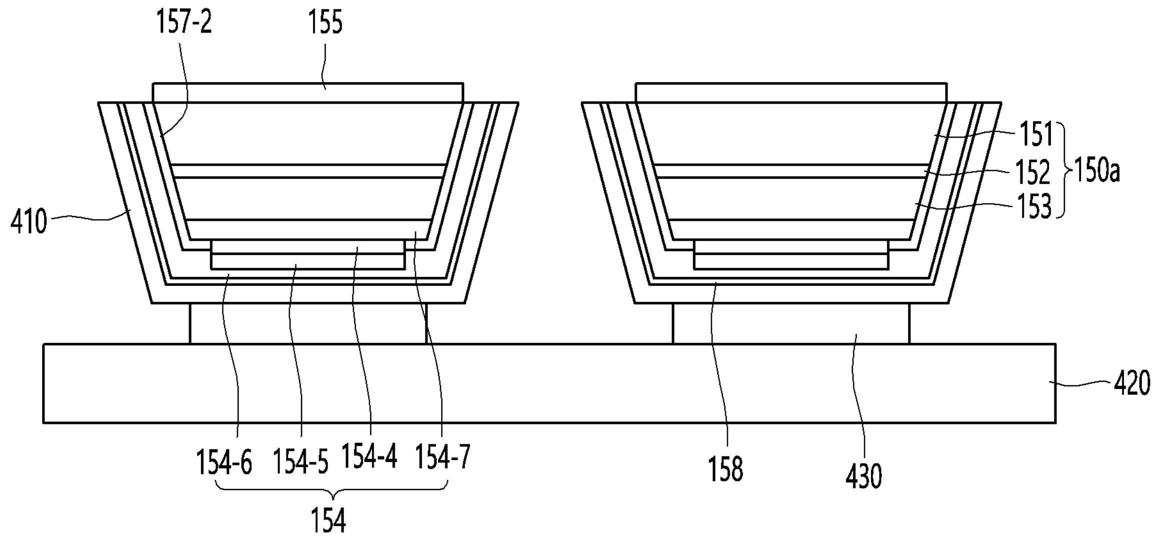

As shown in FIG. 39, a second electrode 155 can be formed on the exposed first conductive semiconductor layer 151. The second electrode 155 can comprise a transparent conductive layer including ITO, IZO, etc.

Figure 40:
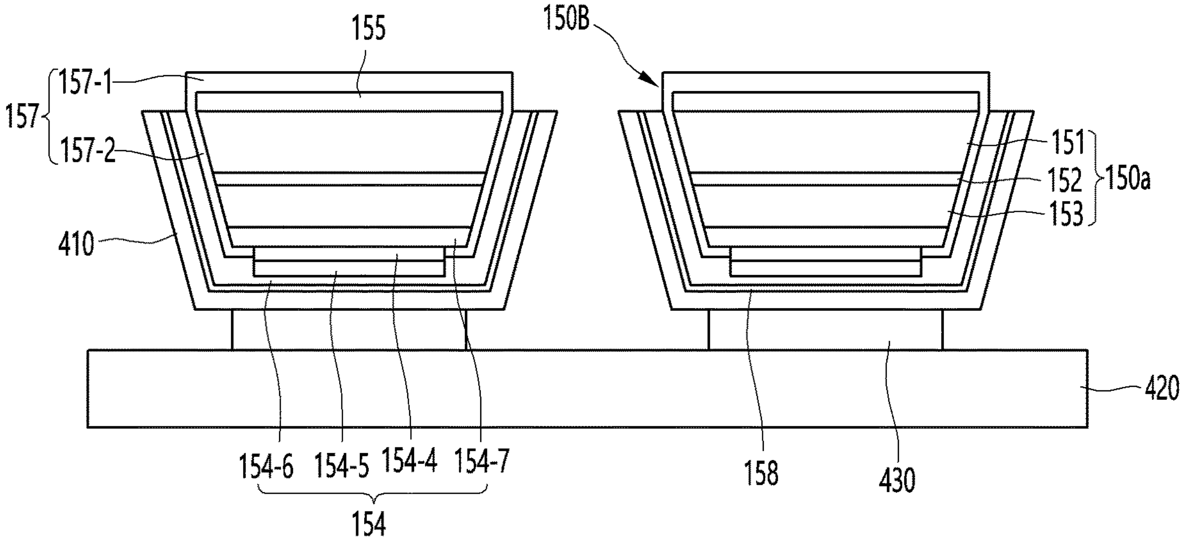

As shown in FIG. 40, the first passivation layer 157-1 can be formed on the second electrode 155. The first passivation layer 157-1 and the second passivation layer 157-2 can comprise the same or different inorganic materials. When the first passivation layer 157-1 and the second passivation layer 157-2 comprise the same inorganic material, the first passivation layer 157-1 and the second passivation layer 157-2 can be formed integrally by forming the first passivation layer 157-1. The second passivation layer 157-2 can be formed integrally. The passivation layer 157 can be composed of the first passivation layer 157-1 and the second passivation layer 157-2.

Accordingly, a semiconductor light emitting device 150B composed of the light emitting layer 150*a*, the passivation layer 157, the first electrode 154, the second electrode 155, and the protective layer 158 can be manufactured.

Figure 41:
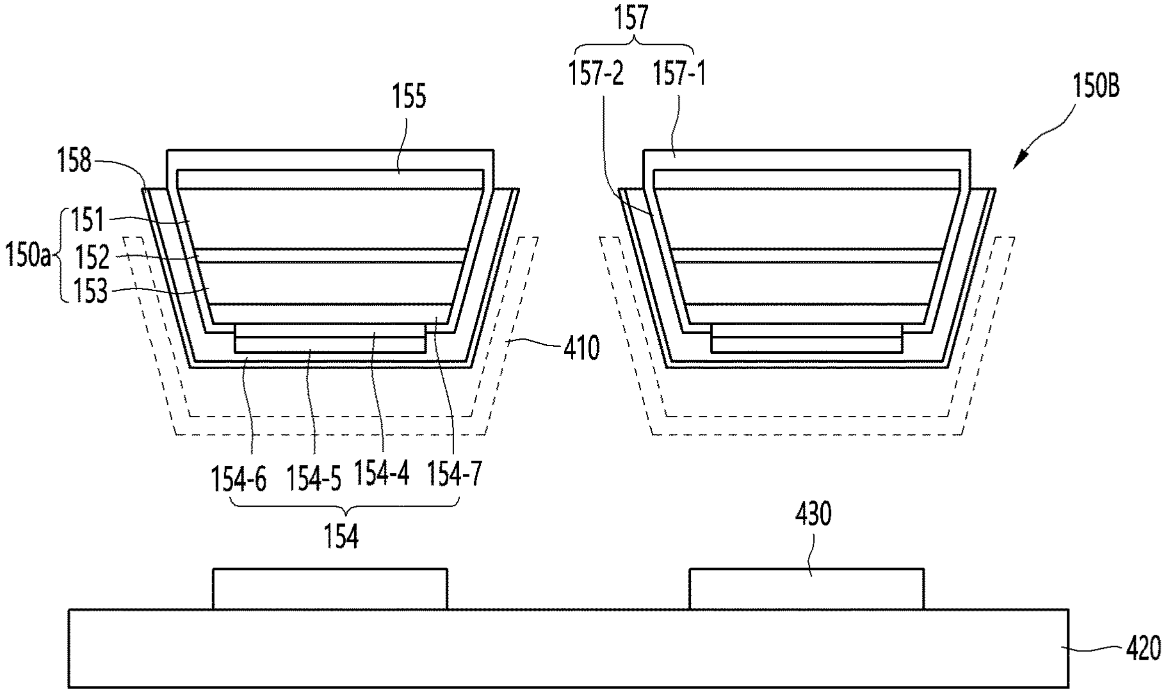

As shown in FIG. 41, the sacrificial layer 410 is removed using an etchant such that a plurality of semiconductor light emitting devices 150B can be separated from the temporary substrate 420.

Figure 42:
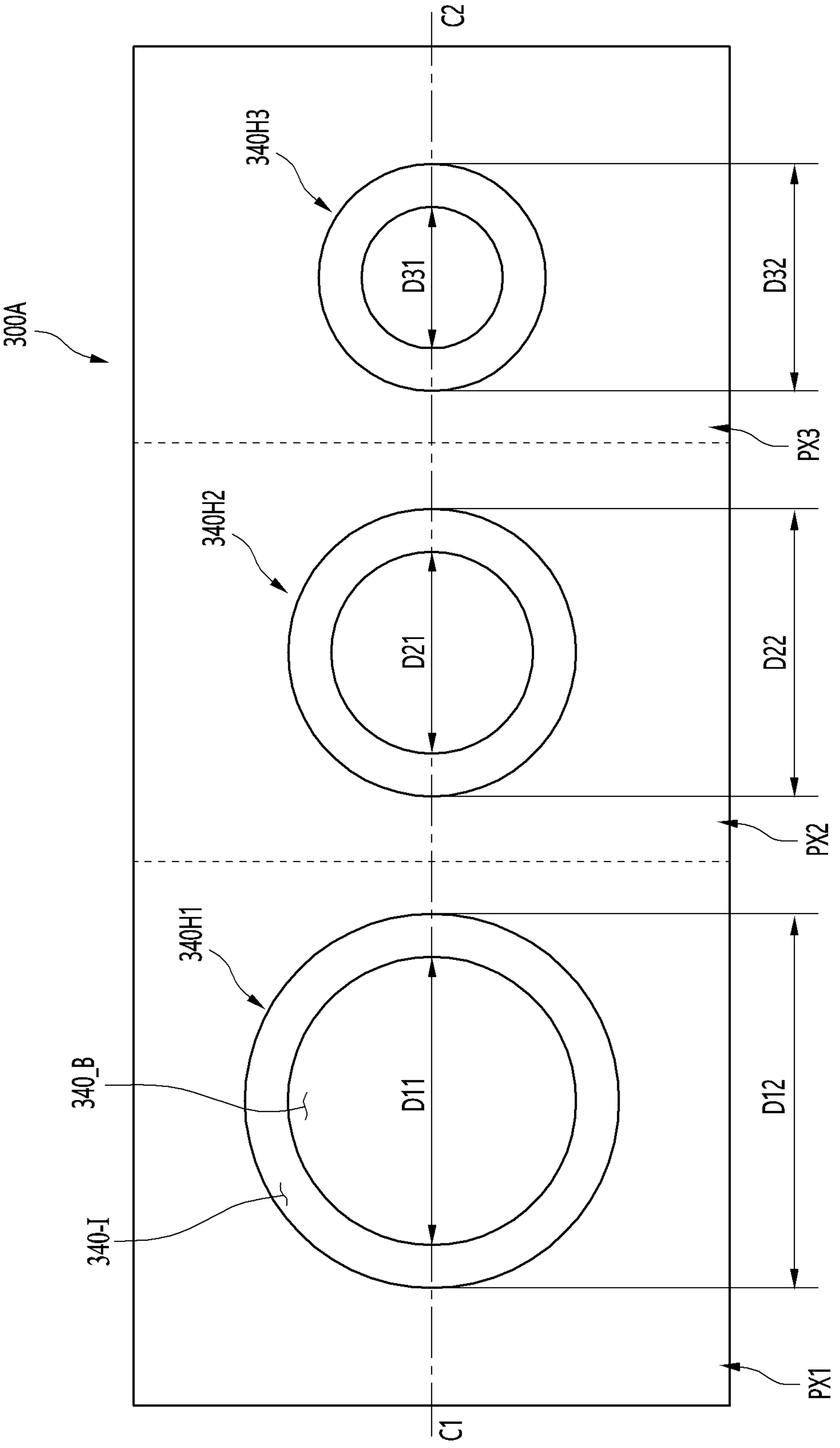
FIG. 42 is a plan view illustrating a backplane substrate according to a first embodiment.
Figure 43:
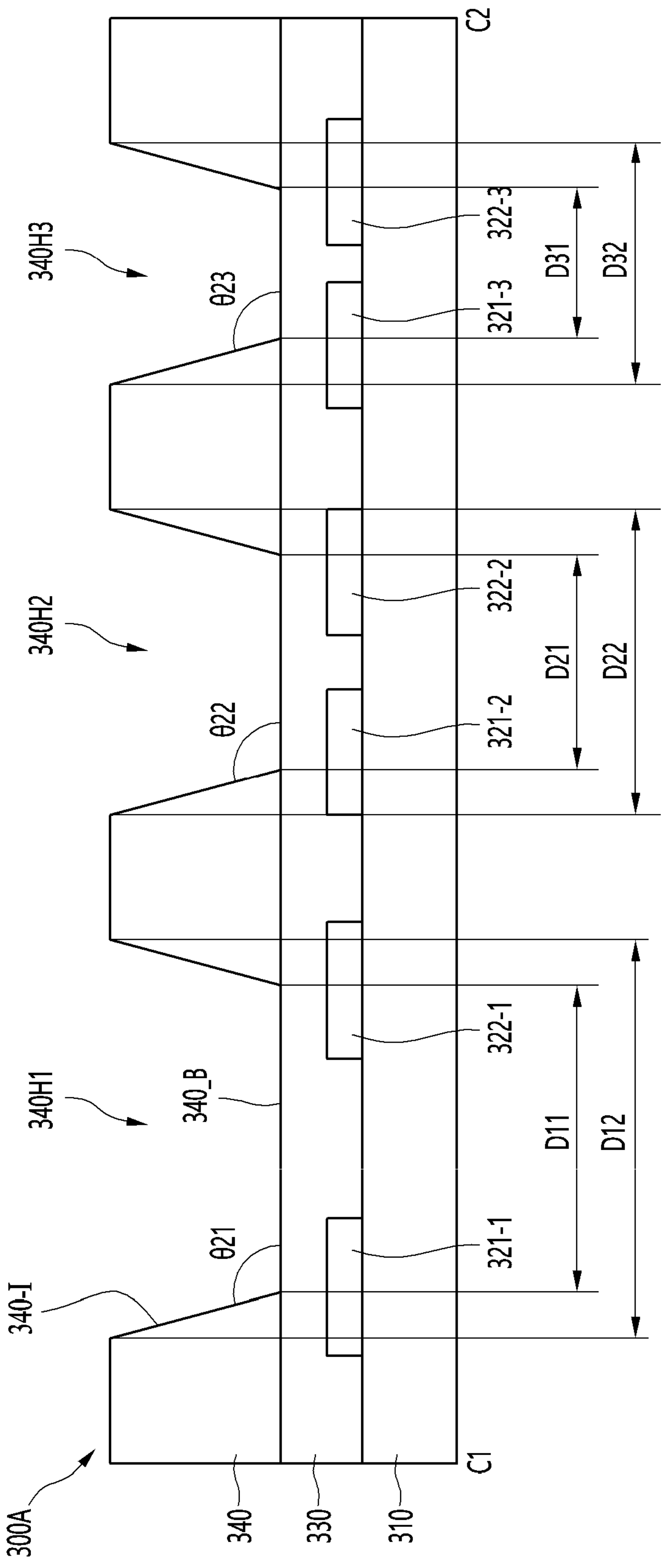
FIG. 43 is a cross-sectional view illustrating a backplane substrate according to the first embodiment.

FIG. 42 is a plan view showing a backplane substrate according to a first embodiment. FIG. 43 is a cross-sectional view showing a backplane substrate according to the first embodiment.

Referring to FIGS. 42 and 43, the backplane substrate 300A according to the first embodiment includes a substrate 310, a plurality of first assembly wirings 321, and a plurality of second assembly wirings 322 including 322-1 and 322-2 and 322-3, an insulating layer 330 and a barrier rib 340.

The backplane substrate 300A according to the first embodiment can be a substrate for manufacturing a display device and can be called a lower substrate. A display device can be manufactured by disposing a plurality of semiconductor light emitting devices that emit light of different colors and electrically connecting each of these semiconductor light emitting devices on the backplane substrate 300A. After electrical connections are completed, an upper substrate or encapsulant can be disposed.

The substrate 310 can be a member that accommodates and supports various components disposed on the substrate 310, and can comprise a rigid substrate or a flexible substrate. For example, the substrate 310 can be a material with excellent properties such as durability, heat resistance, and insulation, and can comprise for example, plastic material, resin material, glass, ceramic material, aluminum alloy, carbon alloy, etc.

A plurality of pixels PX can be defined on the substrate 310, and each of the plurality of pixels PX can comprise a plurality of sub-pixels PX. The pixel PX can be the minimum unit for displaying an image by implementing full color.

The pixel PX can comprise the first sub-pixel PX1, the second sub-pixel PX2, and the third sub-pixel PX3, but can comprise more sub-pixels PX. A first semiconductor light emitting device that emits a first color light can be disposed on the first sub-pixel PX1, and a second semiconductor light emitting device that emits a second color light can be disposed on the second sub-pixel PX2, and a third semiconductor light emitting device that emits a third color light can be disposed on the third sub-pixel PX3. For example, the first semiconductor light emitting device can be a red semiconductor light emitting device that emits red light, the second semiconductor light emitting device can be a green semiconductor light emitting device that emits green light, and the third semiconductor light emitting device can be a blue semiconductor light emitting device that emits blue light, but is not limited thereto.

In the drawing, the areas of the first sub-pixel PX1, the second sub-pixel PX2, and the third sub-pixel PX3 can be different, but can be the same.

The first sub-pixel PX1, the second sub-pixel PX2, and the third sub-pixel PX3 can each be connected to the first assembly wiring 321-1 to 321-3 and the second assembly wiring 322-1 to 322-3. For example, a pair of assembly wirings can be disposed in each of the first sub-pixel PX1, the second sub-pixel PX2, and the third sub-pixel PX3. An alternating voltage can be applied to the first assembly wiring 321-1 to 321-3 and the second assembly wiring 322-1 to 322-3 to form a DEP force.

The insulating layer 330 can be disposed on the substrate 310. The insulating layer 330 can comprise an inorganic material. When the backplane substrate 300A is put into a fluid for self-assembly, it is possible to prevent the first assembly wiring 321-1 to 321-3 and the second assembly wiring 322-1 to 322-3 from being exposed to fluid. The insulating layer 330 can have a dielectric constant and can contribute to the formation of DEP force.

The barrier rib 340 can be disposed on the insulating layer 330. The barrier rib 340 can comprise a plurality of assembly holes 340H1 to 340H3. The assembly holes 340H1 to 340H3 can be sites where at least one or more semiconductor light emitting device is assembled. The assembly holes 340H1 to 340H3 can guide the assembly of a preset semiconductor light emitting device among a plurality of semiconductor light emitting devices moving in a fluid during self-assembly and prevent the assembled semiconductor light emitting device from being separated. The assembly holes 340H1 to 340H3 can be formed by patterning the barrier rib 340. The barrier rib 340 can comprise an organic material and can be easily patterned through wet etching.

In an embodiment, the assembly holes 340H1 to 340H3 can have a corresponding shape of the semiconductor light emitting device to be assembled into the assembly holes 340H1 to 340H3. The first assembly hole 340H1 formed in the first sub-pixel PX1 can have a shape corresponding to the shape of the first semiconductor light emitting device. The second assembly hole 340H2 formed in the second sub-pixel PX2 can have a shape corresponding to the shape of the second semiconductor light emitting device. The third assembly hole 340H3 formed in the third sub-pixel PX3 can have a shape corresponding to the shape of the third semiconductor light emitting device.

As described above, in the semiconductor light emitting devices 150A and 150B according to the first and second embodiments, the inner angle θ1 between the side surface 150*a*3 and the lower surface 150*al* of the light emitting layer 150*a* can have an inverted trapezoid with an obtuse angle. Thus, the assembly holes 340H1 to 340H3 can also have shapes corresponding to the shapes of the semiconductor light emitting devices 150A and 150B, respectively. The second inner angles θ21, θ22 and θ23 between the inner side surfaces 340_I and the bottom surface 340_B of the assembly holes 340H1 to 340H3 can have obtuse angles. The bottom surface 340_B can be the upper surface 150*a*2 of the insulating layer 330.

The first inner angles θ11, θ12 and θ13 between the side surfaces 150*a*3 and the lower surfaces 150*al* of the light emitting layers 150*a* of the semiconductor light emitting devices and the second inner angles θ21, θ22 and θ23 between the side surfaces 340_I and the bottom surfaces 340_B of the assembly holes 340H1 to 340H3 can each have an obtuse angle.

As an example, the first inner angles θ11, θ12 and θ13 and the second inner angles θ21, θ22 and θ23 can be equal to each other. As another example, the first inner angles θ11, θ12 and θ13 and the second inner angles θ21, θ22 and θ23 can be different from each other.

As another example, the second inner angles θ21, θ22 and θ23 can be within ±10° with respect to the first inner angles θ11, θ12, and θ13. For example, the second inner angles θ21, θ22 and θ23 can be smaller than the first inner angles θ11, θ12, and θ13 by within −10°. The second inner angles θ21, θ22 and θ23 can be greater than the first inner angles θ11, θ12, and θ13 by within ±10°. For example, when the first inner angles θ11, θ12 and θ13 are 160°, the second inner angles θ21, θ22 and θ23 can be 150° to 170°.

Meanwhile, the second inner angles θ21, θ22 and θ23 can be the same in the first assembly hole 340H1, the second assembly hole 340H2, and the third assembly hole 340H3. In this case, the first semiconductor light emitting device, the second semiconductor light emitting device, and the third semiconductor light emitting device can have the same shape. The first semiconductor light emitting device, the second semiconductor light emitting device, and the third semiconductor light emitting device can have different sizes, but are not limited thereto.

The second inner angles θ21, θ22 and θ23 can be different in the first assembly hole 340H1, the second assembly hole 340H2, and the third assembly hole 340H3. For example, the second inner angles θ21, θ22 and θ23 in the first assembly hole 340H1 can be the largest, and the second inner angles θ21, θ22 and θ23 in the second assembly hole 340H2 can be large to next. The second inner angles θ21, θ22 and θ23 in the third assembly hole 340H3 can be the smallest.

In the embodiment, the first assembly hole 340H1, the second assembly hole 340H2, and the third assembly hole 340H3 can each have minimum diameters D11, D21 and D31 defined on the lower side, for example, the bottom surface 340_B and can each have maximum diameters D12, D22 and D32 defined on the upper side. In this case, the minimum diameters D11, D21 and D31 and/or the maximum diameters D12, D22 and D32 can be different from each other in the first assembly hole 340H1, the second assembly hole 340H2, and the third assembly hole 340H3.

Referring to FIGS. 42 and 43, the minimum diameters D11, D21 and D31 and/or maximum diameters D12, D22 and D32 of each of the first assembly hole 340H1, the second assembly hole 340H2, and the third assembly hole 340H3 can be different, but are not limited thereto. The maximum diameter D12 of the first assembly hole 340H1 can be the largest, the maximum diameter D22 of the second assembly hole 340H2 can be large to next, and the maximum diameter D32 of the third assembly hole 340H3 can be the smallest. The minimum diameter D11 of the first assembly hole 340H1 can be the largest, the minimum diameter D21 of the second assembly hole 340H2 can be large to next, and the minimum diameter D31 of the third assembly hole 340H3 can be the smallest.

Referring to FIGS. 42 and 43, the second inner angles θ21, θ22 and θ23 of each of the first assembly hole 340H1, the second assembly hole 340H2, and the third assembly hole 340H3 can be the same, but are not limited thereto.

Figure 44:
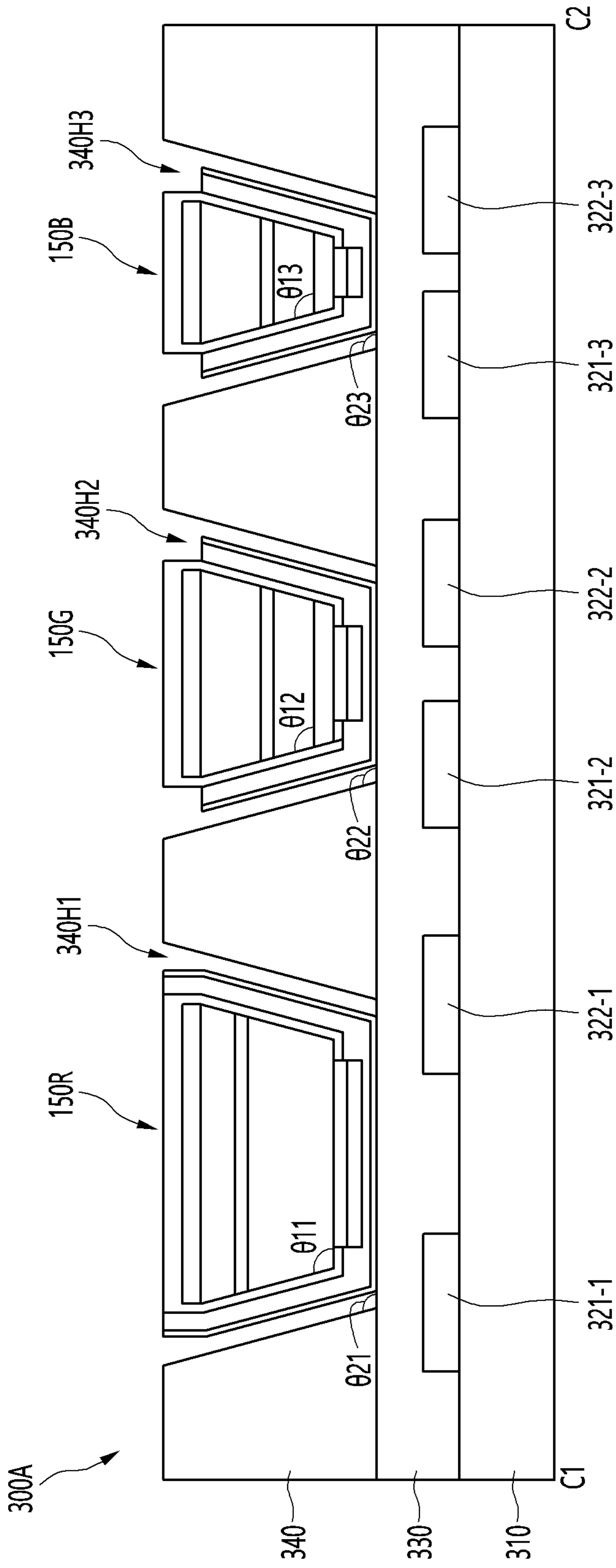
FIG. 44 is a cross-sectional view showing the assembly of the first to third semiconductor light emitting devices constituting a pixel on a backplane substrate according to the first embodiment.

FIG. 44 is a cross-sectional view showing the assembly of the first to third semiconductor light emitting devices constituting a pixel on a backplane substrate according to the first embodiment.

As shown in FIG. 44, A first semiconductor light emitting device 150R, a second semiconductor light emitting device 150G, and a third semiconductor light emitting device 150B can each be disposed in the first sub-pixel PX1, the second sub-pixel PX2, and the third sub-pixel PX3 of each of the plurality of pixels PX of the backplane substrate 300A shown in FIGS. 42 and 43.

The first semiconductor light emitting device 150R, the second semiconductor light emitting device 150G, and the third semiconductor light emitting device 150B can have different shapes, and the first assembly hole 340H1, the second assembly hole 340H2, and the third assembly hole 340H3 on the backplane substrate 300A can have shapes corresponding to the shapes of the first semiconductor light emitting device 150R, the second semiconductor light emitting device 150G, and the third semiconductor light emitting device 150B, respectively. For example, the shapes of the first assembly hole 340H1, the second assembly hole 340H2, and the third assembly hole 340H3 can be different from each other.

The first semiconductor light emitting device 150R, the second semiconductor light emitting device 150G, and the third semiconductor light emitting device 150B can be assembled on the backplane substrate 300A at the same time.

First, a plurality of first semiconductor light emitting devices 150R, a plurality of second semiconductor light emitting devices 150G, and a plurality of third semiconductor light emitting devices 150B can be dispersed in the fluid. Next, using the magnetic field formed in the magnet 500, the plurality of first semiconductor light emitting devices 150R, the plurality of second semiconductor light emitting devices 150G, and the plurality of third semiconductor light emitting devices 150B in the fluid can be moved toward the magnet 500. Accordingly, the plurality of first semiconductor light emitting devices 150R, the plurality of second semiconductor light emitting devices 150G, and the plurality of third semiconductor light emitting devices 150B can be moved onto the backplane substrate 300A.

Next, DEP force can be formed by the alternating voltage applied to the first assembly wiring 321-1 to 321-3 and the second assembly wiring 322-1 to 322-3 disposed in each of the first sub-pixel PX1, the second sub-pixel PX2, and the third sub-pixel PX3 on the backplane substrate 300A. The semiconductor light emitting devices 150R, 150G and 150B positioned on the first sub-pixel PX1, the second sub-pixel PX2, and the third sub-pixel PX3 can be assembled by the DEP force formed in each of the first sub-pixel PX1, the second sub-pixel PX2, and the third sub-pixel PX3.

The first semiconductor light emitting device 150R, the second semiconductor light emitting device 150G, and the third semiconductor light emitting device 150B have different shapes, and the second inner angles θ21, θ22 and θ23 of each of the first assembly hole 340H1, the second assembly hole 340H2, and the third assembly hole 340H3 can be the same as the first inner angles θ11, θ12 and θ13 of each of the first semiconductor light emitting device 150R, the second semiconductor light emitting device 150G and the third semiconductor light emitting device 150B or can be within a predetermined error (±10°). Thus, the first semiconductor light emitting device 150R can be assembled in the first assembly hole 340H1, and the second semiconductor light emitting device 150G can be assembled in the first assembly hole 340H2, and the third semiconductor light emitting device 150B can be assembled in the third assembly hole 340H3. Here, the first inner angles θ11, θ12 and θ13 and the second inner angles θ21, θ22 and θ23 can be obtuse angles.

For example, the second semiconductor light emitting device 150G or the third semiconductor light emitting device 150B can be improperly assembled in the first assembly hole 340H1. In this case, the shape of the first assembly hole 340H1 does not correspond to the shape of the first semiconductor light emitting device 150R or the second semiconductor light emitting device 150G, and the second inner angles θ21, θ22 and θ23 of the first assembly hole 340H1 and the first inner angles θ11, θ12, and θ13 of the first semiconductor light emitting device 150R or the second semiconductor light emitting device 150G are not the same, and can be out of a predetermined error (±10°). Thus, the first semiconductor light emitting device 150R or the second semiconductor light emitting device 150G improperly assembled in the first assembly hole 340H1 is not fixed to the first assembly hole 340H1 and can immediately fall out of the first assembly hole 340H1.

For example, since the diameter of the lower surface 150*al* of the first semiconductor light emitting device 150R is greater than the maximum diameter D22 defined on the upper side of the second assembly hole 340H2, the first semiconductor light emitting device 150R may not be assembled in the second assembly hole 340H2 or the third assembly hole 340H3. For example, since the diameter of the lower surface 150*al* of the second semiconductor light emitting device 150G is greater than the maximum diameter D32 defined on the upper side of the third assembly hole 340H3, the second semiconductor light emitting device 150G may not be assembled in the third assembly hole 340H3.

Therefore, even if the first semiconductor light emitting device 150R, the second semiconductor light emitting device 150G, and the third semiconductor light emitting device 150B are assembled on the backplane substrate 300A at the same time, the first semiconductor light emitting device 150R, the second semiconductor light emitting device 150G, and the third semiconductor light emitting device 150B can be properly assembled into the assembly holes 340H1 to 340H3 where they are to be assembled without color mixing defects. For example, the first semiconductor light emitting device 150R can be properly assembled into the first assembly hole 340H1 without being misassembled into the second assembly hole 340H2 or the third assembly hole 340H3. The second semiconductor light emitting device 150G can be properly assembled into the second assembly hole 340H2 without being misassembled into the first assembly hole 340H1 or the third assembly hole 340H3. The third semiconductor light emitting device 150B can be properly assembled in the third assembly hole 340H3 without being misassembled in the first assembly hole 340H1 or the second assembly hole 340H2.

In addition, the first semiconductor light emitting device 150R, the second semiconductor light emitting device 150G, and the third semiconductor light emitting device 150B can have different shapes, and the backplane substrate 300A is designed so that the second inner angles θ21, θ22 and θ23 of each of the first assembly hole 340H1, the second assembly hole 340H2, and the third assembly hole 340H3 can be the same as the first inner angles θ11, θ12 and θ13 of each of the first semiconductor light emitting device 150R, the second semiconductor light emitting device 150G and the third semiconductor light emitting device 150B or can be within a predetermined error (±10°). Thus, the first semiconductor light emitting device 150R, the second semiconductor light emitting device 150G, and the third semiconductor light emitting device 150B can be simultaneously assembled on the backplane substrate 300A, thereby significantly improving the assembly rate and dramatically reducing the assembly process time.

Figure 45:
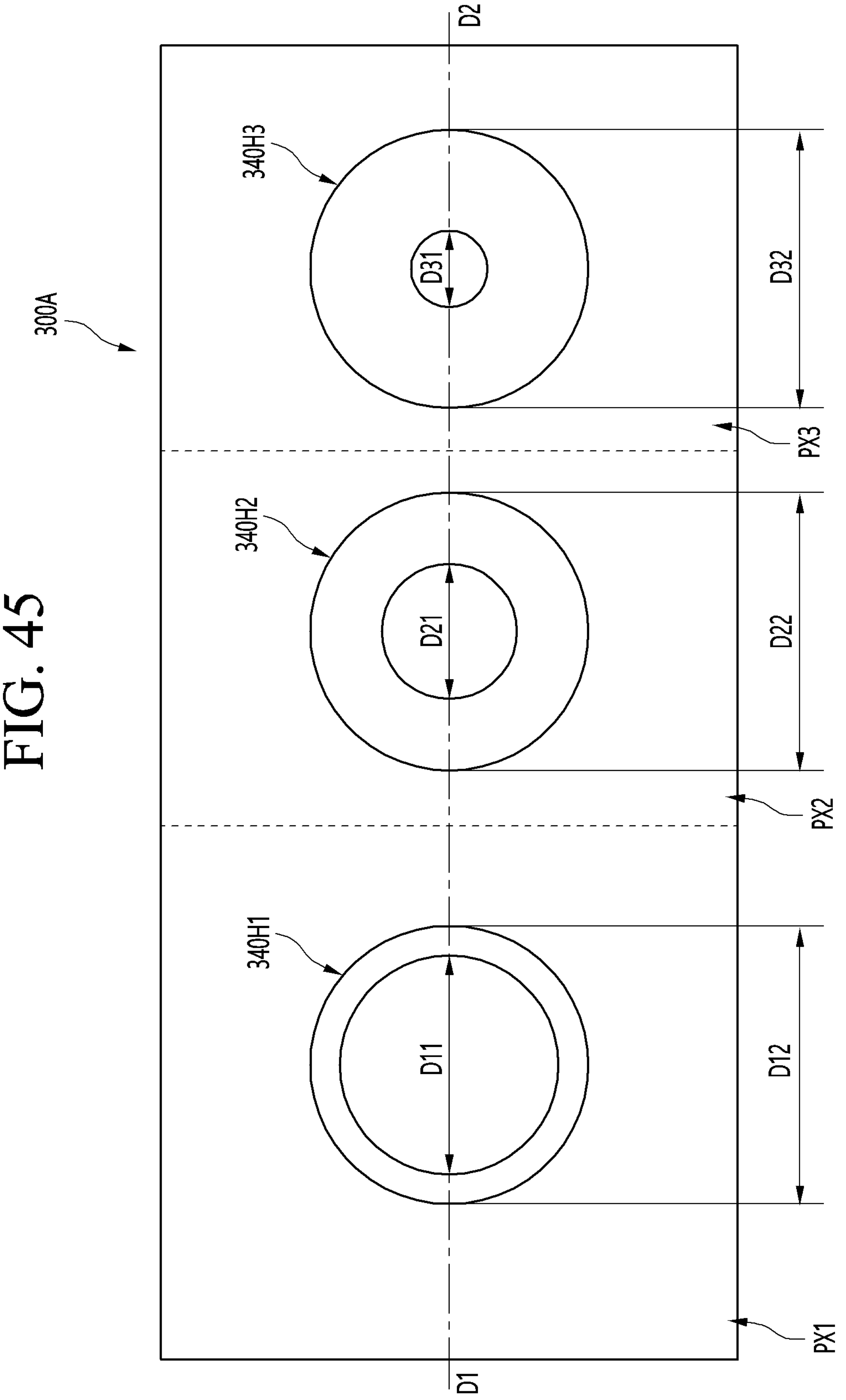
FIG. 45 is a plan view showing a backplane substrate according to a second embodiment.
Figure 46:
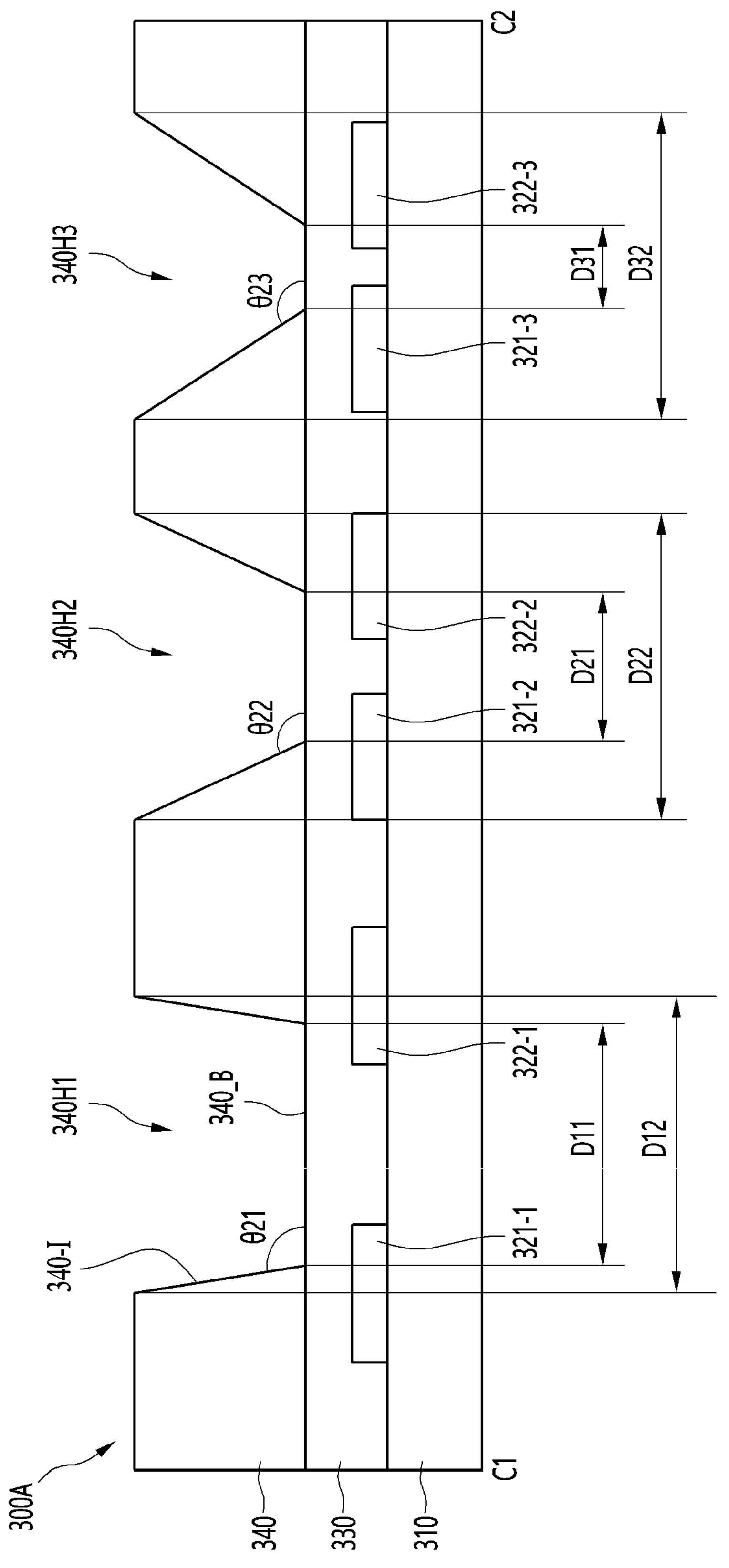
FIG. 46 is a cross-sectional view showing a backplane substrate according to the second embodiment.

FIG. 45 is a plan view showing a backplane substrate according to a second embodiment. FIG. 46 is a cross-sectional view showing a backplane substrate according to the second embodiment.

The second embodiment is the same as the first embodiment except that the second inner angles θ21, θ22 and θ23 of the first assembly hole 340H1, the second assembly hole 340H2, and the third assembly hole 340H3 are different. In the second embodiment, the same components as those in the first embodiment (FIGS. 42 and 43) are given the same reference numerals and detailed descriptions are omitted.

Referring to FIGS. 45 and 46, the backplane substrate 300B according to the second embodiment can comprise a substrate 310, a plurality of first assembly wirings 321-1 to 321-3, a plurality of second assembly wirings 322-1 to 322-3, an insulating layer 330, and a barrier rib 340.

A plurality of pixels PX can be defined on the substrate 310, and each of the plurality of pixels PX can comprise a plurality of sub-pixels PX. A pixel PX can be the minimum unit for displaying an image by implementing full color.

The pixel PX can comprise the first sub-pixel PX1, the second sub-pixel PX2, and the third sub-pixel PX3, but can comprise more sub-pixels PX. A first semiconductor light emitting device 150R that emits a first color light can be disposed on the first sub-pixel PX1, and a second semiconductor light emitting device 150G that emits a second color light can be disposed on the second sub-pixel PX2, and a third semiconductor light emitting device 150B that emits a third color light can be disposed on the third sub-pixel PX3. For example, the first semiconductor light emitting device 150R can be a red semiconductor light emitting device that emits red light, the second semiconductor light emitting device 150G can be a green semiconductor light emitting device that emits green light, and the third semiconductor light emitting device 150B can be a blue semiconductor light emitting device that emits blue light, but is not limited thereto.

In the drawing, the areas of the first sub-pixel PX1, the second sub-pixel PX2, and the third sub-pixel PX3 can be different, but can be the same.

The first assembly hole 340H1, the second assembly hole 340H2, and the third assembly hole 340H3 can be formed in the first sub-pixel PX1, the second sub-pixel PX2, and the third sub-pixel PX3, respectively.

The second inner angles θ21, θ22 and θ23 of each of the first assembly hole 340H1, the second assembly hole 340H2, and the third assembly hole 340H3 can be different. The second inner angle θ21 of the first assembly hole 340H1 can be the smallest, the second inner angle θ22 of the second assembly hole 340H2 can be small to next, and the second inner angle θ23 of the third assembly hole 340H3 can be the largest.

Meanwhile, the minimum diameters D11, D21 and D31 and/or maximum diameters D12, D22 and D32 of the first assembly hole 340H1, the second assembly hole 340H2, and the third assembly hole 340H3 can be different. The minimum diameter D11 of the first assembly hole 340H1 can be the largest, the minimum diameter D21 of the second assembly hole 340H2 can be small to next, and the minimum diameter D31 of the third assembly hole 340H3 can be the smallest. The maximum diameter D12 of the first assembly hole 340H1 can be the smallest, the maximum diameter D22 of the second assembly hole 340H2 can be large to next, and the maximum diameter D32 of the third assembly hole 340H3 can be the largest. Accordingly, the second inner angles θ21, θ22 and θ23 of the first assembly hole 340H1, the second assembly hole 340H2, and the third assembly hole 340H3 can be increased in the order of the first assembly hole 340H1, the second assembly hole 340H2, and the third assembly 340H3.

Figure 47:
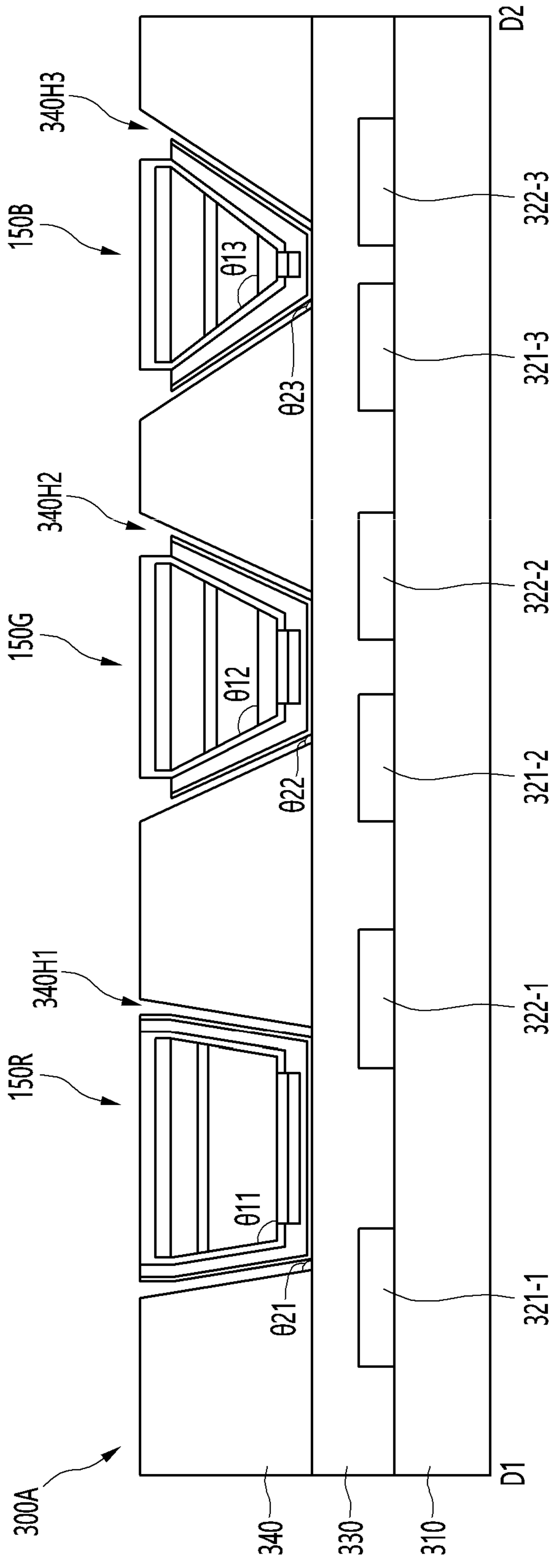
FIG. 47 is a cross-sectional view showing the assembly of the first to third semiconductor light emitting devices constituting a pixel on a backplane substrate according to the second embodiment.

In this way, the first semiconductor light emitting device 150R, the second semiconductor light emitting device 150G, and the third semiconductor light emitting device 150B can have shapes corresponding to the shapes of the first assembly hole 340H1, the second assembly hole 340H2 and the third assembly hole 340H3 having different second inner angles θ21, θ22 and θ23, respectively. In this case, as shown in FIG. 47, during self-assembly, the first semiconductor light emitting device 150R, the second semiconductor light emitting device 150G, and the third semiconductor light emitting device 150B can simultaneously be assembled to the first assembly hole 340H1, the second assembly hole 340H2 and the third assembly hole 340H3.

For example, since the diameter of the lower surface 150*al* of the first semiconductor light emitting device 150R is greater than the minimum diameter D21 of the second assembly hole 340H2, the first semiconductor light emitting device 150R may not be assembled in the second assembly hole 340H2 or the third assembly hole 340H3.

Since the diameter of the upper surface 150*a*2 of the third semiconductor light emitting device 150B is greater than the maximum diameter D22 of the second assembly hole 340H2, the third semiconductor light emitting device 150B may not be assembled in the first assembly hole 340H1 or in the second assembly hole 340H2. For example, while the third semiconductor light emitting device 150B is inserted into the first assembly hole 340H1, a certain point between the lower and upper sides of the third semiconductor light emitting device 150B, which is equal to the maximum diameter D12 of the first assembly hole 340H1, can be caught on the upper side of the first assembly hole 340H1. Accordingly, the third semiconductor light emitting device 150B can no longer be inserted toward the bottom surface 340_B of the first assembly hole 340H1. In this case, since the lower side of the third semiconductor light emitting device 150B is spaced far away from the bottom surface 340_B of the first assembly hole 340H1, the DEP force may not significantly affect the third semiconductor light emitting device 150B. Accordingly, the third semiconductor light emitting device 150B may not be fixed and can immediately fall out of the first assembly hole 340H1.

Therefore, even if the first semiconductor light emitting device 150R, the second semiconductor light emitting device 150G, and the third semiconductor light emitting device 150B are assembled on the backplane substrate 300B at the same time, the first semiconductor light emitting device 150R, the second semiconductor light emitting device 150G, and the third semiconductor light emitting device 150B can be properly assembled into the assembly holes 340H1 to 340H3 where they are to be assembled without color mixing defects. For example, the first semiconductor light emitting device 150R can be properly assembled into the first assembly hole 340H1 without being misassembled into the second assembly hole 340H2 or the third assembly hole 340H3. The second semiconductor light emitting device 150G can be properly assembled into the second assembly hole 340H2 without being misassembled into the first assembly hole 340H1 or the third assembly hole 340H3. The third semiconductor light emitting device 150B can be properly assembled in the third assembly hole 340H3 without being misassembled in the first assembly hole 340H1 or the second assembly hole 340H2.

Meanwhile, the minimum diameters D11, D21 and D31 and/or maximum diameters D12, D22 and D32 of the first assembly hole 340H1, the second assembly hole 340H2, and the third assembly hole 340H3 can be different. The minimum diameter D11 of the first assembly hole 340H1 can be the smallest, the minimum diameter D21 of the second assembly hole 340H2 can be large to next, and the minimum diameter D31 of the third assembly hole 340H3 can be the largest. The maximum diameter D12 of the first assembly hole 340H1 can be the largest, the maximum diameter D22 of the second assembly hole 340H2 can be small to next, and the maximum diameter D32 of the third assembly hole 340H3 can be the smallest. Accordingly, the second inner angles θ21, θ22 and θ23 of the first assembly hole 340H1, the second assembly hole 340H2, and the third assembly hole 340H3 can be decreased in that order of the first assembly hole 340H1, the second assembly hole 3340H2, and the third assembly hole 340H3.

Figure 48:
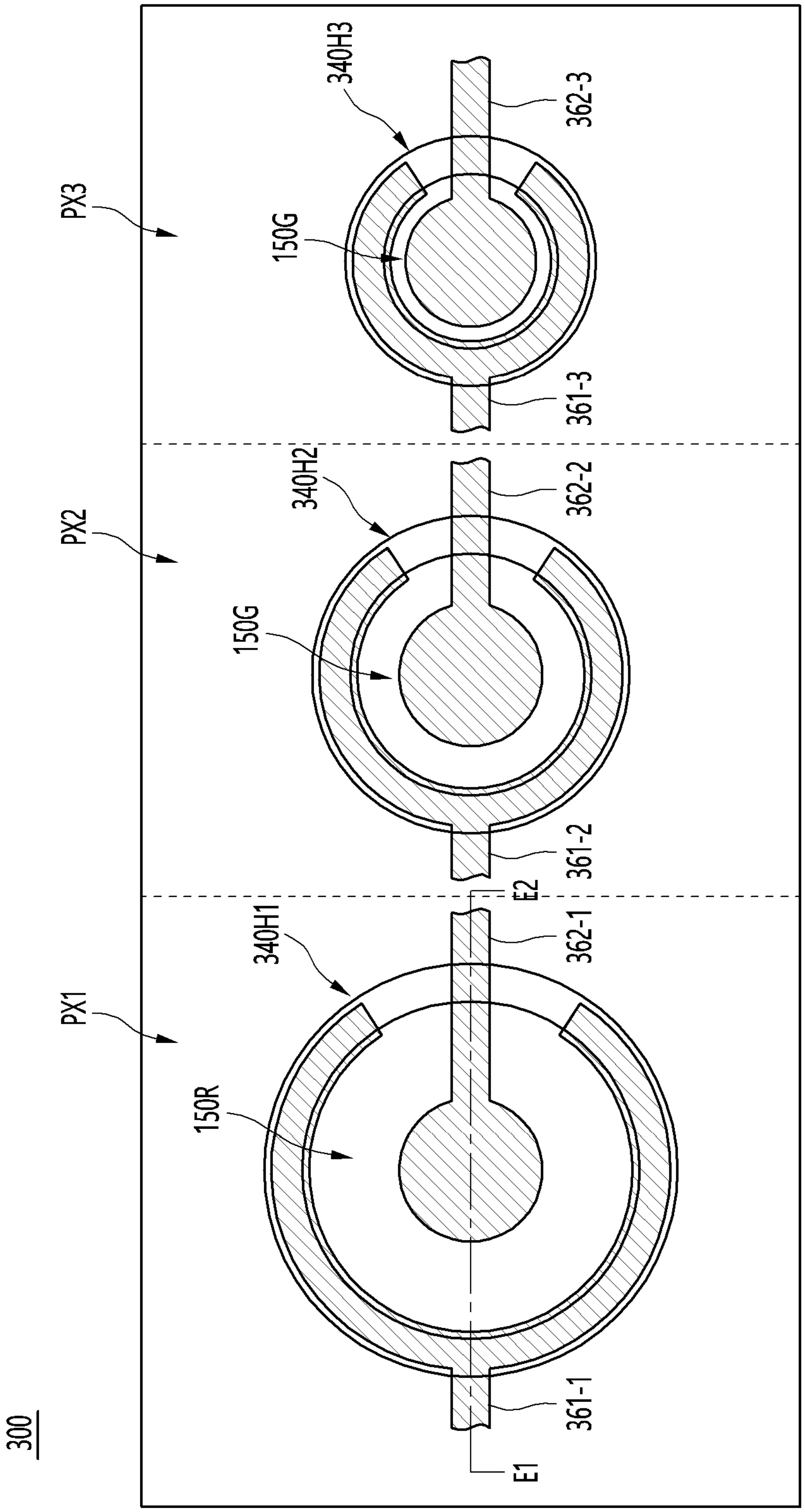
FIG. 48 is a plan view showing a display device according to a first embodiment.
Figure 49:
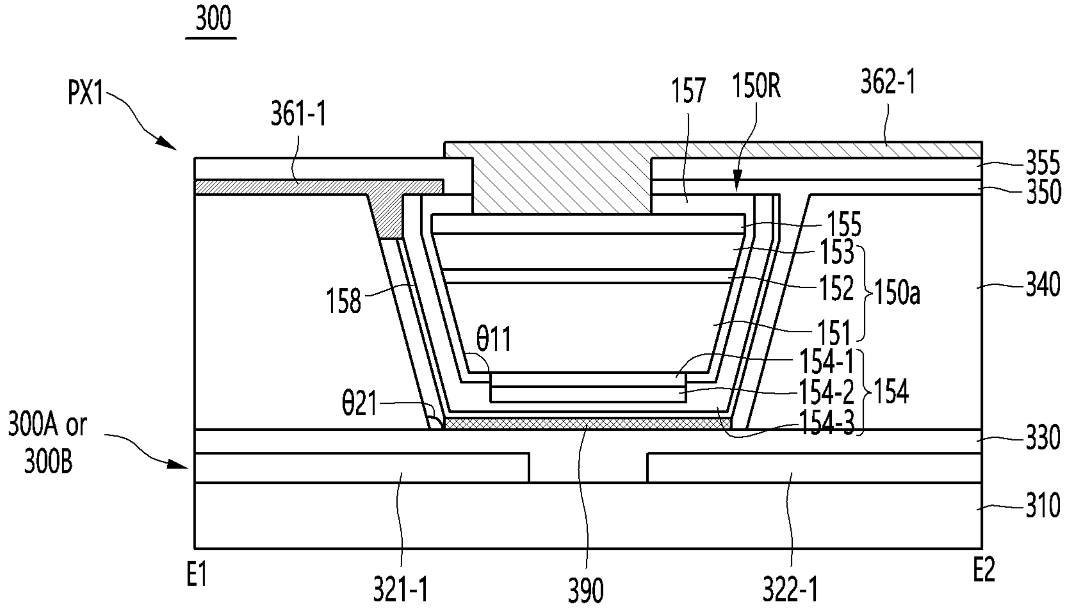
FIG. 49 is a cross-sectional view showing the first sub-pixel of the display device according to the first embodiment.

FIG. 48 is a plan view showing a display device according to a first embodiment. FIG. 49 is a cross-sectional view showing the first sub-pixel of the display device according to the first embodiment. Since the second sub-pixel PX2 and the third sub-pixel PX3 can have the same or similar cross-sectional view as the cross-sectional view of the first sub-pixel PX1 shown in FIG. 49, it can be easily understood from the cross-sectional view of the first sub-pixel PX1 shown in FIG. 49. Accordingly, the cross-sectional views of the second sub-pixel PX2 and the third sub-pixel PX3 can be applied equally to the cross-sectional view of the first sub-pixel PX1 shown in FIG. 49.

Referring to FIGS. 48 and 49, the display device 300 according to the first embodiment can comprise a backplane substrate 300A or 300B, first to third semiconductor light emitting devices 150R to 150B, a first electrode wiring 361-1 to a third electrode wiring 361-3 and a first electrode wiring 362-1 to a third electrode wiring 362-3.

Since the backplane substrate 300A or 300B and the first semiconductor light emitting device 150R to the third semiconductor light emitting device 150B have been previously described, detailed descriptions are omitted.

As described above, a plurality of pixels PX can be defined on the backplane substrate 300A or 300B, and the plurality of pixels PX can each comprise a first sub-pixel PX1, a second sub-pixel PX2, and a second sub-pixel PX3.

In the drawing, the areas of the first sub-pixel PX1, the second sub-pixel PX2, and the third sub-pixel PX3 can be different, but can be the same.

A self-assembly process can be performed to assemble the first to third semiconductor light emitting devices 150R to 150B on the backplane substrate 300A or 300B. The backplane substrate 300A or 300B can have a first assembly hole 340H1 in the first sub-pixel PX1, a second assembly hole 340H2 in the second sub-pixel PX2, and a third assembly hole 340H3 in the third sub-pixel PX3. In this case, the first semiconductor light emitting device 150R can be assembled in the first assembly hole 340H1, the second semiconductor light emitting device 150G can be assembled in the second assembly hole 340H2, and the third semiconductor light emitting device 150B can be assembled in the third assembly hole 340H3.

The first semiconductor light emitting device 150R can be a semiconductor light emitting device according to the first embodiment shown in FIG. 13, and the second semiconductor light emitting device 150G and the third semiconductor light emitting device 150B can each be a semiconductor light emitting device according to the embodiment shown in FIG. 28, but is not limited thereto.

After the self-assembly process is completed, a post-process can be performed to form the first electrode wiring 361-1 to third electrode wiring 361-3.

Specifically, a fixing member 390 can be formed in each of a first assembly hole 340H1, a second assembly hole 340H2, and a third assembly holes 340H3 to individually fix the first semiconductor light emitting device 150R, the second semiconductor light emitting device 150G, and the third semiconductor light emitting device 150B. For example, the fixing member 390 can be formed between the bottom surface 340_B of each of the first assembly hole 340H1, the second assembly hole 340H2, and the third assembly hole 340H3 and each of the first semiconductor light emitting device 150R, the second semiconductor light emitting device 150G, and the third semiconductor light emitting device 150B. Accordingly, since the first semiconductor light emitting device 150R to the third semiconductor light emitting device 150B can each be fixed to the first assembly hole 340H1 to the third assembly hole 340H3, the first semiconductor light emitting device 150R to the third semiconductor light emitting device 150B may not be separated from the first assembly hole 340H1 to the third assembly hole 340H3, respectively while the post-process is in progress.

For example, after the photoresist film is coated on the barrier rib 340, exposure and development processes can be performed. Thus, the fixing member 390 can be formed only under each of the first to third semiconductor light emitting devices 150R to 150B.

After the second insulating layer 350 is formed, the first electrode wiring 361-1 can be formed on the second insulating layer 350. The first electrode wiring 361-1 can be electrically connected to the first electrode 154 of the first semiconductor light emitting device 150R through the second insulating layer 350. The first electrode wiring 361-1 can be connected not only to the upper surface 150*a*2 of the third conductive layer 154-3 of the first electrode 154 but also to a part of the outer side surface 150*a*3. To this end, before the second insulating layer 350 is formed, an etching process can be performed to remove a part of the end of the protective layer 158 such that a part of the outer side surface 150*a*3 of the third conductive layer 154-3 of the first electrode 154 can be exposed to the outside. Thereafter, the first electrode wiring 361-1 can be connected to the upper surface 150*a*2 and the outer side surface 150*a*3 of the third conductive layer 154-3 of the first electrode 154 through the second insulating layer 350.

Meanwhile, the protective layer 158 provided to cover the third conductive layer 154-3 of the first electrode 154 in the first semiconductor light emitting device 150R can be made of an inorganic material and can be easily removed by using dry etching or wet etching. Accordingly, since the protective layer 158 is easy to remove, the connection process of the first electrode wiring 361-1 can be easily performed. In addition, through removal of the protective layer 158, the first electrode wiring 361-1 can be connected to the upper surface 150*a*2 of the end of the third conductive layer 154-3 of the first electrode 154 of the first semiconductor light emitting device 150R and the outer side surface 150*a*3. Thus, the contact area can be expanded and the electrical/optical characteristics can be improved.

Meanwhile, as shown in FIG. 49, since the first electrode wiring 361-1 can be disposed along the circumference of the first semiconductor light emitting device 150R, and can be connected to the upper surface 150*a*2 of the end of the third conductive layer 154-3 of the first electrode 154 of the first semiconductor light emitting device 150R and the outer side surface 150*a*3, the contact area can be dramatically expanded and the electrical/optical characteristics can be further improved.

The second insulating layer 350 can comprise an organic material, but is not limited thereto. The second insulating layer 350 can serve as a planarization layer, and its upper surface 150*a*2 can have a straight plane. Therefore, when the first electrode wiring 361-1 is formed on the second insulating layer 350, no curve or bending occurs in the first electrode wiring 361-1, so that the first electrode wiring 361-1 can be prevented from disconnection or short circuit.

Although the second insulating layer 350 is shown in FIG. 49 as being formed on the first semiconductor light emitting device 150R, the second insulating layer 350 may not be formed on the first semiconductor light emitting device 150R. For example, the upper surface 150*a*2 of the second insulating layer 350 and the upper surface 150*a*2 of the first semiconductor light emitting device 150R can be positioned on the same horizontal line.

A third insulating layer 355 can be formed on the second insulating layer 350. In this case, the second insulating layer 350 can cover the first electrode wiring 361-1. Thereafter, another first electrode wiring 362-1 can be formed on the third insulating layer 355, and can be connected to the upper surface 150*a*2 of the second electrode 155 of the semiconductor light emitting device through the third insulating layer 355. When a contact hole is formed by removing the third insulating layer 355, the passivation layer of the first semiconductor light emitting device 150R exposed by the contact hole, for example, the first passivation layer 157, can be removed such that the upper surface 150*a*2 of the second electrode 155 can be exposed. Thereafter, another first electrode wiring 362-1 can be formed in the corresponding contact hole, so that it can be connected to the upper surface 150*a*2 of the second electrode 155 through the first passivation layer 157. Likewise, the second electrode wiring 361-2 can be connected to the first electrode 154 of the second semiconductor light emitting device 150G, and another second electrode wiring 362-2 can be connected to the second semiconductor light emitting device 150G. Likewise, the third electrode wiring 361-3 can be connected to the first electrode 154 of the third semiconductor light emitting device 150B, and another third electrode wiring 362-3 can be connected to the third semiconductor light emitting device 150B.

The first electrode wiring 361-1, the second electrode wiring 361-2, and the third electrode wiring 361-3 can be called the first-first electrode wiring, the first-second electrode wiring, and the first-third electrode wiring, respectively. The first electrode wiring 362-1, the second electrode wiring 362-2, and the third electrode wiring 362-3 can be called the second-first electrode wiring, the second-second electrode wiring, and the second-third electrode wiring.

The first to third electrode wirings 361-1 to 361-3 and the first to third electrode wirings 362-1 to 361-3 can be disposed on the first semiconductor light emitting device 150R. The first to third electrode wirings 361-1 to 361-3 and the first to third electrode wirings 362-1 to 361-3 can comprise a transparent conductive layer such as ITO, IZO, etc., but is not limited thereto.

Meanwhile, in the drawing, the first to third electrode wirings 361-1 to 361-3 and the first to third electrode wirings 362-1 to 361-3 can disposed on different layers, but it can also be disposed on the same layer. For example, the first electrode wiring 362-1 to a third electrode wiring 361-3 can be disposed on the second insulating layer 350 instead of on the third insulating layer 355. In this case, the third insulating layer 355 can be omitted. The first electrode wiring 361-1 to third electrode wiring 361-3 and the first electrode wiring 362-1 to third electrode wiring 361-3 can be disposed to be spaced apart from each other on the second insulating layer 350.

Figure 50:
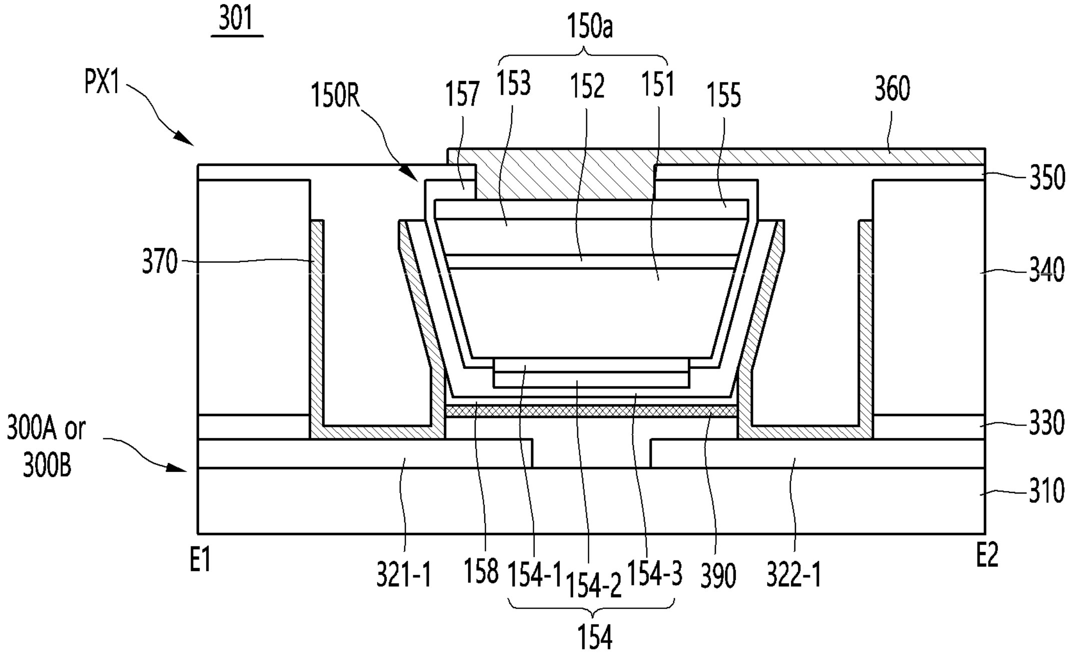
FIG. 50 is a cross-sectional view showing a first sub-pixel of a display device according to a second embodiment.

FIG. 50 is a cross-sectional view showing a first sub-pixel of a display device according to a second embodiment. Since the second sub-pixel PX2 and the third sub-pixel PX3 can have the same or similar cross-sectional view as the cross-sectional view of the first sub-pixel PX1 shown in FIG. 49, it can be easily understood from the cross-sectional view of the first sub-pixel PX1 shown in FIG. 49. Accordingly, the cross-sectional views of the second sub-pixel PX2 and the third sub-pixel PX3 can be applied equally to the cross-sectional view of the first sub-pixel PX1 shown in FIG. 49.

The second embodiment is the same as the first embodiment (FIGS. 48 and 49) except that the first electrode wiring 361-1 is omitted. In the second embodiment, the same components as those in the first embodiment are given the same reference numerals and detailed descriptions are omitted.

Referring to FIG. 50, the display device 301 according to the second embodiment can comprise a backplane substrate 300A or 300B, first to third semiconductor light emitting devices 150R to 150B, a connection electrode 370, and first electrode wiring 362-1 to third electrode wiring 362-3.

The first semiconductor light emitting device 150R can be a semiconductor light emitting device according to the first embodiment shown in FIG. 13, and the second semiconductor light emitting device 150G and the third semiconductor light emitting device 150B can each be a semiconductor light emitting device according to the embodiment shown in FIG. 28, but is not limited thereto.

Unlike the first embodiment (FIGS. 48 and 49), in the second embodiment, only one electrode wiring 360 can be disposed on the first semiconductor light emitting device 150R. For example, one electrode wiring 360 can be disposed on the first semiconductor light emitting device 150R. The electrode wiring 360 can be electrically connected to the second electrode 155 of the first semiconductor light emitting device 150R through the second insulating layer 350.

Meanwhile, as described above, in the first semiconductor light emitting device 150R, the first electrode 154 can comprise a third conductive layer 154-3 disposed on the side surface 150*a*3 of the light emitting layer 150*a*.

The connection electrode 370 can be connected to the side surface 150*a*3 of the third conductive layer 154-3 of the first electrode 154.

As shown in FIG. 13, since the protective layer 158 is disposed on the side surface 150*a*3 of the third conductive layer 154-3 of the first electrode 154, the side surface 150*a*3 may not be exposed to the outside. Accordingly, after the first semiconductor light emitting device 150R is assembled in the first assembly hole 340H1 through a self-assembly process, a fixing member 390 can be formed to fix the first semiconductor light emitting device 150R to the first assembly holes 340H1.

Thereafter, before the connection electrode 370 is formed, an etching process can be performed to remove the protective layer 158 on the side surface 150*a*3 of the third conductive layer 154-3 of the first electrode 154. When the protective layer 158 is removed by the etchant, the fixing member 390 can act as a stopper such that the protective layer 158 disposed between the third conductive layer 154-3 on the lower surface 150*al* of the light emitting layer 150*a* and the fixing member 390 may not be removed.

In other words, except for the protective layer 158 positioned between the third conductive layer 154-3 on the lower surface 150*al* of the light emitting layer 150*a* and the fixing member 390, the protective layer 158 in the remaining area will be removed. For example, the protective layer 158 positioned on the lower surface 150*al* of the light emitting layer 150*a* may not be removed, but the protective layer 158 positioned on the side surface 150*a*3 of the light emitting layer 150*a* can be removed. Thereafter, the connection electrode 370 can be formed in the assembly holes 340H1 to 340H3, so that the connection electrode 370 can be connected to the exposed side surface 150*a*3 of the third conductive layer 154-3 of the first electrode 154.

Meanwhile, the protective layer 158 provided to cover the third conductive layer 154-3 of the first electrode 154 in the first semiconductor light emitting device 150R can be made of an inorganic material and can be easily removed by using dry etching or wet etching. Therefore, since the protective layer 158 is easy to remove, the connection process of the connection electrode 370 can be easily performed.

Meanwhile, the connection electrode 370 can be made of metal and have weak adhesion to heterogeneous media, so it can peel off. In the embodiment, the fixing member 390 and the protective layer 158 can be disposed between the third conductive layer 154-3 and the first insulating layer 330 of the first electrode 154, so that when the connection electrode 370 is deposited, the connection electrode 370 can be deposited on the fixing member 390 and the protective layer 158 disposed between the third conductive layer 154-3 and the first insulating layer 330 as well as the third conductive layer 154-3 on the side 150*a*3 of the light emitting layer 150*a*. In this case, the fixing member 390 and the protective layer 158 can strengthen the adhesive force of the connection electrode 370, so that peeling of the connection electrode 370 can be prevented.

The connection electrode 370 can be connected to the upper surfaces 150*a*2 of the first assembly wiring 321-1 to 321-3 and/or the second assembly wiring 322-1 to 322-3 through the first insulating layer 330 of the backplane substrate 300A or 300B.

Meanwhile, the connection electrode 370 formed in each of the second assembly hole 340H2 on the second sub-pixel PX2 and the third assembly hole 340H3 on the third sub-pixel PX3 can also be formed as described above such that the connection electrode 370 can be electrically connected to the side surface 150*a*3 of the third conductive layer 154-3 of the first electrode 154 of the second semiconductor light emitting device 150G disposed in the second assembly hole 340H2 and the side surface 150*a*3 of the third conductive layer 154-3 of the first electrode 154 of the third semiconductor light emitting device 150B disposed in the third assembly hole 340H3. The connection electrode 370 formed in the second sub-pixel PX2 can be electrically connected to the upper surface 150*a*2 of the first assembly wiring 321-1 to 321 and/or the second assembly wirings 322-1, 322-2, and 322-3 of the second assembly hole 340H2 through the first insulating layer 330 of the backplane substrate 300A or 300B. In addition, the connection electrode 370 formed in the third sub-pixel PX3 can be electrically connected to the upper surface 150*a*2 of the first assembly wiring 321-1 to 321 and/or the second assembly wirings 322-1, 322-2, and 322-3 of the third assembly hole 340H3 through the first insulating layer 330 of the backplane substrates 300A or 300B.

Meanwhile, the display device described above can be a display panel. For example, in the embodiment, the display device and the display panel can be understood to have the same meaning. In an embodiment, the display device in a practical sense can comprise a display panel and a controller (or processor) capable of controlling the display panel to display an image.

The embodiment can be adopted in the display field for displaying images or information. The embodiment can be adopted in the display field for displaying images or information using a semiconductor light emitting device. The semiconductor light emitting device can be a micro-level semiconductor light emitting device or a nano-level semiconductor light emitting device.

For example, the embodiment can be adopted for TV, the signage, a mobile terminal such as a handheld phone, a smart phone, etc., a display for computer such as a laptop, a desktop, etc., a head-up display (HUD) for automobile, a backlight unit for display, a display for XR (Extend Reality) such as AR, VR, and MR (mixed reality), a light source, etc.

The above detailed description should not be construed as limiting in all respects and should be considered illustrative. The scope of the embodiment should be determined by reasonable interpretation of the appended claims, and all changes within the equivalent range of the embodiment are included in the scope of the embodiment.

What is claimed is:

1. A semiconductor light emitting device, comprising:
a light emitting layer;
a passivation layer on an upper surface and a side surface of the light emitting layer;
a protective layer on a lower surface and the side surface of the light emitting layer;
a first electrode between the light emitting layer and the protective layer; and
a second electrode between the light emitting layer and the passivation layer,
wherein an inner angle between the side surface and the lower surface of the light emitting layer has an obtuse angle, and
wherein an end of the first electrode disposed on the side surface of the light emitting layer is coplanar with an upper surface of the passivation layer.

2. The semiconductor light emitting device of claim 1, wherein an inner angle between the side surface and the upper surface of the light emitting layer has an acute angle.

3. The semiconductor light emitting device of claim 1, wherein the first electrode comprises a plurality of conductive layers on the lower surface of the light emitting layer, and
wherein at least one or more conductive layer among the plurality of conductive layers is disposed on the side surface of the light emitting layer.

4. The semiconductor light emitting device of claim 1, wherein the first electrode is further disposed on the passivation layer disposed on the side surface of the light emitting layer.

5. The semiconductor light emitting device of claim 1, wherein the protective layer has a shape corresponding to a shape of the first electrode in a sectional view of the semiconductor light emitting device.

6. The semiconductor light emitting device of claim 1, wherein the protective layer is disposed on the passivation layer disposed on the side surface of the light emitting layer.

7. The semiconductor light emitting device of claim 1, wherein the protective layer is disposed on the first electrode disposed on the side surface of the light emitting layer.

8. The semiconductor light emitting device of claim 1, wherein an end of the protective layer disposed on the side surface of the light emitting layer is coplanar with the upper surface of the passivation layer.

9. The semiconductor light emitting device of claim 1, wherein the protective layer comprises an insulator.

10. The semiconductor light emitting device of claim 1, wherein the protective layer has a thickness of 1/10 or less of a thickness of the passivation layer.

11. A display device, comprising:
a backplane substrate having a plurality of assembly holes corresponding to a plurality of sub-pixels constituting a pixel;
a plurality of semiconductor light emitting devices in the plurality of assembly holes, respectively; and
a plurality of first electrode wirings on upper sides of the plurality of semiconductor light emitting devices, respectively,
wherein a second inner angle between an inner side surface and a bottom surface of each of the plurality of assembly holes has an obtuse angle,
wherein the plurality of semiconductor light emitting devices have shapes corresponding to shapes of the plurality of assembly holes, respectively,
wherein each of the plurality of semiconductor light emitting devices comprises:
a light emitting layer;
a passivation layer on an upper surface and a side surface of the light emitting layer;
a protective layer on a lower surface and the side surface of the light emitting layer;
a first electrode between the light emitting layer and the protective layer; and
a second electrode between the light emitting layer and the passivation layer,
wherein the plurality of semiconductor light emitting devices emit different color lights, and
wherein an end of the first electrode disposed on the side surface of the light emitting layer is coplanar with an upper surface of the passivation layer.

12. The display device of claim 11, wherein a first inner angle between the side surface and the lower surface of the light emitting layer of each of the plurality of semiconductor light emitting devices has an obtuse angle, and
wherein the second inner angle is within ±10° with respect to the first inner angle.

13. The display device of claim 11, wherein each of the plurality of assembly holes has a minimum diameter at a lower side thereof and a maximum diameter at an upper side thereof, and
wherein at least one of the minimum diameter or the maximum diameter is different in the plurality of assembly holes.

14. The display device of claim 11, wherein the second inner angle of the plurality of assembly holes is the same or different.

15. The display device of claim 11, further comprising:
a plurality of second electrode wiring on the upper sides of the plurality of semiconductor light emitting devices.

16. The display device of claim 11, further comprising:
a plurality of connection electrodes on side portions of the plurality of semiconductor light emitting devices.

17. A semiconductor light emitting device, comprising:
a light emitting layer having a first surface, a second surface opposite the first surface, and a lateral surface connecting the first surface and the second surface;
a passivation layer on the first surface and the lateral surface of the light emitting layer;

a first electrode extending from the second surface to the lateral surface of the light emitting layer, and without extending to the first surface of the light emitting layer; and a protective layer on the first electrode and at the second surface of the light emitting layer, wherein an end of the first electrode disposed on the lateral surface of the light emitting layer is coplanar with an upper surface of the passivation layer.

18. The semiconductor light emitting device of claim 17, wherein the protective layer exposes the first electrode at the lateral surface of the light emitting layer.

* * * * *